(12) United States Patent
Li et al.

(10) Patent No.: US 12,009,836 B2
(45) Date of Patent: Jun. 11, 2024

(54) DATA PROCESSING METHOD, COMMUNICATIONS APPARATUS, AND COMMUNICATIONS DEVICE

(71) Applicant: Huawei Technologies Co., Ltd., Shenzhen (CN)

(72) Inventors: Bin Li, Shenzhen (CN); Jiaqi Gu, Shenzhen (CN); Huazi Zhang, Hangzhou (CN)

(73) Assignee: HUAWEI TECHNOLOGIES CO., LTD., Shenzhen (CN)

(\*) Notice: Subject to any disclaimer, the term of this patent is extended or adjusted under 35 U.S.C. 154(b) by 0 days.

(21) Appl. No.: 18/188,033

(22) Filed: Mar. 22, 2023

(65) Prior Publication Data

US 2023/0223957 A1    Jul. 13, 2023

Related U.S. Application Data

(63) Continuation of application No. PCT/CN2021/116454, filed on Sep. 3, 2021.

(30) Foreign Application Priority Data

Sep. 23, 2020   (CN) .................... 202011012995.5

(51) Int. Cl.
*H03M 13/00*   (2006.01)
*H03M 13/09*   (2006.01)
*H03M 13/13*   (2006.01)

(52) U.S. Cl.
CPC ......... *H03M 13/13* (2013.01); *H03M 13/091* (2013.01)

(58) Field of Classification Search
CPC ........................... H03M 13/13; H03M 13/091
See application file for complete search history.

(56) References Cited

U.S. PATENT DOCUMENTS

2019/0363823 A1\*  11/2019  Zhang .................. H04L 1/0061
2021/0135689 A1\*  5/2021   Hui .................... H03M 13/6577
2021/0159916 A1\*  5/2021   Maunder ........... H03M 13/6505

\* cited by examiner

*Primary Examiner* — Christine T. Tu
(74) *Attorney, Agent, or Firm* — SLATER MATSIL, LLP

(57) ABSTRACT

A data processing method, an apparatus, and a device are disclosed. The data processing method may be performed by a first communications device, and the first communications device is a transmit end of encoded data. The first communications device may send a high-order signal to a second communications device by using a plurality of parallel channels, and information bits in the parallel channels are arranged in a specified order. The method helps improve a transmission rate in a parallel channel transmission scenario, and helps the second communications device perform correct decoding.

20 Claims, 20 Drawing Sheets

One information bit block     One information bit sub-block

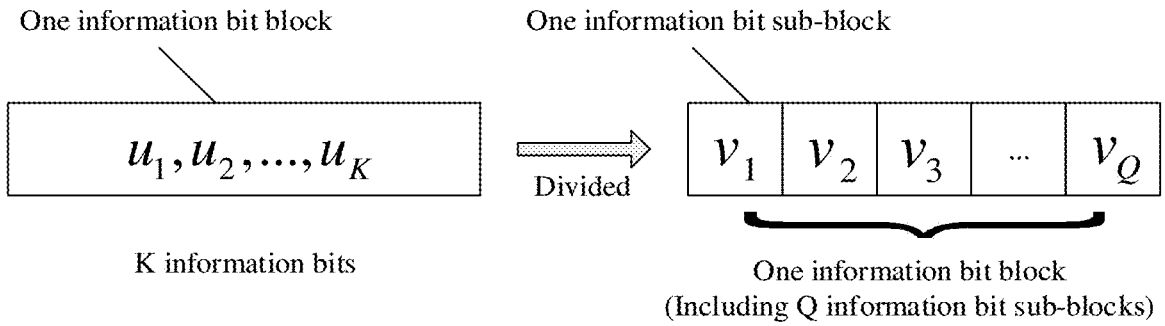

K information bits        One information bit block
(Including Q information bit sub-blocks)

FIG. 7

Using an information bit block as an example, assume that an information bit block is divided into three information bit sub-blocks v1, v2, and v3, and each information bit sub-block is divided into two groups $$v_1 = [u_1, u_2, u_3], v_2 = [u_4, u_5, u_6], v_3 = [u_7, u_8, u_9]$$
$$v_1 = a_1 + e_1, v_2 = a_2 + e_2, v_3 = a_3 + e_3$$

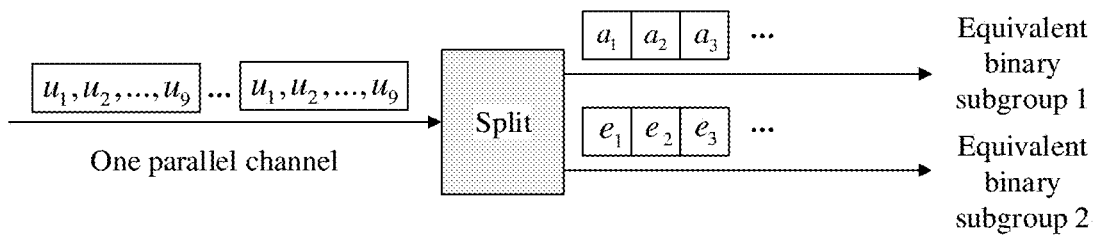

FIG. 8A

DATA PROCESSING METHOD, COMMUNICATIONS APPARATUS, AND COMMUNICATIONS DEVICE

CROSS-REFERENCE TO RELATED APPLICATIONS

This application is a continuation of International Application No. PCT/CN2021/116454, filed on Sep. 3, 2021, which claims priority to Chinese Patent Application No. 202011012995.5, filed on Sep. 23, 2020. The disclosures of the aforementioned applications are hereby incorporated by reference in their entireties.

TECHNICAL FIELD

This application relates to the field of communications technologies, and in particular, to a data processing method, a communications apparatus, and a communications device.

BACKGROUND

In a communications system, a multi-level coding (MLC) technology combines coding and modulation, to effectively improve data transmission reliability without occupying extra bandwidth and reducing an actual data transmission rate. For example, in a parallel transmission scenario of a plurality of parallel channels, by using the MLC technology, different information bits may be protected on different parallel channels by using different codes, so that a good bit error rate can be ensured, and data transmission reliability can be improved.

In a parallel channel transmission scenario, if a binary signal is transmitted, when a signal-to-noise ratio (SNR) is high, a capacity of an additive white Gaussian noise (AWGN) channel to which the binary signal is input has an upper limit. In other words, a transmission rate in this scenario is limited.

SUMMARY

Embodiments of this application provide a data processing method, a communications apparatus, and a communications device. The data processing method helps improve a transmission rate in a parallel channel transmission scenario.

According to a first aspect, an embodiment of this application provides a data processing method. The method may be applied to a first communications device. The first communications device may be a transmit end of encoded data. The first communications device may obtain a plurality of binary sequences. The plurality of binary sequences are transmitted by using S parallel channels. Each parallel channel includes T equivalent binary subgroups, and one equivalent binary subgroup carries one binary sequence. One parallel channel includes X information bit blocks, and each information bit block includes K information bits. One information bit block is divided into Q information bit sub-blocks, and each information bit sub-block is a binary sequence with a length of K/Q. In a first parallel channel of the S parallel channels, K information bits in each information bit block are arranged according to a first order. In a second parallel channel of the S parallel channels, K information bits in each information bit block are arranged according to a second order. The second order is different from the first order, and the second order and the first order meet a mapping relationship.

In the first parallel channel and the second parallel channel, the first communications device respectively places Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups. Q meets $1 \leq q \leq Q$ and $R_{1,t}$, $R_{2,t}, \ldots, R_{Q,t}$ is a code rate of the first Q to-be-encoded blocks in a $t^{th}$ equivalent binary subgroup, N is a code length, x meets $1 \leq x \leq X$, t meets $1 \leq t \leq T$, and T is greater than or equal to 2. A sum of bit sizes of T equivalent binary subgroups in an $s^{th}$ parallel channel occupied by a $q^{th}$ information bit sub-block of the $x^{th}$ information bit block is K/Q, and s meets $1 \leq s \leq S$.

The first communications device performs polar code encoding on M first to-be-encoded blocks in each equivalent binary subgroup separately for the T equivalent binary subgroups in the first parallel channel, to obtain M first code blocks in each equivalent binary subgroup. The first communications device performs polar code encoding on M second to-be-encoded blocks in each equivalent binary subgroup separately for the T equivalent binary subgroups in the second parallel channel, to obtain M second code blocks in each equivalent binary subgroup. The first communications device sends a first data stream and a second data stream to a second communications device, where the first data stream includes a $2^T$-order high-order signal obtained by mapping information bits in T*M first code blocks in the first parallel channel, and the second data stream includes a $2^T$-order high-order signal obtained by mapping information bits in T*M second code blocks in the second parallel channel.

It can be learned that the first communications device may send data streams to the second communications device by using a plurality of parallel channels, and the sent data streams include high-order signals. This helps improve a transmission rate in a parallel channel transmission scenario. The first communications device can implement transmission close to the channel capacity provided that a condition in which a sum of channel capacities of the plurality of parallel channels is greater than or equal to the information transmission rate is met. In addition, in the plurality of parallel channels, information bits are arranged in a specific order, which helps the second communications device correctly perform decoding.

In a possible design, in the first parallel channel, the first communications device places a first information bit sub-block in the Q information bit sub-blocks of the $x^{th}$ information bit block, in the $x^{th}$ timeslot, at a first to an $N*R_{1,t}^{th}$ reliable positions of an $x^{th}$ first to-be-encoded block in T equivalent binary subgroups. A value of $R_{0,t}$ is 0. The first communications device places, in an $(x+1)^{th}$ timeslot, a second information bit sub-block in the Q information bit sub-blocks of the $x^{th}$ information bit block at an $N*R_{1,t}+1^{th}$ to an $N*R_{2,t}^{th}$ reliable positions of $(x+1)$ first to-be-encoded blocks in the T equivalent binary subgroups. By analogy, a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ first to-be-encoded block in the T equivalent binary subgroups.

Similarly, in the second parallel channel, the first communications device places a first information bit sub-block in the Q information bit sub-blocks of the $x^{th}$ information bit block, in the $x^{th}$ timeslot, at a first to an $N*R_{1,t}^{th}$ reliable positions of an $x^{th}$ second to-be-encoded block in T equivalent binary subgroups. The first communications device places a second information bit sub-block in the Q information bit sub-blocks of the $x^{th}$ information bit block, in the $(x+1)^{th}$ timeslot, at an $N*R_{1,t}+1^{th}$ to an $N*R_{2,t}^{th}$ reliable positions of an $(x+1)^{th}$ second to-be-encoded block in T equivalent binary subgroups. By analogy, a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ second to-be-encoded block in the T equivalent binary subgroups. The to-be-encoded blocks include a first to-be-encoded block in the first parallel channel and/or a second to-be-encoded block in the second parallel channel.

It can be learned that, before performing polar encoding processing on the information bits, the first communications device may place the information bit sub-blocks in the to-be-encoded blocks in a specific order, so as to facilitate correct decoding by the second communications device.

In a possible design, the first order is an information bit transmission order $u_1, u_2, \ldots, u_K$, and the second order is a reversed order $u_K, u_{K-1}, \ldots, u_1$ of the first order; or the first order and the second order meet the following mapping relationship:

$$U=[u_1,u_2,\ldots,u_K]$$

$$\overline{U}=[0,0,\ldots,0,u_1,u_2,\ldots,u_K]$$

$$\tilde{U}=[\tilde{u}_1,\tilde{u}_2,\ldots,\tilde{u}_{2^P}]$$

$$\tilde{U}=\overline{U}F^{\otimes P}$$

U represents any information bit block, $u_k$ represents any information bit in U, $\tilde{u}_k$ in some information bits [$\tilde{u}_1, \tilde{u}_2, \ldots, \tilde{u}_K$] in $\tilde{U}$ is a corresponding information bit after $u_k$ is mapped, F is a generator matrix of a polar code, a length of $\overline{U}$ is $H=2^P$, H is greater than or equal to K, and k meets $1 \leq k \leq K$.

It can be learned that the first order and the second order may meet a reversed order relationship, or may meet a specific mapping relationship, so as to facilitate correct decoding by the second communications device.

In a possible design, in a third parallel channel of the S parallel channels, K information bits in each information bit block are arranged according to a second order, and a second order used for the third parallel channel is different from a second order used for the second parallel channel. In the third parallel channel, the first communications device places Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ third to-be-encoded block to an $(x+Q-1)^{th}$ third to-be-encoded block in T equivalent binary subgroups.

The first communications device performs polar code encoding on M third to-be-encoded blocks in each equivalent binary subgroup separately for the T equivalent binary subgroups in the third parallel channel, to obtain M third code blocks. The first communications device sends the first data stream, the second data stream, and a third data stream to the second communications device, where the third data stream includes a $2^T$-order high-order signal obtained by mapping information bits in T*M third code blocks in the third parallel channel.

It can be learned that when the first communications device sends the first data stream, the second data stream, and the third data stream, the information bits in the third data stream may also be arranged in the second order, so that the second communications device can correctly perform decoding based on the first code block, the second code block, and the third code block.

In a possible design, the first communications device maps, in an $s^{th}$ parallel channel of the S parallel channels, K information bits of each information bit block from a binary field to a finite field with $2^w$ elements, to obtain a corresponding symbol sequence obtained after each information bit block is mapped, where a length of the symbol sequence is K/w, and the w is a positive integer greater than 1. The first communications device converts each symbol sequence, where any symbol sequence and a symbol sequence obtained after conversion of the any symbol sequence satisfy the following relationship:

$$\overline{A}=\tilde{A}*H_s$$

$\tilde{A}$ is the any symbol sequence, $\overline{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets $1 \leq s \leq S$, and S is a positive integer greater than 3. The first communications device performs reverse mapping on $\overline{A}$ to obtain a corresponding information bit block [$A_{s,1}, A_{s,2}, \ldots, A_{s,K}$] after the reverse mapping of $\overline{A}$, where $A_{s,k}$ is a corresponding information bit after the reverse mapping. The first communications device divides K information bits corresponding to each information bit block after the reverse mapping into Q information bit sub-blocks.

The first communications device respectively places, in the $s^{th}$ parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ $s^{th}$ to-be-encoded block to an $(x+Q-1)^{th}$ $s^{th}$ to-be-encoded block in T equivalent binary subgroups. The first communications device performs polar code encoding on M $s^{th}$ to-be-encoded blocks in each equivalent binary subgroup separately for the T equivalent binary subgroups in the $s^{th}$ parallel channel, to obtain M $s^{th}$ code blocks in each equivalent binary subgroup. The first communications device sends the first data stream, the second data stream, until the $s^{th}$ data stream to the second communications device, where the $s^{th}$ data stream includes a $2^T$-order high-order signal obtained by mapping information bits in T*M $s^{th}$ code blocks in the $s^{th}$ parallel channel.

It can be learned that when the first communications device simultaneously sends more than three data streams, because simultaneous transmission of three or more data streams needs to be performed in a multi-array field, the first communications device needs to perform corresponding processing on a plurality of information bit sub-blocks in the $s^{th}$ to-be-encoded block, and then encode the $s^{th}$ to-be-encoded block.

In a possible design, any one of code blocks carries at least one information bit sub-block and carries at most Q information bit sub-blocks, and the code blocks include the first code block and the second code block.

It can be learned that a code rate of any code block in the parallel channels does not exceed a channel capacity, which helps implement transmission close to the channel capacity.

In a possible design, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

It can be learned that when a code rate loss is not considered, a quantity of information bit sub-blocks carried by a code block sequentially increases from 1 to Q, and then decreases from Q to 1. In this arrangement manner, the M encoded blocks may carry the complete X information bit blocks. When a code rate loss is considered, a quantity of information bit sub-blocks carried by a code block sequentially increases from 1 to Q, and then remains at Q unchanged.

In a possible design, the Q is a quantization order of a code rate R, and the Q is a positive integer; a sum of code rates of $i^{th}$ code blocks respectively corresponding to the T equivalent binary subgroups is $i \times R/Q$, and the i meets $1 \leq i \leq Q$.

A sum of code rates of $j^{th}$ code blocks respectively corresponding to the T equivalent binary subgroups is $(M-j+1) \times R/Q$, and the j meets $Q+1 \leq j \leq M$; alternatively, a sum of code rates of $j^{th}$ code blocks respectively corresponding to the T equivalent binary subgroups is R, and the j meets $Q+1 \leq j \leq M$.

It can be learned that a sum of code rates of code blocks corresponding to the T equivalent binary subgroups included in one parallel channel meets a channel capacity constraint, and this helps implement transmission close to the channel capacity.

According to a second aspect, an embodiment of this application provides a data processing method, and the method may be applied to a second communications device. The second communications device may be a receive end of encoded data. The second communications device receives a first data stream and a second data stream that are sent by a first communications device by using S parallel channels. The first data stream includes a $2^T$-order high-order signal obtained by mapping information bits in T*M first code blocks in a first parallel channel of the S parallel channels, and the T*M first code blocks are obtained by performing polar code encoding on T*M first to-be-encoded blocks. The second data stream includes a $2^T$-order high-order signal obtained by mapping information bits in T*M second code blocks in a second parallel channel of the S parallel channels, and the T*M second code blocks are obtained by performing polar code encoding on T*M second to-be-encoded blocks. One parallel channel includes X information bit blocks, and each information bit block includes K information bits. One information bit block is divided into Q information bit sub-blocks, and each information bit sub-block is a binary sequence with a length of K/Q. In the first parallel channel, K information bits in each information bit block are arranged according to a first order; and in the second parallel channel, K information bits in each information bit block are arranged according to a second order. The second order is different from the first order, and the second order and the first order meet a mapping relationship.

In the first parallel channel and the second parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups. Q meets $1 \leq q \leq Q$ and $R_{1,t}, R_{2,t}, \ldots, R_{Q,t}$ is a code rate of the first Q to-be-encoded blocks in a $t^{th}$ equivalent binary subgroup, N is a code length, x meets $1 \leq x \leq X$, and t meets $1 \leq t \leq T$. A sum of bit sizes of T equivalent binary subgroups in an $s^{th}$ parallel channel occupied by a $q^{th}$ information bit sub-block of the $x^{th}$ information bit block is K/Q, and s meets $1 \leq s \leq S$. The second communications device performs hierarchical decoding according to a hierarchical decoding level of an equivalent binary subgroup, to obtain decoded data.

It can be learned that when the second communications device receives the first data stream and the second data stream that are sent by the first communications device, the first order used for the information bits in the first data stream and the second order used for the information bits in the second data stream meet a specific mapping relationship, so as to facilitate correct decoding by the second communications device.

In a possible design, in the first parallel channel, a first information bit sub-block in the Q information bit sub-blocks of the $x^{th}$ information bit block respectively occupies, in the $x^{th}$ timeslot, a first to an $N*R_{1,t}^{th}$ reliable positions of an $x^{th}$ first to-be-encoded block in the T equivalent binary subgroups, where a value of $R_{0,t}$ is 0. In an $(x+1)^{th}$ timeslot, a second information bit sub-block in the Q information bit sub-blocks of the $x^{th}$ information bit block respectively occupies, an $N*R_{1,t}+1^{th}$ to an $N*R_{2,t}^{th}$ reliable positions of (x+1) first to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to an $N*R_{Q,t}^{th}$ reliable positions of the $(x+Q-1)^{th}$ first to-be-encoded block in the T equivalent binary subgroups.

Similarly, in the second parallel channel, a first information bit sub-block in the Q information bit sub-blocks of the $x^{th}$ information bit block respectively occupies, in the $x^{th}$ timeslot, at a first to an $N*R_{1,t}^{th}$ reliable positions of an $x^{th}$ second to-be-encoded block in T equivalent binary subgroups. In an $(x+1)^{th}$ timeslot, a second information bit sub-block in the Q information bit sub-blocks of the $x^{th}$ information bit block respectively occupies, an $N*R_{1,t}+1^{th}$ to an $N*R_{2,t}^{th}$ reliable positions of (x+1) second to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ second to-be-encoded block in the T equivalent binary subgroups.

It can be learned that before polar encoding processing is performed on the information bits, the information bit sub-blocks may be placed in the to-be-encoded blocks in a specific order, so as to facilitate correct decoding by the second communications device.

In a possible design, the first order is an information bit transmission order $u_1, u_2, \ldots, u_K$, and the second order is a reversed order $u_K, u_{K-1}, \ldots, u_1$ of the first order; or the first order and the second order meet the following mapping relationship:

$$U = [u_1, u_2, \ldots, u_K]$$

$$\overline{U} = [0, 0, \ldots, 0, u_1, u_2, \ldots, u_K]$$

$$\tilde{U}=[\tilde{u}_1,\tilde{u}_2,\ldots,\tilde{u}_{2^P}]$$

$$\tilde{U}=\overline{U}F^{\otimes P}$$

U represents any information bit block, $u_K$ represents any information bit in U, $\tilde{u}_k$ in some information bits $[\tilde{u}_1, \tilde{u}_2, \ldots, \tilde{u}_K]$ in $\tilde{U}$ is a corresponding information bit after $u_k$ is mapped, F is a generator matrix of a polar code, a length of $\overline{U}$ is $H=2^P$, H is greater than or equal to K, and k meets $1 \leq k \leq K$.

It can be learned that the first order and the second order may meet a reversed order relationship, or may meet a specific mapping relationship, so as to facilitate correct decoding by the second communications device.

In a possible design, if a sum of channel capacities of the first parallel channel and the second parallel channel is greater than or equal to a code rate R, the second communications device performs decoding, in the first parallel channel, to obtain $h_1$ information bit sub-parts included in an information bit block carried by a first code block in an equivalent binary subgroup with a lowest hierarchical decoding level. The second communications device sequentially performs decoding according to hierarchical decoding levels of equivalent binary subgroups in the first parallel channel to obtain $h_2$ information bit sub-parts respectively corresponding to the (T−1) equivalent binary subgroups of the $h_1$ information bit sub-parts in the first parallel channel. The $h_1$ information bit sub-parts and the $h_2$ information bit sub-parts form $k_1$ information bit sub-blocks, and the $k_1$ meets $1 \leq k_1 \leq Q$.

The second communications device performs decoding, in the second parallel channel, to obtain $h_3$ information bit sub-parts of the information bit block carried by a second code block in an equivalent binary subgroup with the lowest hierarchical decoding level. The second communications device sequentially performs decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel. The $h_3$ information bit sub-parts and the $h_4$ information bit sub-parts form $k_2$ information bit sub-blocks, and the $k_1$ and $k_2$ meet $k_1 - k_2 \geq Q$. The second communications device obtains the Q information bit sub-blocks included in the information bit block as a set formed by the $k_1$ information bit sub-blocks and the $k_2$ information bit sub-blocks.

It can be learned that, for each parallel channel, the second communications device may perform decoding according to a hierarchical decoding level of an equivalent binary subgroup in each parallel channel. Because the information bits in the first data stream and the second data stream are arranged in the first order and the second order, this helps the second communications device correctly perform decoding.

In a possible design, the second communications device receives the first data stream, the second data stream, and a third data stream that are sent by the first communications device by using the S parallel channels. The third data stream includes a $2^T$-order high-order signal obtained by mapping information bits in T*M third code blocks in the third parallel channel, and the T*M third code blocks are obtained by performing polar code encoding on T*M third to-be-encoded blocks. In the third parallel channel, K information bits in the one information bit block are arranged according to a second order, and a second order used for information bits in the third parallel channel is different from a second order used for information bits in the second parallel channel.

If a sum of channel capacities of the first parallel channel, the second parallel channel, and the third parallel channel is greater than or equal to a code rate R, the second communications device performs decoding, in the first parallel channel, to obtain $h_1$ information bit sub-parts included in an information bit block carried by a first code block in an equivalent binary subgroup with a lowest hierarchical decoding level. Then, decoding is sequentially performed according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel. The $h_1$ information bit sub-parts and the $h_2$ information bit sub-parts form $k_1$ information bit sub-blocks, and the $k_1$ meets $1 \leq k_1 < Q$. The second communications device performs decoding, in the second parallel channel according to a second order of an information bit arrangement in the second parallel channel, to obtain $h_3$ information bit sub-parts of the information bit block carried by a second code block in an equivalent binary subgroup with the lowest hierarchical decoding level. Then, decoding is sequentially performed according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel. The $h_3$ information bit sub-parts and the $h_4$ information bit sub-parts form $k_2$ information bit sub-blocks, and the $k_1$ and $k_2$ meet $k_1+k_2<Q$. The second communications device performs decoding, in the third parallel channel according to a second order of an information bit arrangement in the third parallel channel, to obtain $h_5$ information bit sub-parts of the information bit block carried by a third code block in an equivalent binary subgroup with the lowest hierarchical decoding level. Then, decoding is sequentially performed according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel. The $h_5$ information bit sub-parts and the $h_6$ information bit sub-parts form $k_3$ information bit sub-blocks, and the $k_1$, the $k_2$ and $k_3$ meet $k_1+k_2+k_3 \geq Q$. Based on the foregoing information bits, the second communications device obtains the Q information bit sub-blocks included in the information bit block as a set formed by the $k_1$ information bit sub-blocks, the $k_2$ information bit sub-blocks, and the $k_3$ information bit sub-blocks.

It can be learned that, for each parallel channel, the second communications device may perform decoding according to a hierarchical decoding level of an equivalent binary subgroup in each parallel channel. Because the information bits in the first data stream, the second data stream and the third data stream are arranged in the first order and the second order, this helps the second communications device correctly perform decoding.

In a possible design, the second communications device receives the first data stream, the second data stream, until the $S^{th}$ data stream that are sent by the first communications device by using the S parallel channels, where an $s^{th}$ data stream in the first data stream, the second data stream, until the $S^{th}$ data stream includes a $2^T$-order high-order signal obtained by mapping information bits in T*M $s^{th}$ code blocks in an $s^{th}$ parallel channel of the S parallel channels. The T*M $s^{th}$ code blocks are obtained by performing polar code encoding on T*M $s^{th}$ to-be-encoded blocks; and K information bits in each processed information bit block are arranged according to the first order.

In the $s^{th}$ parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ $s^{th}$ to-be-encoded block to an $(x+Q-1)^{th}s^{th}$ to-be-encoded block in T equivalent binary subgroups. Processing on each information bit block meets the following condition:

K information bits of each information bit block are mapped from a binary field to a finite field with $2^w$ elements, each information bit block after mapping corresponds to a symbol sequence, a length of the symbol sequence is K/w, and the w is a positive integer greater than 1. Any symbol sequence and a symbol sequence obtained after conversion of the any symbol sequence satisfy the following relationship:

$$\overline{A} = \tilde{A} * H_s$$

$\tilde{A}$ is the any symbol sequence, $\overline{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets $1 \le s \le S$, and S is a positive integer greater than 3. A corresponding information bit block after the reverse mapping of $\overline{A}$ is $[A_{s,1}, A_{s,2}, \ldots, A_{s,K}]$, and $A_{s,k}$ is a corresponding information bit after the reverse mapping.

It can be learned that, when the second communications device receives more than three data streams that are simultaneously sent by the first communications device, because the three or more data streams need to be simultaneously transmitted in a multi-array field, the first communications device needs to perform corresponding processing on a plurality of information bit sub-blocks in all to-be-encoded blocks in each data stream, and then encode all to-be-encoded blocks in each data stream.

In a possible design, any one of code blocks carries at least one information bit sub-block and carries at most Q information bit sub-blocks, and the code blocks include the first code block and the second code block.

It can be learned that a code rate of any code block in the parallel channels does not exceed a channel capacity, which helps implement transmission close to the channel capacity.

In a possible design, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

It can be learned that when a code rate loss is not considered, a quantity of information bit sub-blocks carried by a code block sequentially increases from 1 to Q, and then decreases from Q to 1. In this arrangement manner, the M encoded blocks may carry the complete X information bit blocks. When a code rate loss is considered, a quantity of information bit sub-blocks carried by a code block sequentially increases from 1 to Q, and then remains at Q unchanged.

In a possible design, the Q is a quantization order of a code rate R, and the Q is a positive integer; a sum of code rates of $i^{th}$ code blocks respectively corresponding to the T equivalent binary subgroups is $i \times R/Q$, and the i meets $1 \le i \le Q$.

A sum of code rates of $j^{th}$ code blocks respectively corresponding to the T equivalent binary subgroups is $(M-j+1) \times R/Q$, and the j meets $Q+1 \le j \le M$ alternatively, a sum of code rates of $j^{th}$ code blocks respectively corresponding to the T equivalent binary subgroups is R, and the j meets $Q+1 \le j \le M$.

It can be learned that a sum of code rates of code blocks corresponding to the T equivalent binary subgroups included in one parallel channel meets a channel capacity constraint, and this helps implement transmission close to the channel capacity.

According to a third aspect, an embodiment of this application provides a communications device. The communications device includes a transceiver and a processor. The transceiver is configured to obtain a plurality of binary sequences. The plurality of binary sequences are transmitted by using S parallel channels. Each parallel channel includes T equivalent binary subgroups, and one equivalent binary subgroup carries one binary sequence. One parallel channel includes X information bit blocks, and each information bit block includes K information bits. One information bit block is divided into Q information bit sub-blocks, and each information bit sub-block is a binary sequence with a length of K/Q. In a first parallel channel of the S parallel channels, K information bits in each information bit block are arranged according to a first order. In a second parallel channel of the S parallel channels, K information bits in each information bit block are arranged according to a second order. The second order is different from the first order, and the second order and the first order meet a mapping relationship.

In the first parallel channel and the second parallel channel, the processor is configured to respectively place Q information bit sub-blocks of an $x^{th}$ information bit block, respectively in an $x^{th}$ timeslot to an $(x+Q-1)^{th}$ timeslot, at an $N*R_{(q-1),t}^{th}$ to an $N*R_{q,t}^{th}$ reliable positions of an $x^{th}$ to-be-encoded block to an $(x+Q-1)^{th}$ to-be-encoded block in T equivalent binary subgroups. Q meets $1 \le q \le Q$ and $R_{1,t}, R_{2,t}, \ldots, R_{Q,t}$ is a code rate of the first Q to-be-encoded blocks in a $t^{th}$ equivalent binary subgroup, N is a code length, x meets $1 \le x \le X$, t meets $1 \le t \le T$, and T is greater than or equal to 2. A sum of bit sizes of T equivalent binary subgroups in an $s^{th}$ parallel channel occupied by a $q^{th}$ information bit sub-block of the $x^{th}$ information bit block is K/Q, and s meets $1 \le s \le S$.

The processor is further configured to perform polar code encoding on M first to-be-encoded blocks in each equivalent binary subgroup separately for the T equivalent binary subgroups in the first parallel channel, to obtain M first code blocks in each equivalent binary subgroup. The processor is further configured to perform polar code encoding on M second to-be-encoded blocks in each equivalent binary subgroup separately for the T equivalent binary subgroups in the second parallel channel, to obtain M second code blocks in each equivalent binary subgroup. The transceiver is further configured to send a first data stream and a second data stream to a second communications device, where the first data stream includes a $2^T$-order high-order signal obtained by mapping information bits in T*M first code blocks in the first parallel channel, and the second data stream includes a $2^T$-order high-order signal obtained by mapping information bits in T*M second code blocks in the second parallel channel.

In a possible design, in the first parallel channel, the processor is further configured to place a first information bit sub-block in the Q information bit sub-blocks of the $x^{th}$ information bit block, in the $x^{th}$ timeslot, at a first to an $N*R_{1,t}^{th}$ reliable positions of an $x^{th}$ first to-be-encoded block in T equivalent binary subgroups. A value of $R_{0,t}$ is 0. The processor is further configured to place, in an $(x+1)^{th}$ timeslot, a second information bit sub-block in the Q information bit sub-blocks of the $x^{th}$ information bit block at an $N*R_{1,t}+1^{th}$ to an $N*R_{2,t}^{th}$ reliable positions of (x+1) first to-be-encoded blocks in the T equivalent binary subgroups. By analogy, a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ first to-be-encoded block in the T equivalent binary subgroups.

Similarly, in the second parallel channel, the processor is further configured to place a first information bit sub-block in the Q information bit sub-blocks of the $x^{th}$ information bit block, in the $x^{th}$ timeslot, at a first to an $N*R_{1,t}^{th}$ reliable positions of an $x^{th}$ second to-be-encoded block in T equivalent binary subgroups. The processor is further configured to place a second information bit sub-block in the Q information bit sub-blocks of the $x^{th}$ information bit block, in the $(x+1)^{th}$ timeslot, at an $N*R_{1,t}+1^{th}$ to an $N*R_{2,t}^{th}$ reliable positions of an $(x+1)^{th}$ second to-be-encoded block in T equivalent binary subgroups. By analogy, a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ second to-be-encoded block in the T equivalent binary subgroups. The to-be-encoded blocks include a first to-be-encoded block in the first parallel channel and/or a second to-be-encoded block in the second parallel channel.

In a possible design, the first order is an information bit transmission order $u_1, u_2, \ldots, u_K$, and the second order is a reversed order $u_K, u_{K-1}, \ldots, u_1$ of the first order; or the first order and the second order meet the following mapping relationship:

$$U=[u_1,u_2, \ldots ,u_K]$$

$$\overline{U}=[0,0, \ldots ,0,u_1,u_2, \ldots ,u_K]$$

$$\tilde{U}=[\tilde{u}_1,\tilde{u}_2, \ldots ,\tilde{u}_{2^P}]$$

$$\tilde{U}=\overline{U}F^{\otimes P}$$

U represents any information bit block, $u_k$ represents any information bit in U, $\tilde{u}_k$ in some information bits $[\tilde{u}_1, \tilde{u}_2, \ldots, \tilde{u}_K]$ in $\tilde{U}$ is a corresponding information bit after $u_k$ is mapped, F is a generator matrix of a polar code, a length of $\overline{U}$ is $H=2^P$, H is greater than or equal to K, and k meets $1 \le k \le K$.

In a possible design, in a third parallel channel of the S parallel channels, K information bits in each information bit block are arranged according to a second order, and a second order used for the third parallel channel is different from a second order used for the second parallel channel. The processor is further configured to respectively place, in the third parallel channel, Q information bit sub-blocks of an $x^{th}$ information bit block, respectively in an $x^{th}$ timeslot to an $(x+Q-1)^{th}$ timeslot, at an $N*R_{(q-1),t}^{th}$ an $N*R_{q,t}^{th}$ reliable positions of an $x^{th}$ third to-be-encoded block to an $(x+Q-1)^{th}$ third to-be-encoded block in T equivalent binary subgroups.

The processor is further configured to perform polar code encoding on M third to-be-encoded blocks in each equivalent binary subgroup separately for the T equivalent binary subgroups in the third parallel channel, to obtain M third code blocks. The transceiver is further configured to send the first data stream, the second data stream, and a third data stream to the second communications device, where the third data stream includes a $2^T$-order high-order signal obtained by mapping information bits in T*M third code blocks in the third parallel channel.

In a possible design, the processor is further configured to:
map, in an $s^{th}$ parallel channel of the S parallel channels, K information bits of each information bit block from a binary field to a finite field with $2^w$ elements, to obtain a corresponding symbol sequence obtained after each information bit block is mapped, where a length of the symbol sequence is K/w, and the w is a positive integer greater than 1; the first communications device converts each symbol sequence, where any symbol sequence and a symbol sequence obtained after conversion of the any symbol sequence satisfy the following relationship:

$$\overline{A}=\tilde{A}*H_s$$

$\tilde{A}$ is the any symbol sequence, $\overline{A}$ is a symbol sequence after $\tilde{A}$ is converted, a length of $\overline{A}$ is K/w, the $H_s$ is a universal decoding matrix UDM of K/w×K/w in a finite field with $2^w$ elements, s is used to indicate an $s^{th}$ data stream, s meets $1 \le s \le S$, and S is a positive integer greater than 3; perform reverse mapping on A to obtain a corresponding information bit block $[A_{s,1}, A_{s,2}, \ldots, A_{s,K}]$ after the reverse mapping of $\overline{A}$, where $A_{s,k}$ is a corresponding information bit after the reverse mapping; divide K information bits corresponding to each information bit block after the reverse mapping into Q information bit sub-blocks;

respectively place, in the $s^{th}$ parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ $s^{th}$ to-be-encoded block to an $(x+Q-1)^{th}$ $s^{th}$ to-be-encoded block in T equivalent binary subgroups; and perform polar code encoding on M $s^{th}$ to-be-encoded blocks in each equivalent binary subgroup separately for the T equivalent binary subgroups in the $s^{th}$ parallel channel, to obtain M $s^{th}$ code blocks in each equivalent binary subgroup.

The transceiver is further configured to send the first data stream, the second data stream, until the $s^{th}$ data stream to the second communications device, where the $s^{th}$ data stream includes a $2^T$-order high-order signal obtained by mapping information bits in T*M $s^{th}$ code blocks in the $s^{th}$ parallel channel.

In a possible design, any one of code blocks carries at least one information bit sub-block and carries at most Q information bit sub-blocks, and the code blocks include the first code block and the second code block.

In a possible design, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

In a possible design, the Q is a quantization order of a code rate R, and the Q is a positive integer; a sum of code rates of $i^{th}$ code blocks respectively corresponding to the T equivalent binary subgroups is i×R/Q, and the i meets 1≤i≤Q.

A sum of code rates of $j^{th}$ code blocks respectively corresponding to the T equivalent binary subgroups is (M−j+1)×R/Q, and the j meets Q+1≤j≤M; alternatively, a sum of code rates of $j^{th}$ code blocks respectively corresponding to the T equivalent binary subgroups is R, and the j meets Q+1≤j≤M.

According to a fourth aspect, an embodiment of this application provides a communications device. The communications device includes a transceiver and a processor. The transceiver is configured to receive a first data stream and a second data stream that are sent by a first communications device by using S parallel channels. The first data stream includes a $2^T$-order high-order signal obtained by mapping information bits in T*M first code blocks in a first parallel channel of the S parallel channels, and the T*M first code blocks are obtained by performing polar code encoding on T*M first to-be-encoded blocks. The second data stream includes a $2^T$-order high-order signal obtained by mapping information bits in T*M second code blocks in a second parallel channel of the S parallel channels, and the T*M second code blocks are obtained by performing polar code encoding on T*M second to-be-encoded blocks. One parallel channel includes X information bit blocks, and each information bit block includes K information bits. One information bit block is divided into Q information bit sub-blocks, and each information bit sub-block is a binary sequence with a length of K/Q. In the first parallel channel, K information bits in each information bit block are arranged according to a first order; and in the second parallel channel, K information bits in each information bit block are arranged according to a second order. The second order is different from the first order, and the second order and the first order meet a mapping relationship.

In the first parallel channel and the second parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups. Q meets 1≤q≤Q and $R_{1,t}, R_{2,t}, \ldots, R_{Q,t}$ is a code rate of the first Q to-be-encoded blocks in a $t^{th}$ equivalent binary subgroup, N is a code length, x meets 1≤x≤X, and t meets 1≤t≤T. A sum of bit sizes of T equivalent binary subgroups in an $s^{th}$ parallel channel occupied by a $q^{th}$ information bit sub-block of the $x^{th}$ information bit block is K/Q, and s meets 1≤s≤S. The processor is configured to perform hierarchical decoding according to a hierarchical decoding level of an equivalent binary subgroup, to obtain decoded data.

In a possible design, in the first parallel channel, a first information bit sub-block in the Q information bit sub-blocks of the $x^{th}$ information bit block respectively occupies, in the $x^{th}$ timeslot, a first to an $N*R_{1,t}^{th}$ reliable positions of an $x^{th}$ first to-be-encoded block in the T equivalent binary subgroups, where a value of $R_{0,t}$ is 0. In an $(x+1)^{th}$ timeslot, a second information bit sub-block in the Q information bit sub-blocks of the $x^{th}$ information bit block respectively occupies, an $N*R_{1,t}+1^{th}$ to a $N*R_{2,t}^{th}$ reliable positions of (x+1) first to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ first to-be-encoded block in the T equivalent binary subgroups.

Similarly, in the second parallel channel, a first information bit sub-block in the Q information bit sub-blocks of the $x^{th}$ information bit block respectively occupies, in the $x^{th}$ timeslot, at a first to an $N*R_{1,t}^{th}$ reliable positions of an $x^{th}$ second to-be-encoded block in T equivalent binary subgroups. In an $(x+1)^{th}$ timeslot, a second information bit sub-block in the Q information bit sub-blocks of the $x^{th}$ information bit block respectively occupies, an $N*R_{1,t}+1^{th}$ to an $N*R_{2,t}^{th}$ reliable positions of (x+1) second to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ second to-be-encoded block in the T equivalent binary subgroups.

In a possible design, the first order is an information bit transmission order $u_1, u_2 \ldots m\ u_K$, and the second order is a reversed order $u_K, u_{K-1}, \ldots, u_1$ of the first order; or the first order and the second order meet the following mapping relationship:

$$U=[u_1,u_2,\ldots,u_K]$$

$$\overline{U}=[0,0,\ldots,0,u_1,u_2,\ldots,u_K]$$

$$\tilde{U}=[\tilde{u}_1,\tilde{u}_2,\ldots,\tilde{u}_{2^P}]$$

$$\tilde{U}=\overline{U}F^{\otimes P}$$

U represents any information bit block, $u_k$ represents any information bit in U, $\tilde{u}_k$ in some information bits $[\tilde{u}_1, \tilde{u}_2, \ldots, \tilde{u}_K]$ in U is a corresponding information bit after $u_k$ is mapped, F is a generator matrix of a polar code, a length of $\overline{U}$ is $H=2^P$, H is greater than or equal to K, and k meets 1≤k≤K.

In a possible design, that the processor is configured to perform hierarchical decoding according to a hierarchical decoding level of an equivalent binary subgroup, to obtain decoded data is specifically configured to:

If a sum of channel capacities of the first parallel channel and the second parallel channel is greater than or equal to a code rate R, a second communications device performs decoding, in the first parallel channel, to obtain $h_1$ information bit sub-parts included in an information bit block carried by a first code block in an equivalent binary subgroup with a lowest hierarchical decoding level. The second communications device sequentially performs decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel. The $h_1$ information bit sub-parts and the $h_2$ information bit sub-parts form $k_1$ information bit sub-blocks, and the $k_1$ meets 1≤$k_1$≤Q.

The second communications device performs decoding, in the second parallel channel, to obtain $h_3$ information bit sub-parts of the information bit block carried by a second code block in an equivalent binary subgroup with the lowest hierarchical decoding level. The second communications device sequentially performs decoding according to hierarchical decoding levels of equivalent binary subgroups in the second parallel channel to obtain $h_3$ information bit sub-parts respectively corresponding to (T−1) equivalent binary subgroups of the $h_4$ information bit sub-parts in the second parallel channel. The $h_3$ information bit sub-parts and the $h_4$ information bit sub-parts form $k_2$ information bit sub-blocks, and the $k_1$ and $k_2$ meet $k_1-k_2 \geq Q$. The second communications device obtains the Q information bit sub-blocks included in the information bit block as a set formed by the $k_1$ information bit sub-blocks and the $k_2$ information bit sub-blocks.

In a possible design, that the transceiver is configured to receive a first data stream and a second data stream that are sent by a first communications device by using S parallel channels is specifically configured to:

receive the first data stream, the second data stream, and a third data stream that are sent by the first communications device by using the S parallel channels. The third data stream includes a $2^T$-order high-order signal obtained by mapping information bits in T*M third code blocks in the third parallel channel, and the T*M third code blocks are obtained by performing polar code encoding on T*M third to-be-encoded blocks. In the third parallel channel, K information bits in the one information bit block are arranged according to a second order, and a second order used for information bits in the third parallel channel is different from a second order used for information bits in the second parallel channel.

That the processor is configured to perform hierarchical decoding according to a hierarchical decoding level of an equivalent binary subgroup, to obtain decoded data is specifically configured to:

If a sum of channel capacities of the first parallel channel, the second parallel channel, and the third parallel channel is greater than or equal to a code rate R, the second communications device performs decoding, in the first parallel channel, to obtain $h_1$ information bit sub-parts included in an information bit block carried by a first code block in an equivalent binary subgroup with a lowest hierarchical decoding level. Then, decoding is sequentially performed according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel. The $h_1$ information bit sub-parts and the $h_2$ information bit sub-parts form $k_1$ information bit sub-blocks, and the $k_1$ meets $1 \leq k_1 < Q$. The second communications device performs decoding, in the second parallel channel according to a second order of an information bit arrangement in the second parallel channel, to obtain $h_3$ information bit sub-parts of the information bit block carried by a second code block in an equivalent binary subgroup with the lowest hierarchical decoding level. Then, decoding is sequentially performed according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel. The $h_3$ information bit sub-parts and the $h_4$ information bit sub-parts form $k_2$ information bit sub-blocks, and the $k_1$ and $k_2$ meet $k_1+k_2<Q$. The second communications device performs decoding, in the third parallel channel according to a second order of an information bit arrangement in the third parallel channel, to obtain $h_5$ information bit sub-parts of the information bit block carried by a third code block in an equivalent binary subgroup with the lowest hierarchical decoding level. Then, decoding is sequentially performed according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel. The $h_5$ information bit sub-parts and the $h_6$ information bit sub-parts form $k_3$ information bit sub-blocks, and the $k_1$, the $k_2$ and $k_3$ meet $k_1+k_2+k_3 \geq Q$. Based on the foregoing information bits, the second communications device obtains the Q information bit sub-blocks included in the information bit block as a set formed by the $k_1$ information bit sub-blocks, the $k_2$ information bit sub-blocks, and the $k_3$ information bit sub-blocks.

In a possible design, that the transceiver is configured to receive a first data stream and a second data stream that are sent by a first communications device by using S parallel channels is specifically configured to:

receive the first data stream, the second data stream, until the $S^{th}$ data stream that are sent by the first communications device by using the S parallel channels, where an $s^{th}$ data stream in the first data stream, the second data stream, until the $S^{th}$ data stream includes a $2^T$-order high-order signal obtained by mapping information bits in T*M $s^{th}$ code blocks in an $s^{th}$ parallel channel of the S parallel channels. The T*M $s^{th}$ code blocks are obtained by performing polar code encoding on T*M $s^{th}$ to-be-encoded blocks; and K information bits in each processed information bit block are arranged according to the first order.

In the $s^{th}$ parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ $s^{th}$ to-be-encoded block to an $(x+Q-1)^{th}$ $s^{th}$ to-be-encoded block in T equivalent binary subgroups. Processing on each information bit block meets the following condition:

K information bits of each information bit block are mapped from a binary field to a finite field with $2^w$ elements, each information bit block after mapping corresponds to a symbol sequence, a length of the symbol sequence is K/w, and the w is a positive integer greater than 1. Any symbol sequence and a symbol sequence obtained after conversion of the any symbol sequence satisfy the following relationship:

$$\overline{A}=\tilde{A}*H_s$$

$\tilde{A}$ is the any symbol sequence, $\overline{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets $1 \leq s \leq S$, and S is a positive integer greater than 3. A corresponding information bit block after the reverse mapping of $\overline{A}$ is $[A_{s,1}, A_{s,2}, \ldots, A_{s,K}]$ and $A_{s,k}$ is a corresponding information bit after the reverse mapping.

In a possible design, any one of code blocks carries at least one information bit sub-block and carries at most Q information bit sub-blocks, and the code blocks include the first code block and the second code block.

In a possible design, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

In a possible design, the Q is a quantization order of a code rate R, and the Q is a positive integer; a sum of code rates of $i^{th}$ code blocks respectively corresponding to the T equivalent binary subgroups is i×R/Q, and the i meets $1 \le i \le Q$.

A sum of code rates of $j^{th}$ code blocks respectively corresponding to the T equivalent binary subgroups is (M−j+1)×R/Q, and the j meets $Q+1 \le j \le M$; alternatively, a sum of code rates of $j^{th}$ code blocks respectively corresponding to the T equivalent binary subgroups is R, and the j meets $Q+1 \le j \le M$.

According to a fifth aspect, an embodiment of this application provides a communications device. The device has a function of implementing the data processing method provided in the first aspect. The function may be implemented by hardware, or may be implemented by corresponding software executed by hardware. The hardware or software includes one or more modules corresponding to the foregoing function.

According to a sixth aspect, an embodiment of this application provides a communications device. The device has a function of implementing the data processing method provided in the second aspect. The function may be implemented by hardware, or may be implemented by corresponding software executed by hardware. The hardware or software includes one or more modules corresponding to the foregoing function.

According to a seventh aspect, an embodiment of this application provides a communications system. The communications system includes the communications device provided in the second aspect or the fifth aspect and the communications device provided in the third aspect or the sixth aspect.

According to an eighth aspect, an embodiment of this application provides a computer-readable storage medium. The readable storage medium includes a program or an instruction. When the program or the instruction is run on a computer, the computer is enabled to perform the method according to the first aspect or any possible implementation of the first aspect.

According to a ninth aspect, an embodiment of this application provides a computer-readable storage medium. The readable storage medium includes a program or an instruction. When the program or the instruction is run on a computer, the computer is enabled to perform the method according to the second aspect or any possible implementation of the second aspect.

According to a tenth aspect, an embodiment of this application provides a chip or a chip system. The chip or the chip system includes at least one processor and an interface. The interface is interconnected to the at least one processor through a line. The at least one processor is configured to run a computer program or an instruction, to perform the method described in the first aspect or any possible implementation of the first aspect.

According to an eleventh aspect, an embodiment of this application provides a chip or a chip system. The chip or the chip system includes at least one processor and an interface. The interface is interconnected to the at least one processor through a line. The at least one processor is configured to run a computer program or an instruction, to perform the method described in the second aspect or any possible implementation of the second aspect.

The interface in the chip may be an input/output interface, a pin, a circuit, or the like.

The chip system in the foregoing aspects may be a system-on-a-chip (SOC), a baseband chip, or the like. The baseband chip may include a processor, a channel encoder, a digital signal processor, a modem, an interface module, and the like.

In a possible implementation, the chip or the chip system described in this application further includes at least one memory, and the at least one memory stores instructions. The memory may be a storage unit in the chip, for example, a register or a cache; or may be a storage unit (for example, a read-only memory or a random access memory) of the chip.

According to a twelfth aspect, an embodiment of this application provides a computer program or a computer program product, including code or an instruction. When the code or the instruction is run on a computer, the computer is enabled to perform the method in the first aspect or any possible implementation of the first aspect.

According to a thirteenth aspect, an embodiment of this application provides a computer program or a computer program product, including code or an instruction. When the code or the instruction is run on a computer, the computer is enabled to perform the method according to the second aspect or any possible implementation of the second aspect.

BRIEF DESCRIPTION OF THE DRAWINGS

FIG. 7 is a schematic diagram of an information bit block and an information bit sub-block according to an embodiment of this application;

FIG. 8A is a schematic diagram of splitting a parallel channel into two equivalent binary subgroups according to an embodiment of this application;

DETAILED DESCRIPTION OF ILLUSTRATIVE EMBODIMENTS

The following describes technical solutions in embodiments of this application with reference to the accompanying drawings in the embodiments of this application.

Polar code is a channel encoding scheme that is strictly proved to reach a channel capacity. The polar code features high performance, low complexity, a flexible matching manner, and the like. Currently, the polar code has been determined as an uplink and/or downlink control channel encoding scheme in a $5^{th}$ generation mobile communications (5G) control channel enhanced mobile broadband (eMBB) scenario.

Figure 1:
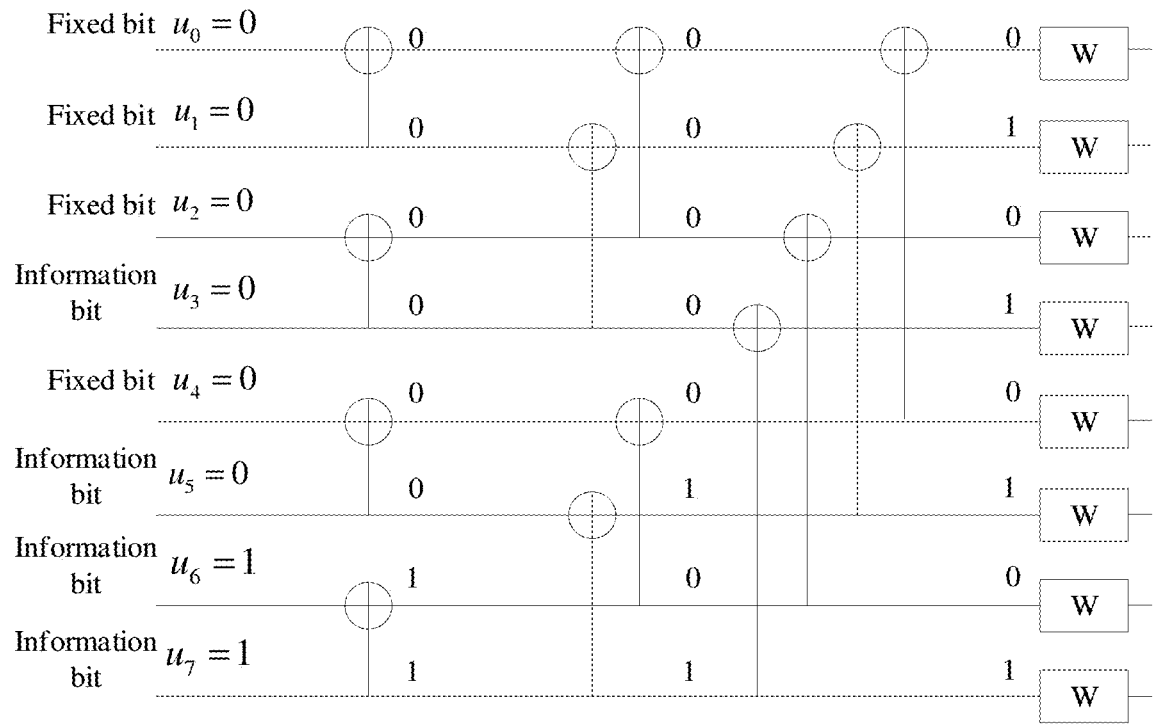
FIG. 1 is a schematic diagram of 8×8 polar code encoding.

FIG. 1 is a schematic diagram of 8×8 polar code encoding. To-be-encoded bits are sorted based on respective reliabilities, and are sequentially arranged at different positions in a to-be-encoded block. Generally, a bit with high reliability is set as an information bit (data), and a bit with low reliability is set as a fixed bit (frozen). A value of a fixed bit is usually set to 0, and is known to both a transmit end and a receive end during actual transmission. As shown in FIG. 1, $u_7$, $u_6$, $u_5$, $u_3$ are four bits with higher reliability, and are set as information bits; and $u_4$, $u_2$, $u_1$, $u_0$ are four bits with lower reliability, and are set as fixed bits.

Figure 2:
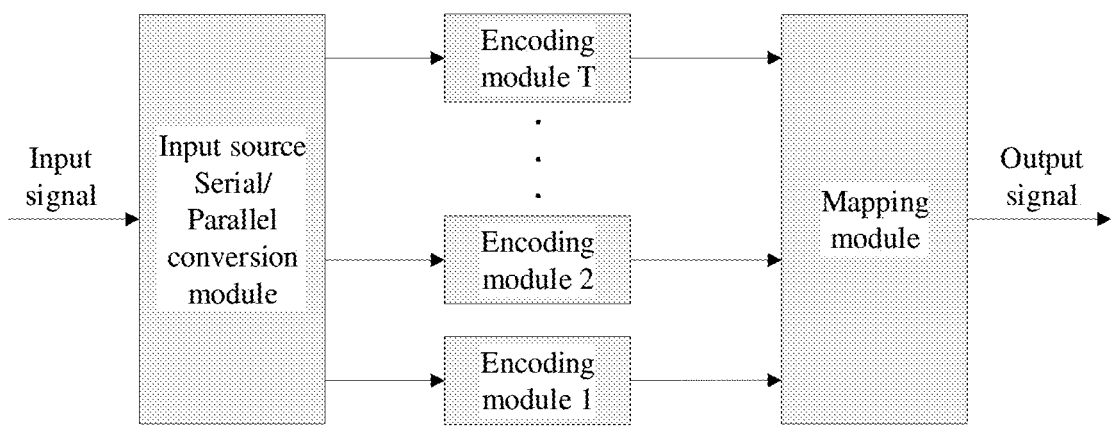
FIG. 2 is a schematic diagram of a structure of a multi-level encoder.

The multi-level coding (MLC) technology combines encoding and modulation, which can effectively improve reliability of data transmission without occupying extra bandwidth and reducing the actual data transmission rate. Referring to FIG. 2, FIG. 2 is a schematic diagram of a structure of a multi-level encoder. As shown in FIG. 2, the multi-level encoder includes an input source serial/parallel conversion module, a multi-level encoding module, and a mapping module. The input source serial/parallel conversion module is configured to perform serial/parallel conversion on input signals, to convert the input signals into T parallel signals; the T parallel signals are respectively input into T encoding modules for encoding; and T encoded parallel signals are input into the mapping module, and are mapped into output signals. The core idea of the MLC technology is to protect different information bits with different codes at different levels. A code rate of the MLC code is equal to a sum of code rates of all levels of component codes, as shown in the following:

$$R = \sum_{t=1}^{T} R_{q,t}$$

R represents a bit rate of the MLC code, $R_t$ represents a bit rate of a tth-level component code, and T represents that the T-level component codes are included in total.

Figure 3:
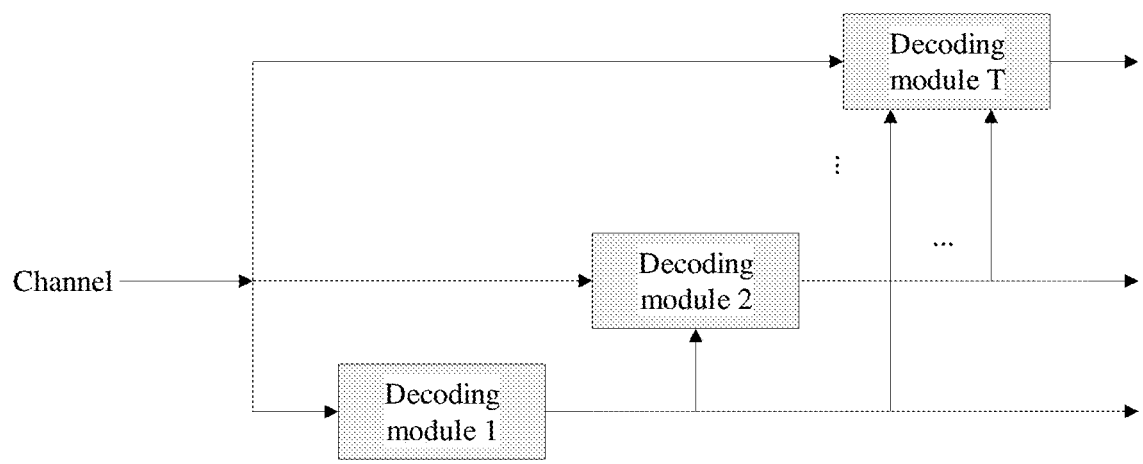
FIG. 3 is a schematic diagram of a structure of a multi-stage decoder.

A multi-stage decoding algorithm (MSD) is also proposed for the MLC technology. The MSD decoding algorithm is divided into a plurality of stages. During decoding at a current level, decoding results of several levels before the current level may be used as prior information, thereby improving information transmission reliability. Referring to FIG. 3, FIG. 3 is a schematic diagram of a structure of a multi-stage decoder. The multi-stage decoder includes multi-stage decoding modules. When performing decoding, a decoding module at each stage may use decoding results of previous several stages as prior information for decoding, as shown in FIG. 3.

Figure 4:
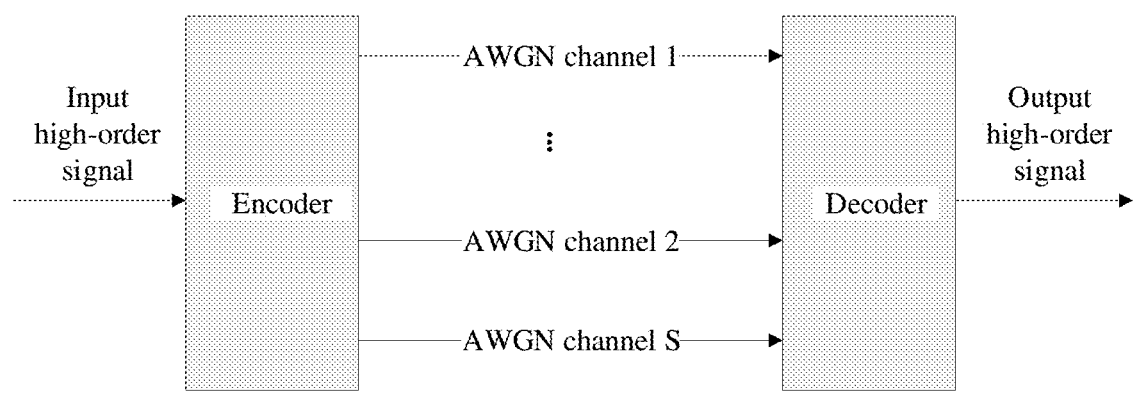
FIG. 4 is a schematic diagram of a parallel transmission scenario of S parallel channels.

Referring to FIG. 4, FIG. 4 is a schematic diagram of a parallel transmission scenario of S parallel channels. In the parallel transmission scenario, the S parallel channels may simultaneously transmit S groups of parallel signals, so that information transmission efficiency can be improved. However, in the parallel transmission scenario, if each parallel channel transmits a binary signal, when a signal-to-noise ratio (SNR) is high, a capacity of an additive white Gaussian noise (AWGN) channel to which the binary signal is input has an upper limit. In this case, to increase a transmission rate, a high-order signal (that is, a non-binary signal) such as a $2^T$-PAM signal or a QAM signal may be transmitted on each parallel channel. Therefore, when an input signal in each parallel channel is a high-order signal, how to perform polar code encoding and decoding becomes a problem to be resolved.

According to the data processing method provided in this embodiment of this application, in a parallel channel transmission scenario in which high-order signals are input, each parallel channel is divided into a plurality of equivalent binary subgroups, and a corresponding polar encoding and decoding solution is designed, so as to implement transmission that reaches a channel capacity.

Figure 5A:
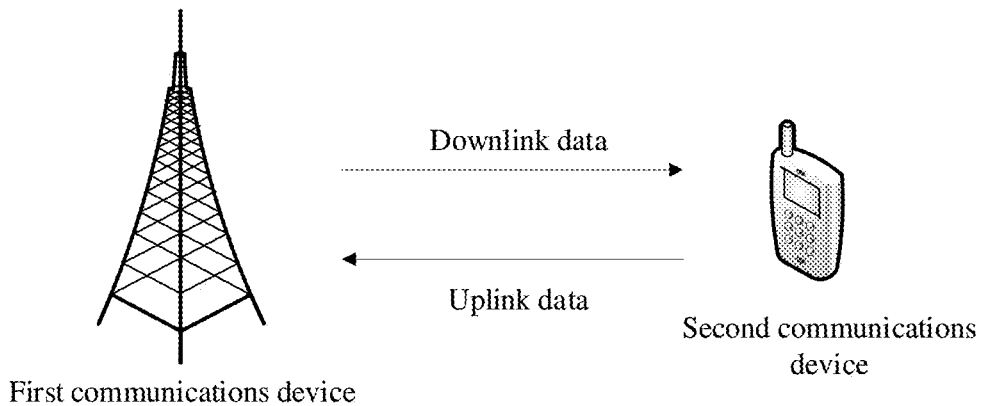
FIG. 5A is a schematic diagram of a structure of a communications system according to an embodiment of this application.

Referring to FIG. 5A. FIG. 5A shows a communications system according to an embodiment of this application. The communications system includes a first communications device and a second communications device. The first communications device is a transmit end of encoded data, and is configured to send downlink data to the second communications device, or receive uplink data from the second communications device. For example, when sending downlink data to the second communications device, the first communications device may perform polar code encoding on a to-be-encoded information bit. After constellation modulation is performed on data obtained after channel encoding, the data may be sent to the second communications device through a downlink data channel.

The second communications device is a receive end of encoded data, and is configured to send uplink data to the first communications device, or receive downlink data from the first communications device. For example, when sending uplink data to the first communications device, the second communications device may perform polar code encoding on a to-be-encoded information bit. After constellation modulation is performed on data obtained after channel encoding, the data may be sent to the first communications device through an uplink data channel.

The first communications device may be any device with a wireless transceiver function, and provides a wireless communications service for the second communications device in a coverage area. An access network device may include but is not limited to: an evolved NodeB (NodeB, eNB, or e-NodeB, evolutional NodeB) in a Long Term Evolution (LTE) system, a base station (gNodeB or gNB) or a transceiver point (transmission receiving point/transmission reception point, TRP) in a next-generation radio access technology (NR), a base station evolved later in 3GPP, an access node in a Wi-Fi system, a wireless relay node, a wireless backhaul node, and a device that bears a base station function in a vehicle-to-everything (V2X), device-to-device (D2D) communications and machine-to-machine communications, a satellite, and the like.

The second communications device may be a terminal device with a wireless transceiver function, or the second communications device may be a chip. The terminal device may be a user equipment (UE), a mobile phone, a tablet computer (Pad), a computer with a wireless transceiver function, a virtual reality (VR) terminal device, an augmented reality (AR) terminal device, an in-vehicle terminal device, a wireless terminal in telemedicine (remote medical), a wireless terminal in a smart grid, a wearable terminal device, a device with a communications function in the Internet of Things (IOT), or the like.

Figure 5B:
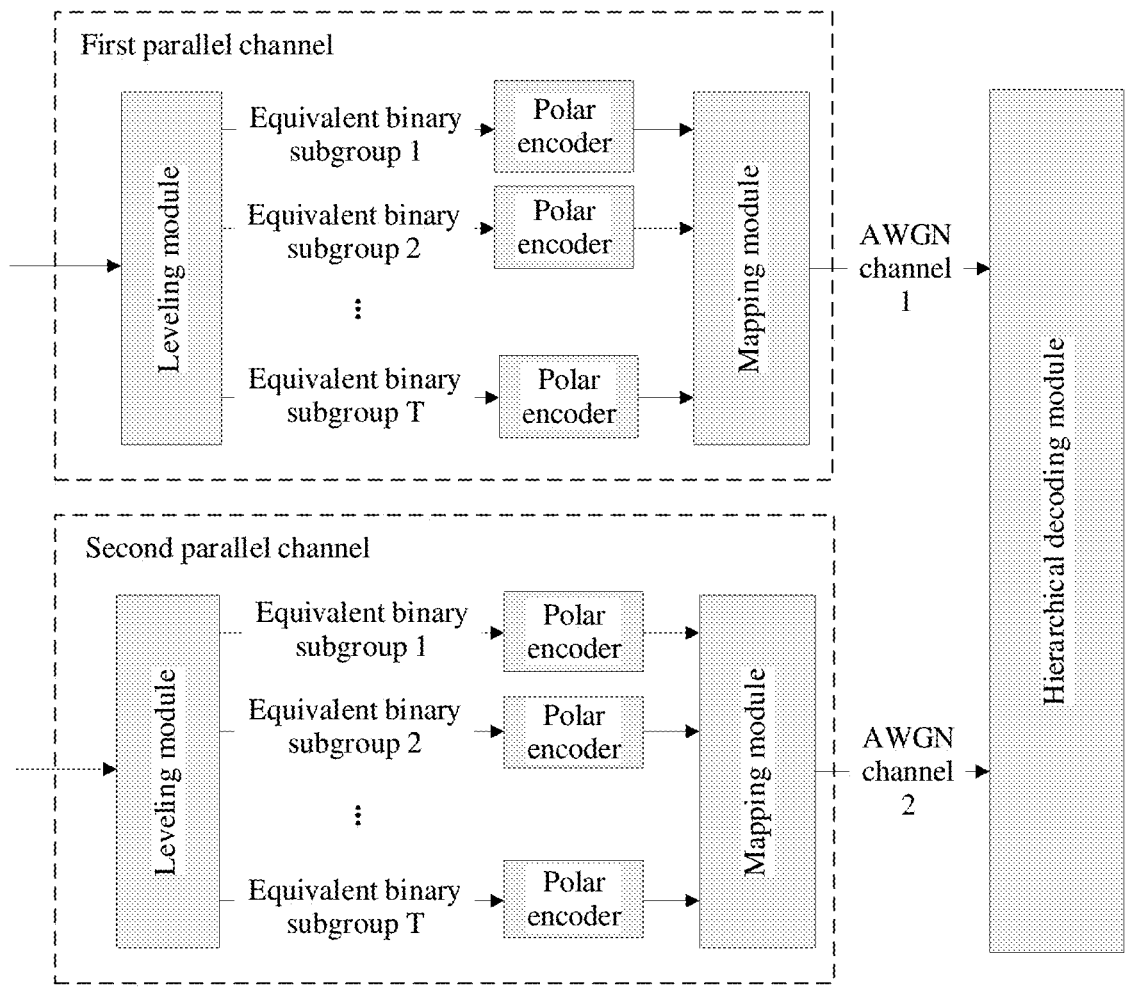
FIG. 5B is a schematic diagram of a two-parallel channel transmission scenario in which high-order signals are input according to an embodiment of this application.

Referring to FIG. 5B, FIG. 5B is a schematic diagram of a two-parallel channel transmission scenario in which high-order signals are input according to an embodiment of this application. FIG. 5B includes two parallel channels, and input signals of the two parallel channels are high-order signals. The two parallel channels may be considered as modules in the first communications device shown in FIG. 5A. Based on an MLC idea, each parallel channel is divided into a plurality of equivalent binary subgroups (which may be considered as a plurality of binary input subchannels), and binary information bits are input into each equivalent binary subgroup. For example, if an input signal of the first parallel channel is an high-order signal, after the first parallel channel is divided into T equivalent binary subgroups, each equivalent binary subgroup transmits binary information bits. The plurality of equivalent binary subgroups may be reassembled, by using the mapping module, into a high-order signal for transmission on an AWGN channel, so as to implement a parallel transmission scenario in which an input signal is a high-order signal. The reassembled high-order signal is sent to a hierarchical decoding module, and the hierarchical decoding module may be considered as a module in the second communications device shown in FIG. 5A. It should be noted that the two-parallel channel transmission scenario shown in FIG. 5B is merely an example, and may further include a transmission scenario of one or more parallel channels. This is not limited in this embodiment.

The following provides descriptions with reference to specific embodiments.

Figure 6:
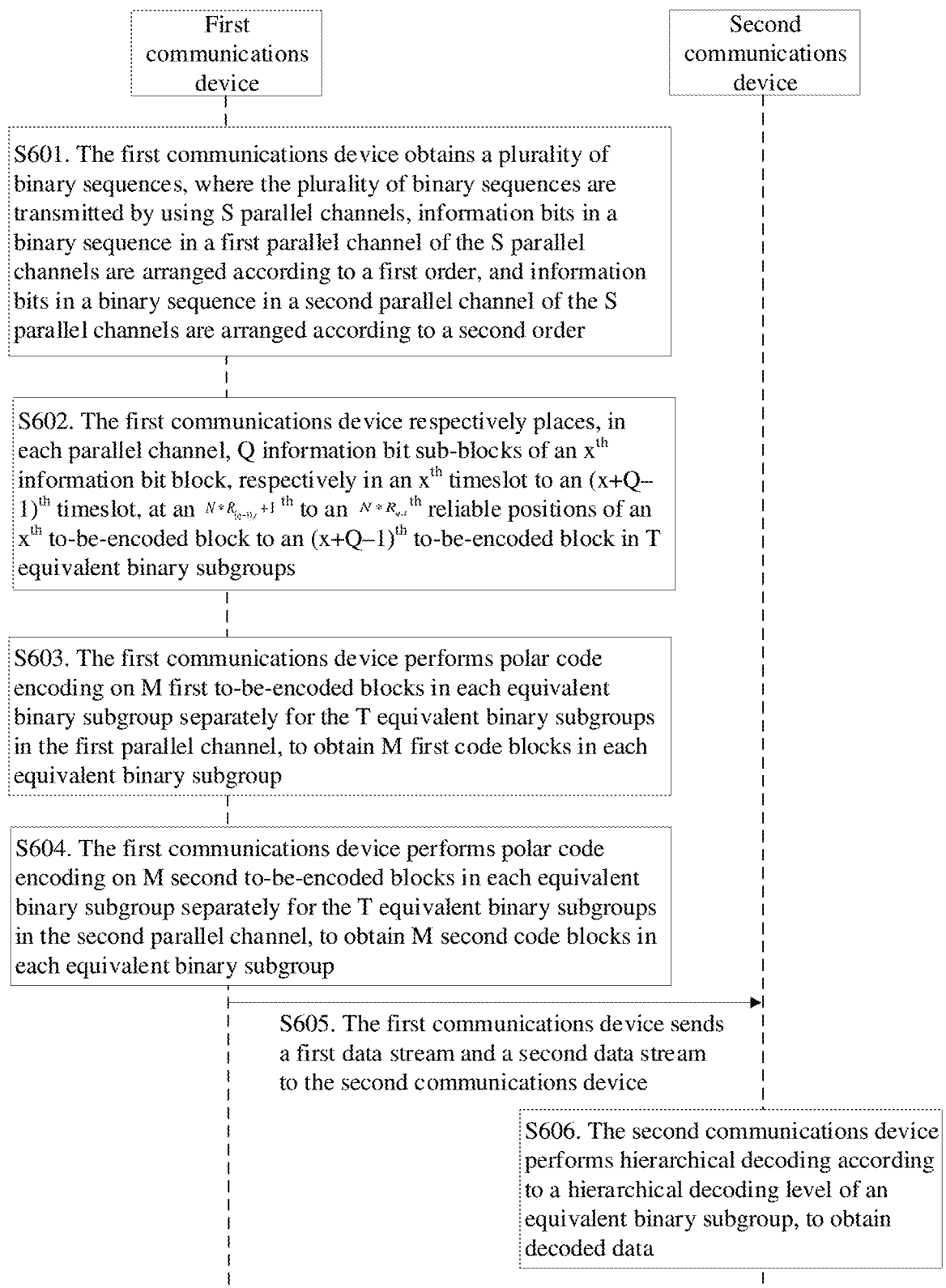
FIG. 6 is a schematic flowchart of a data processing method according to an embodiment of this application.

An embodiment of this application provides a data processing method. Refer to FIG. 6. The data processing method may be performed by a first communications device and a second communications device through interaction, and includes the following steps:

S601. The first communications device obtains a plurality of binary sequences, where the plurality of binary sequences are transmitted by using S parallel channels, information bits in a binary sequence in a first parallel channel of the S parallel channels are arranged according to a first order, and information bits in a binary sequence in a second parallel channel of the S parallel channels are arranged according to a second order.

S602. The first communications device respectively places, in each parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups.

S603. The first communications device performs polar code encoding on M first to-be-encoded blocks in each equivalent binary subgroup separately for the T equivalent binary subgroups in the first parallel channel, to obtain M first code blocks in each equivalent binary subgroup.

S604. The first communications device performs polar code encoding on M second to-be-encoded blocks in each equivalent binary subgroup separately for the T equivalent binary subgroups in the second parallel channel, to obtain M second code blocks in each equivalent binary subgroup.

S605. The first communications device sends a first data stream and a second data stream to the second communications device. Correspondingly, the second communications device receives the first data stream and the second data stream that are sent by the first communications device.

S606. The second communications device performs hierarchical decoding according to a hierarchical decoding level of an equivalent binary subgroup, to obtain decoded data.

Because a high-order signal may be divided into a plurality of equivalent binary subgroups, in this embodiment of this application, a corresponding placement manner is designed for a series of binary sequences by using this principle, and the series of binary sequences are divided into a plurality of equivalent binary subgroups. After being encoded by using a polar code, these equivalent binary subgroups may be mapped into a high-order signal and directly transmitted on an AWGN channel. In other words, in this embodiment of this application, a multi-level coding principle is used to perform coding processing on information bits. For ease of description, in this embodiment of this application, it is assumed that a transmitted high-order signal is a $2^T$-order high-order signal, and the $2^T$-order high-order signal may be divided into T equivalent binary subgroups. Correspondingly, one equivalent binary subgroup carries one binary sequence.

To increase a transmission rate, the series of binary sequences may be transmitted through S parallel channels. For example, when S=2, it indicates that the first communications device may transmit the series of binary sequences by using two parallel channels: the first parallel channel and the second parallel channel. One parallel channel includes X information bit blocks, and each information bit block includes K information bits. For example, one parallel channel may include one or more information bit blocks, that is, X is a positive integer greater than or equal to 1. As shown in FIG. 7, each information bit block includes K information bits $u_1, u_2, \ldots, u_K$. One information bit block may be divided into Q information bit sub-blocks $V_1, V_2, \ldots, V_Q$, and each information bit sub-block is a binary sequence with a length of K/Q, as shown in FIG. 7.

It should be noted that if K/Q is not an integer, in this embodiment, a maximum of (Q−1) padding bits may be padded when K/Q is determined, to ensure that K/Q is an integer. For example, if K=100 and Q=3, K/Q is not an integer. After two padding bits are added, K/Q=34, that is, $v_1$ and $v_2$ each include 34 information bits, and $v_3$ includes 32 information bits (the other two are padding bits). Subsequently, when performing encoding processing on the information bit sub-blocks, a polar code encoder in the first communications device processes only information bits in each information bit sub-block, and does not process the padding bits. Optionally, if a value of K/Q is not an integer or is not a power of 2, rate matching further needs to be performed. It should be noted that the solution in this application is not closely related to which rate matching solution is actually used. Therefore, a general rate matching solution is used.

Referring to FIG. 8A, FIG. 8A is a schematic diagram of splitting a parallel channel into two equivalent binary subgroups according to an embodiment of this application. It is assumed that the parallel channel includes six information bit blocks, that is, X=6. Each information bit block includes nine information bits $u_1, u_2, \ldots, u_9$, that is, K=9. One information bit block is divided into three information bit sub-blocks $v_1, v_2, v_3$ that is, Q=3. Each information bit sub-block is a binary sequence with a length of 3. It is assumed that $v_1=[u_1, u_2, u_3] v_2=[u_4, u_5, u_6])$, and $v_3=[u_7, u_8, u_9]$, as shown in FIG. 8A.

The parallel channel may be divided into two equivalent binary subgroups. Correspondingly, the information bit sub-blocks included in the parallel channel also need to be divided, that is, each information bit sub-block is divided into two parts. For example, for three information bit sub-blocks $v_1, v_2, v_3$ of an information bit block, the three information bit sub-blocks are divided into two parts, and are respectively placed in two equivalent binary subgroups. The sub-block $v_1$ is divided into two parts $a_1, e_1$, that is, $v_1=a_1+e_1$; the sub-block $v_2$ is divided into two parts $a_2, e_2$, that is, $v_2=a_2+e_2$; and the sub-block $v_3$ is divided into two parts $a_3, e_3$, that is, $v_3=a_3+e_3$, as shown in FIG. 8A. It should be noted that sizes of the T parts of bits obtained by dividing each information bit sub-block may be the same or may be different. For example, $v_1$ is divided into two parts $a_1, e_1$, and bit sizes of $a_1$ and $e_1$ may be the same or may be different (for example, $a_1=[u_1, u_2]$, $e_1=[u_3]$). This is not limited in this embodiment.

For different parallel channels, placement manners of binary sequences in the parallel channels are different. That is, information bits in the binary sequences in the parallel channels are arranged in different orders. In the first parallel channel of the S parallel channels, K information bits in each information bit block are arranged according to a first order; and in the second parallel channel of the S parallel channels, K information bits in each information bit block are arranged according to a second order. The second order is different from the first order, and the second order and the first order meet a mapping relationship.

For example, it is assumed that each parallel channel of the S parallel channels includes six information bit blocks, and each information bit block includes nine information bits $u_1, u_2, \ldots, u_9$. It should be noted that, for ease of description, in this embodiment, an example in which one information bit block includes nine information bits is used for description, where $u_1, u_2, \ldots, u_K$ may be a string of binary symbols (for example, 111111111 or 000000000). This is not limited in this embodiment. Optionally, in this embodiment, each information bit block is described as $u_1, u_2, \ldots, u_9$, only to indicate a plurality of information bit blocks. Actually, information bits in different information bit blocks may be the same, or may be different. For example, in a parallel channel, one information bit block is $u_1, u_2, \ldots, u_9$, and another information bit block is $u_{10}, u_{11}, \ldots, u_{18}$, to indicate that information bits in the two information bit blocks are different. This is not limited in this embodiment.

In the first parallel channel of the S parallel channels, information bits in each information bit block are arranged in a first order, and the first order is an information bit transmission order, that is, an order of $u_1, u_2, \ldots, u_9$. In the second parallel channel of the S parallel channels, information bits in each information bit block are arranged in a second order. In an implementation, the second order is a reversed order of the first order, in other words, arranged according to an order of $u_9, u_8, \ldots, u_1$. In another implementation, the second order and the first order meet the following mapping relationship:

$$U=[u_1, u_2, \ldots, u_K]$$

$$\overline{U}=[0, 0, \ldots, 0, u_1, u_2, \ldots, u_K]$$

$$\tilde{U}=[\tilde{u}_1, \tilde{u}_2, \ldots, \tilde{u}_{2^P}]$$

$$\tilde{U}=\overline{U}F^{\otimes P}$$

U represents any information bit block, $u_k$ represents any information bit in U, $\tilde{u}_k$ in some information bits $[\tilde{u}_1, \tilde{u}_2, \ldots, \tilde{u}_K]$ in $\tilde{U}$ is a corresponding information bit after $u_k$ is mapped, F is a generator matrix of a polar code, a length of $\overline{U}$ is $H=2^P$, H is greater than or equal to K, and k meets $1 \leq k \leq K$. It should be noted that, mapping is performed by using the generator matrix of the polar code herein by using a feature that the generator matrix of the polar code is a special universal decoding matrix (UDM), and does not mean polar code encoding herein.

For example, because H=2P, and H is greater than or equal to K, when K=9, a value of H may be H=16=24, that is, P=4. In this case, in the second parallel channel, information bits in each information bit block are arranged in the second order shown in $ũ_1, ũ_2, \ldots, ũ_9$. It should be noted that some information bits after mapping are arranged in the second order and transmitted in the second parallel channel, and the remaining information bits (for example, $ũ_{10}, ũ_{11}, \ldots, ũ_{16}$) are used only as derivation of the mapping process, and are not transmitted in the second parallel channel.

Figure 8B:
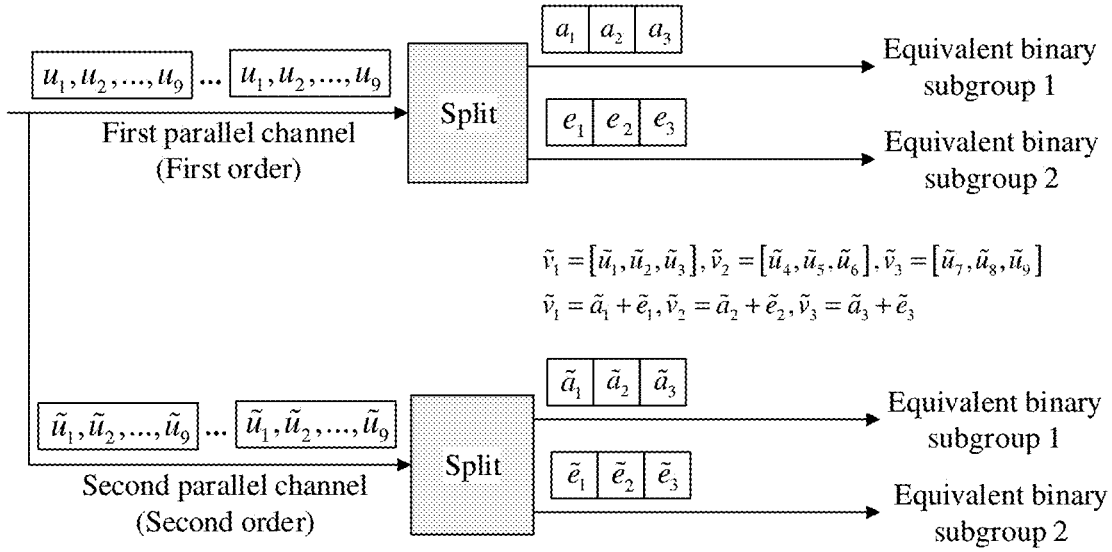
FIG. 8B is a schematic diagram of a parallel transmission scenario of two parallel channels according to an embodiment of this application.

Referring to FIG. 8B, FIG. 8B is a parallel transmission scenario of two parallel channels according to an embodiment of this application. It is assumed that each parallel channel is divided into two equivalent binary subgroups. In the first parallel channel of the S parallel channels, it is assumed that each information bit block is divided into three information bit sub-blocks $v_1, v_2, v_3$, and each information bit sub-block is a binary sequence with a length of 3, where, $v_1=[u_1, u_2, u_3]$, $v_2=[u_4, u_5, u_6]$, and $v_3=[u_7, u_8, u_9]$. The three information bit sub-blocks are separately divided into two parts, and are respectively placed in two equivalent binary subgroups obtained after the first parallel channel is split. The sub-block $v_1$ is divided into two parts $a_1, e_1$, that is, $v_1=a_1, +e_1$; the sub-block $v_2$ is divided into two parts $a_2, e_2$, that is, $v_2=a_2+e_2$; and the sub-block $v_3$ is divided into two parts $a_3, e_3$, that is, $v_3=a_3+e_3$, as shown in FIG. 8B. For ease of description, in this embodiment of this application, a part of an information bit sub-block obtained after further splitting is referred to as an information bit sub-part. In other words, $a_1$ is referred to as an information bit sub-part.

Similarly, in the second parallel channel of the S parallel channels, assuming that the second order used for the second parallel channel is a reversed order, each information bit block is divided into three information bit sub-blocks $v'_3, v'_2, v'_1$, and each information bit sub-block is a binary sequence with a length of 3, where, $v'_3=[u_9, u_8, u_7]$, $v'_2=[u_6, u_5, u_4]$ and $v'_1=[u_3, u_2, u_1]$. The three information bit sub-blocks are separately divided into two parts, and are respectively placed in two equivalent binary subgroups obtained after the second parallel channel is split. The sub-block $v'_3$ is divided into two parts $a'_3, e'_3$, that is, $v'_3=a'_3+e'_3$; the sub-block $v'_2$ is divided into two parts $a'_2, e'_2$, that is, $v'_2=a'_2+e'_2$; and the sub-block $v'_2$ is divided into two parts $a'_1, e'_1$, that is, $v'_1=a'_1+e'_1$, as shown in FIG. 8B.

Figure 8C:
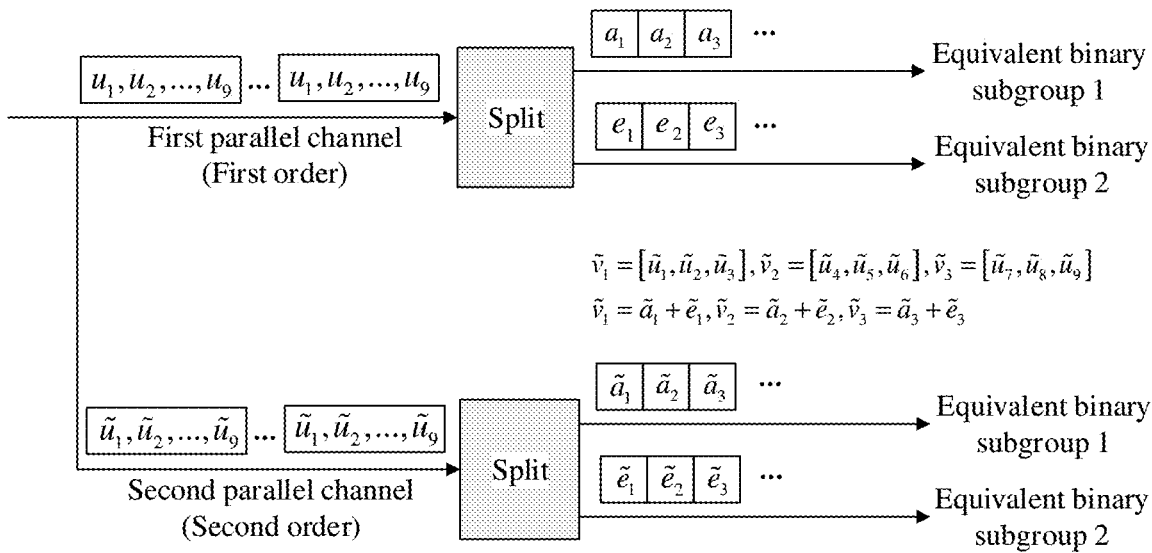
FIG. 8C is a schematic diagram of another parallel transmission scenario of two parallel channels according to an embodiment of this application.

Optionally, in the second parallel channel, assuming that the second order used by the second parallel channel meets a mapping relationship with the first order, each information bit block is divided into three information bit sub-blocks $ṽ_1, ṽ_2, ṽ_3$, and each information bit sub-block is a binary sequence with a length of 3, where, $Ṽ_1=[ũ_1, ũ_2, ũ_3]$, $ṽ_2=[ũ_4, ũ_5, ũ_6]$ and $ṽ_3=[ũ_7, ũ_8, ũ_9]$. The three information bit sub-blocks are separately divided into two parts, and are respectively placed in two equivalent binary subgroups obtained after the second parallel channel is split. The sub-block $ṽ_1$ is divided into two parts $ã_1, ẽ_1$ that is, $ṽ_1+ã_1, ẽ_1$; the sub-block $ṽ_2$ is divided into two parts $ã_2, ẽ_2$, that is, $ṽ_2=ã_2+ẽ_2$; and the sub-block $ṽ_3$ is divided into two parts $ã_3, ẽ_3$ that is, $ṽ_3=ã_3+ẽ_3$, as shown in FIG. 8C.

It should be noted that when the information bit sub-block in this embodiment of this application is divided into a plurality of information bit sub-parts, the division is determined based on a quantity of equivalent binary subgroups in the located parallel channel. That is, if a parallel channel in which an information bit sub-block is located includes T equivalent binary subgroups, the information bit sub-block is divided into T information bit sub-parts. A size of each information bit sub-part is not limited in this embodiment. That is, sizes of T information bit sub-parts of one information bit sub-block may be consistent (that is, each information bit sub-part includes a same quantity of information bits), or may be inconsistent (that is, each information bit sub-part includes a different quantity of information bits). This is not limited in this embodiment.

It should be noted that, regardless of which second order is used, sizes of information bit sub-blocks placed in the first parallel channel and the second parallel channel further meet a specific relationship. For example, in FIG. 8B, for an information bit sub-block $v_1=a_1+e_1$ in the first parallel channel and an information bit sub-block $v'_1=a'_1+e'_1$ in a second parallel channel, sizes of the two information bit sub-blocks meet the following relationship: $a_1+e_1=a'_1+e'_1$. For another example, for an information bit sub-block $v_2=a_2+e_2$ in the first parallel channel and an information bit sub-block $v'_2=a'_2+e'_2$ in the second parallel channel, sizes of the two information bit sub-blocks meet the following relationship: $a_2+e_2=a'_2+e'_2$; and for an information bit sub-block $v_3=a_3+e_3$ in the first parallel channel and an information bit sub-block $v'_3=a'_3+e'_3$ in the second parallel channel, sizes of the two information bit sub-blocks meet the following relationship: $a_3+e_3=a'_3+e'_3$. Similarly, other information bit sub-blocks at corresponding positions in the two parallel channels also meet a specific relationship, and may be obtained by analogy according to the foregoing two examples. Details are not described herein again.

After obtaining the plurality of binary sequences, the first communications device may place the information bit blocks in the plurality of to-be-encoded blocks. The to-be-encoded blocks are used to carry the to-be-encoded binary sequences. A plurality of to-be-encoded blocks are converted into a plurality of code blocks after polar code encoding is performed, and information bits in the plurality of code blocks may be mapped to $2^T$-order high-order signals. In this embodiment of this application, the to-be-encoded blocks include a first to-be-encoded block, a second to-be-encoded block, until an $S^{th}$ to-be-encoded block. The first to-be-encoded block represents a to-be-encoded block used by the first parallel channel, the second to-be-encoded block represents a to-be-encoded block used by the second parallel channel, and so on. The $S^{th}$ to-be-encoded block represents a to-encoded block used by an $S^{th}$ parallel channel. Any to-be-encoded block carries at least one information bit sub-block, and carries at most Q information bit sub-blocks.

In an implementation, each to-be-encoded block is sequentially arranged based on an identifier of a code block. The first code block corresponding to each of the T equivalent binary subgroups carries one information bit sub-block. Quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks. Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block.

Figure 9A:
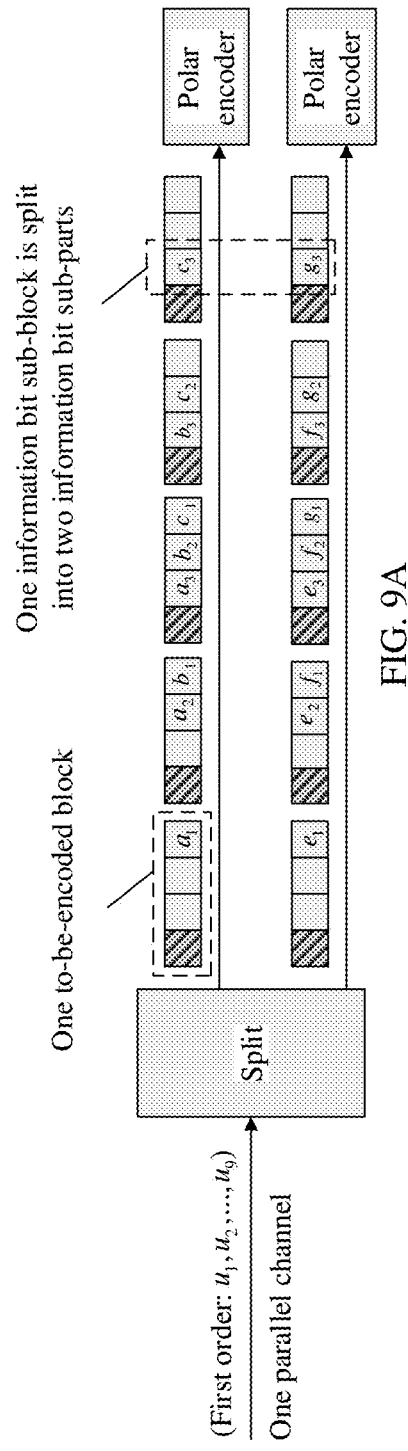
FIG. 9A is a schematic diagram of a to-be-encoded block in a parallel channel according to an embodiment of this application.

Referring to FIG. 9A, FIG. 9A is a schematic diagram of a to-be-encoded block in a parallel channel according to an embodiment of this application. If a code rate loss is not considered, a manner of arranging information bit sub-parts in the to-be-encoded block is shown in FIG. 9A. For example, FIG. 9A includes three information bit blocks, that is, X=3; includes five to-be-encoded blocks, that is, M=5; and a quantization order of a code rate is 3, that is, Q=3. In two equivalent binary subgroups of the parallel channel, two information bit sub-parts split from one information bit sub-block are respectively placed in to-be-encoded blocks of the two equivalent binary subgroups. As shown in $c_3$, $g_3$ in FIG. 9A, $c_3$, $g_3$ are two information bit sub-parts split from one information bit sub-block.

For example, in FIG. 9A, a first to-be-encoded block corresponding to each of the two equivalent binary subgroups respectively carries one information bit sub-part, that is, the first to-be-encoded block in the first equivalent binary subgroup carries one information bit sub-part $a_1$, and the first to-be-encoded block in the second equivalent binary subgroup carries one information bit sub-part $e_1$. A second to-be-encoded block corresponding to each of the two equivalent binary subgroups respectively carries two information bit sub-parts, that is, the second to-be-encoded block in the first equivalent binary subgroup carries two information bit sub-parts $a_2$, $b_1$, and the second to-be-encoded block in the second equivalent binary subgroup carries two information bit sub-parts $e_2$, $f_1$. The third to-be-encoded block corresponding to each of the two equivalent binary subgroups respectively carries three information bit sub-parts, that is, the third to-be-encoded block in the first equivalent binary subgroup carries three information bit sub-parts $a_3$, $b_2$, $c_1$, and the third to-be-encoded block in the second equivalent binary subgroup carries three information bit sub-parts $e_3$, $f_2$, $g_1$. The fourth to-be-encoded block corresponding to each of the two equivalent binary subgroups respectively carries two information bit sub-parts, that is, the fourth to-be-encoded block in the first equivalent binary subgroup carries two information bit sub-parts $b_3$, $c_2$, and the fourth to-be-encoded block in the second equivalent binary subgroup carries two information bit sub-parts $f_3$, $g_2$. The fifth to-be-encoded block corresponding to each of the two equivalent binary subgroups respectively carries one information bit sub-part, that is, the fifth to-be-encoded block in the first equivalent binary subgroup carries one information bit sub-part $c_3$, and the fifth to-be-encoded block in the second equivalent binary subgroup carries one information bit sub-part $g_3$.

In another implementation, to reduce a bit rate loss, the first communications device performs special processing on a series of binary sequences. The first code block corresponding to each of the T equivalent binary subgroups carries one information bit sub-block. Quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks. Quantities of information bit sub-blocks carried by the $(Q+1)^{th}$ to the $M^{th}$ code blocks respectively corresponding to each of the T equivalent binary subgroups remain unchanged, and each carries Q information bit sub-blocks.

Figure 9B:
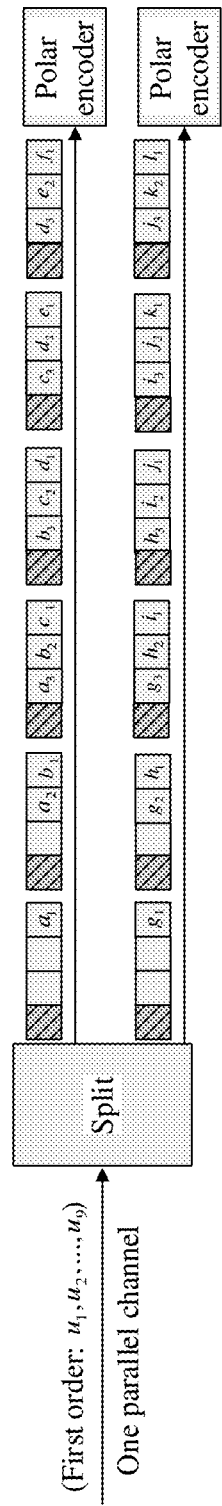
FIG. 9B is a schematic diagram of a to-be-encoded block in another parallel channel according to an embodiment of this application.

Referring to FIG. 9B, FIG. 9B is a schematic diagram of a to-be-encoded block in another parallel channel according to an embodiment of this application. To reduce a loss of a code rate, a manner of arranging information bit sub-parts in the to-be-encoded block is shown in FIG. 9B. For example, FIG. 9B includes six information bit blocks and six to-be-encoded blocks, and a quantization order of a code rate is 3.

In FIG. 9B, a first to-be-encoded block corresponding to each of the two equivalent binary subgroups respectively carries one information bit sub-part, that is, the first to-be-encoded block in the first equivalent binary subgroup carries one information bit sub-part $a_1$ and the first to-be-encoded block in the second equivalent binary subgroup carries one information bit sub-part $g_1$. A second to-be-encoded block corresponding to each of the two equivalent binary subgroups respectively carries two information bit sub-parts, that is, the second to-be-encoded block in the first equivalent binary subgroup carries two information bit sub-parts $a_2$, $b_1$ and the second to-be-encoded block in the second equivalent binary subgroup carries two information bit sub-parts $g_2$, $h_1$. The third to-be-encoded block corresponding to each of the two equivalent binary subgroups respectively carries three information bit sub-parts, that is, the third to-be-encoded block in the first equivalent binary subgroup carries three information bit sub-parts $a_3$, $b_2$, $c_1$, and the third to-be-encoded block in the second equivalent binary subgroup carries three information bit sub-parts $g_3$, $h_2$, $i_1$. The fourth to-be-encoded block corresponding to each of the two equivalent binary subgroups respectively carries three information bit sub-parts, that is, the fourth to-be-encoded block in the first equivalent binary subgroup carries three information bit sub-parts $b_3$, $c_2$, $d_1$, and the fourth to-be-encoded block in the second equivalent binary subgroup carries three information bit sub-parts $h_3$, $i_2$, $j_1$. The fifth to-be-encoded block corresponding to each of the two equivalent binary subgroups respectively carries three information bit sub-parts, that is, the fifth to-be-encoded block in the first equivalent binary subgroup carries three information bit sub-parts $c_3$, $d_2$, $e_1$, and the fifth to-be-encoded block in the second equivalent binary subgroup carries three information bit sub-parts $i_3$, $j_2$, $k_1$. The sixth to-be-encoded block corresponding to each of the two equivalent binary subgroups respectively carries three information bit sub-parts, that is, the sixth to-be-encoded block in the first equivalent binary subgroup carries three information bit sub-parts $d_3$, $e_2$, $f_1$ and the sixth to-be-encoded block in the second equivalent binary subgroup carries three information bit sub-parts $j_3$, $k_2$, $l_1$.

It should be noted that, the to-be-encoded blocks shown in FIG. 9A and FIG. 9B are examples when a quantization order Q of a code rate is 3. Optionally, the quantization order Q of the code rate may be another positive integer. In this case, to-be-encoded blocks corresponding to another Q value are similar to the to-be-encoded blocks when Q=3, and may be deduced based on FIG. 9A and FIG. 9B. Details are not described herein again.

Any to-be-encoded block further includes one or more fixed bits, as shown in a shadow area of the to-be-encoded block in FIG. 9A. A value of a fixed bit is usually set to 0, and is known to both a transmit end and a receive end during actual transmission.

It should be noted that the foregoing description of the to-be-encoded blocks is merely an example, and the quantity of to-be-encoded blocks may alternatively be another value. For example, when the to-be-encoded block shown in FIG. 9B is used, theoretically, a quantity of to-be-encoded blocks may approach infinite, that is, M approaches infinite. This is not limited in this embodiment.

The following describes in detail an arrangement manner of Q information bit sub-blocks of any information bit block.

In one parallel channel, Q information bit sub-blocks of an $x^{th}$ information bit block are placed, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups. Q meets $1 \leq q \leq Q$ and $R_{1,t}, R_{2,t}, \ldots, R_{Q,t}$ is a code rate of the first Q to-be-encoded blocks in a $t^{th}$ equivalent binary subgroup, N is a code length, x meets $1 \leq x \leq X$, t meets $1 \leq t \leq T$, and T is greater than or equal to 2. A sum of bit sizes of T equivalent binary subgroups in an $s^{th}$ parallel channel occupied by a $q^{th}$ information bit sub-block of the $x^{th}$ information bit block is K/Q, and s meets $1 \leq s \leq S$.

The N is a code length, and a specific value of N is not limited in this embodiment. For a parallel channel, in this embodiment, it is assumed that a size of an information bit sub-part of an information bit sub-block in a T equivalent binary subgroup is related to a code length N and $R_{q,t}$. For example, for the parallel channel shown in FIG. 9A, it is assumed that a size of $a_1$ is $N*R_{1,1}$ and a size of $e_1$ is $N*R_{1,2}$. Similarly, sizes of other information bit sub-parts are also deduced according to the foregoing relational expression.

The following analyzes the bit rate. Q meets $1 \leq q \leq Q$ and $R_{1,t}, R_{2,t}, \ldots, R_{Q,t}$ is a bit rate of the first Q to-be-encoded blocks in a $t^{th}$ equivalent binary subgroup. That is, because quantities of information bit sub-parts included in different to-be-encoded blocks in different equivalent binary subgroups are different, bit rates may be different. For example, in FIG. 9A, if the parallel channel is not split, when three information bit blocks are transmitted, the parallel channel also includes five to-be-encoded blocks. It is assumed that a bit rate of the first to-be-encoded block is R/3, a bit rate of the second to-be-encoded block is 2R/3, a bit rate of the third to-be-encoded block is 3R/3, a bit rate of the fourth to-be-encoded block is 2R/3, and a bit rate of the fifth to-be-encoded block is R/3.

After the parallel channel is split, the first equivalent binary subgroup includes five to-be-encoded blocks, the five to-be-encoded blocks are five polar code blocks after being encoded. The second equivalent binary subgroup also includes five to-be-encoded blocks, and the five to-be-encoded blocks are five polar code blocks after being encoded. A sum of code rates of to-be-encoded blocks in two equivalent binary subgroups in a same timeslot is equal to a code rate of the to-be-encoded blocks when splitting is not performed. In other words, the bit rate of the first to-be-encoded block in the first equivalent binary subgroup is $R_{1,1}$, the bit rate of the first to-be-encoded block in the second equivalent binary subgroup is $R_{1,2}$, and $R_{1,1}$ and $R_{1,2}$ satisfy $R_{1,1}+R_{1,2}=R/3$. The bit rate of the second to-be-encoded block in the first equivalent binary subgroup is $R_{2,1}$, the bit rate of the second to-be-encoded block in the second equivalent binary subgroup is $R_{2,2}$, and $R_{2,1}$ and $R_{2,2}$ satisfy $R_{2,1}+R_{2,2}=2R/3$. The bit rate of the third to-be-encoded block in the first equivalent binary subgroup is $R_{3,1}$, the bit rate of the third to-be-encoded block in the second equivalent binary subgroup is $R_{3,2}$, and $R_{3,1}$ and $R_{3,2}$ satisfy $R_{3,1}+R_{3,2}=3R/3$. Similarly, a sum of a bit rate of to-be-encoded blocks in the first equivalent binary subgroup and the second equivalent binary subgroup and a bit rate of to-be-encoded blocks corresponding to a same timeslot also meets the foregoing relationship. Details are not described herein again.

In a parallel channel, the first communications device places a first information bit sub-block in the Q information bit sub-blocks of the $x^{th}$ information bit block, in the $x^{th}$ timeslot, at a first to an $N*R_{1,t}^{th}$ reliable positions of an $x^{th}$ first to-be-encoded block in T equivalent binary subgroups, where a value of $R_{0,t}$ is 0. In an $(x+1)^{th}$ timeslot, a second information bit sub-block in the Q information bit sub-blocks of the $x^{th}$ information bit block is placed at an $N*R_{1,t}+1^{th}$ to an $N*R_{2,t}^{th}$ reliable positions of $(x+1)$ first to-be-encoded blocks in the T equivalent binary subgroups. A $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ first to-be-encoded block in the T equivalent binary subgroups.

Figure 10A:
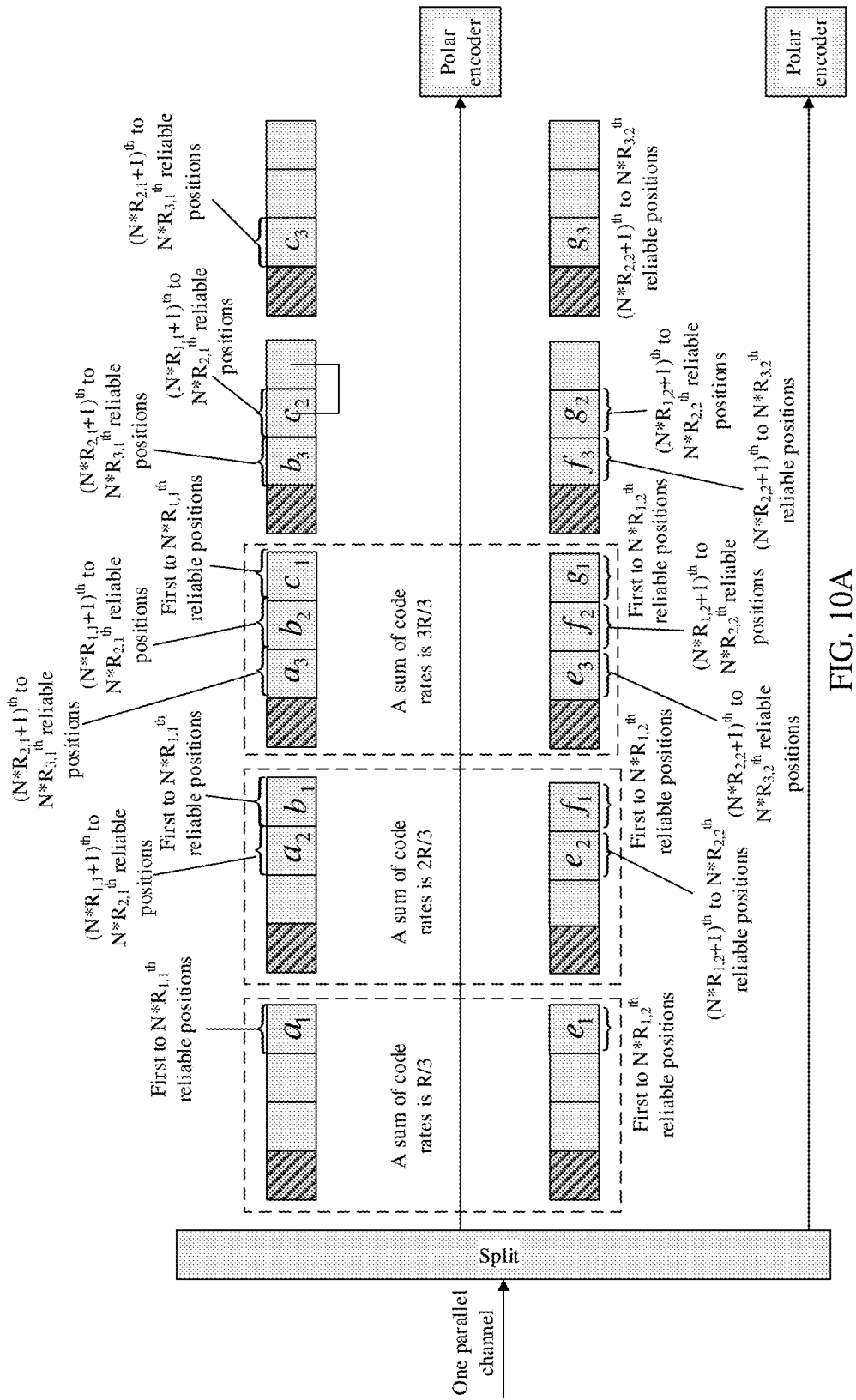
FIG. 10A is a schematic diagram of arrangement positions of information bit sub-blocks in an equivalent binary subgroup according to an embodiment of this application.

For example, referring to FIG. 10A, FIG. 10A is a schematic diagram of arrangement positions of information bit sub-blocks in an equivalent binary subgroup according to an embodiment of this application. In FIG. 10A, it is assumed that a parallel channel is a first parallel channel in S parallel channels, and to-be-transmitted data includes three information bit blocks. The first parallel channel is split into two equivalent binary subgroups, each equivalent binary subgroup carries five to-be-encoded blocks, and a quantization order of a code rate is 3.

A first information bit block includes nine information bits $u_1, u_2, \ldots, u_9$. The information bit block is divided into three information bit sub-blocks $v_1, v_2, v_3$, and each information bit sub-block is a binary sequence with a length of 3, where, $v_1=[u_1, u_2, u_3]$, $v_2=[u_4, u_5, u_6]$ and $v_3=[u_7, u_8, u_9]$.

For the first information bit sub-block $v_1$ of the first information bit block, $v_1$ is split into two information bit sub-parts $a_1, e_1$, where $a_1$ is placed, in a first timeslot, at a first to an $N*R_{1,1}^{th}$ reliable positions of a first to-be-encoded block in a first equivalent binary subgroup; and $e_1$ is placed, in a first timeslot, at a first to an $N*R_{1,2}^{th}$ reliable positions of a first to-be-encoded block in a second equivalent binary subgroup, as shown in FIG. 10A. A sum of a bit rate of the first to-be-encoded block in the first equivalent binary subgroup and a bit rate of the first to-be-encoded block in the second equivalent binary subgroup is R/3.

For the second information bit sub-block $v_2$, $v_2$ is split into two information bit sub-parts $a_2, e_2$, where $a_2$ is placed, in a second timeslot, at an $(N*R_{1,1}+1)^{th}$ to an $N*R_{2,1}^{th}$ reliable positions of a second to-be-encoded block in the first equivalent binary subgroup; and $e_2$ is placed, in a second timeslot, at an $(N*R_{1,2}+1)^{th}$ to an $N*R_{2,2}^{th}$ reliable positions of a second to-be-encoded block in the second equivalent binary subgroup, as shown in FIG. 10A. A sum of a code rate of the second to-be-encoded block in the first equivalent binary subgroup and a code rate of the second to-be-encoded block in the second equivalent binary subgroup is 2R/3.

For the third information bit sub-block $v_3$, $v_3$ is split into two information bit sub-parts $a_3, e_3$, where $a_3$ is placed, in a third timeslot, at an $(N*R_{2,1}+1)^{th}$ to an $N*R_{3,1}^{th}$ reliable positions of a third to-be-encoded block in the first equivalent binary subgroup; and $e_3$ is placed, in a third timeslot, at an $(N*R_{2,2}+1)^{th}$ to an $N*R_{3,2}^{th}$ reliable positions of a third to-be-encoded block in the second equivalent binary subgroup, as shown in FIG. 10A. A sum of a bit rate of the third to-be-encoded block in the first equivalent binary subgroup and a bit rate of the third to-be-encoded block in the second equivalent binary subgroup is 3R/3.

The foregoing is a processing process of one information bit block. Similarly, for a processing process of another information bit block, refer to the foregoing process. For example, the second information bit block includes nine information bits $u_1, u_2, \ldots, u_9$. The information bit block is divided into three information bit sub-blocks $w_1, w_2, w_3$, and each information bit sub-block is a binary sequence with a length of 3, where, $w_1=[u_1, u_2, u_3]$, $w_2=[u_4, u_5, u_6]$ and $w_3=[u_7, u_8, u_9]$. For the first information bit sub-block $w_1$ of the second information bit block, $w_1$ is split into two information bit sub-parts $b_1, f_1$ where $b_1$ is placed, in a second timeslot, at a first to an $N*R_{1,1}{}^{th}$ reliable positions of a second to-be-encoded block in a first equivalent binary subgroup; and $f_1$ is placed, in a second timeslot, at a first to an $N*R_{1,2}{}^{th}$ reliable positions of a second to-be-encoded block in a second equivalent binary subgroup. By analogy, positions of the information bit sub-parts $b_2$, $b_3$, $c_1$, $c_2$, $c_3$, $f_2$, $f_3$, $g_1$, $g_2$, $g_3$ shown in FIG. 10A may be obtained by using the foregoing rule, as shown in FIG. 10A. Details are not described herein again.

Figure 10B:
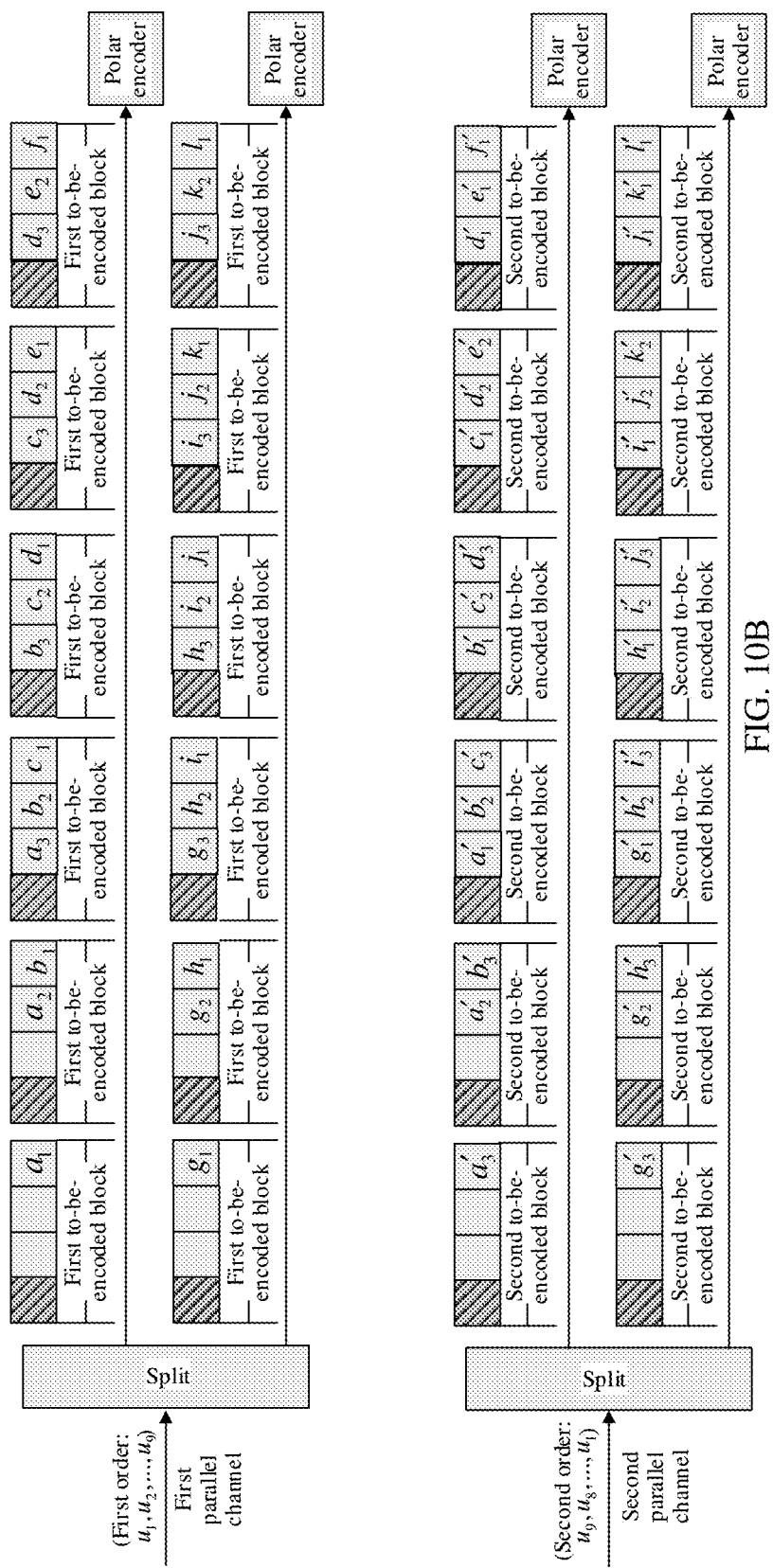
FIG. 10B is a schematic diagram of arrangement positions of information bit sub-blocks in equivalent binary subgroups in two parallel channels according to an embodiment of this application.
Figure 10C:
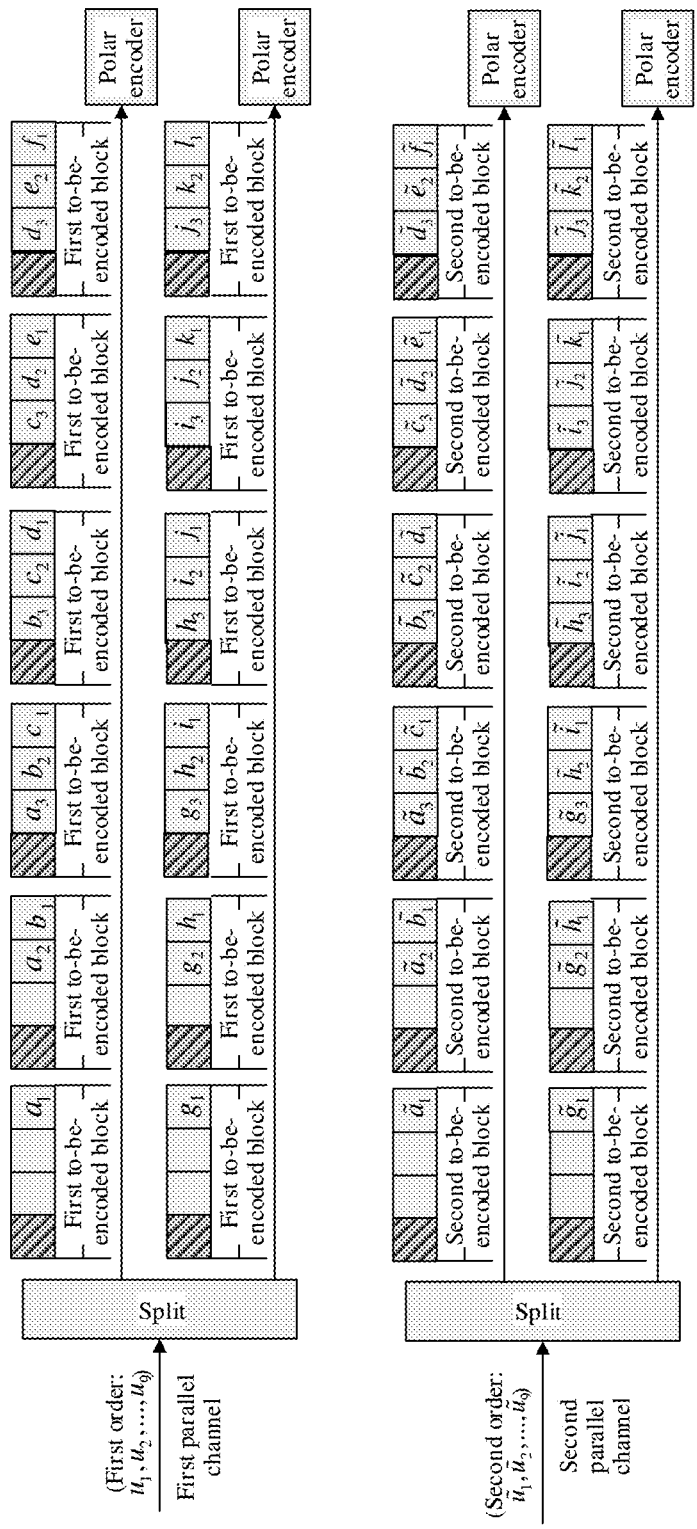
FIG. 10C is a schematic diagram of another arrangement positions of information bit sub-blocks in an equivalent binary subgroup in two parallel channels according to an embodiment of this application.

In a transmission scenario of two parallel channels, an information bit sub-block in each parallel channel is also placed in a to-be-encoded block according to the foregoing rule. Referring to FIG. 10B, FIG. 10B is a schematic diagram of arrangement positions of information bit sub-blocks in equivalent binary subgroups in two parallel channels according to an embodiment of this application. A first parallel channel includes six information bit blocks, and information bits in each information bit block are arranged in a first order. The second parallel channel includes six information bit blocks, and information bits in each information bit block are arranged in a second order. It is assumed that the second order herein is a reversed order of the first order, as shown in FIG. 10B.

In the first parallel channel, a first information bit sub-block in Q information bit sub-blocks of an $x^{th}$ information bit block is placed, in an $x^{th}$ timeslot, at a first to an $N*R_{1,t}{}^{th}$ reliable positions of an $x^{th}$ first to-be-encoded block in T equivalent binary subgroups; and in an $(x+1)^{th}$ timeslot, a second information bit sub-block in the Q information bit sub-blocks of the $x^{th}$ information bit block is placed at an $N*R_{1,t}+1^{th}$ to an $N*R_{2,t}{}^{th}$ reliable positions of $(x+1)$ first to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}{}^{th}$ reliable positions of the $(x+Q-1)^{th}$ first to-be-encoded block in the T equivalent binary subgroups. For example, $a_1$ is placed, in a first timeslot, at a first to an $N*R_{1,1}{}^{th}$ reliable positions of a first first to-be-encoded block in a first equivalent binary subgroup; and $e_1$ is placed, in a first timeslot, at a first to an $N*R_{1,2}{}^{th}$ reliable positions of a first first to-be-encoded block in a second equivalent binary subgroup, as shown in FIG. 10B. Similarly, a position of another information bit sub-block in the first to-be-encoded block may also be obtained according to the foregoing rule, and another information bit sub-block is separately placed in each first to-be-encoded block as shown in FIG. 10B. Details are not described herein again.

In the second parallel channel, a first information bit sub-block in the Q information bit sub-blocks of the $x^{th}$ information bit block is placed, in the $x^{th}$ timeslot, at a first to an $N*R_{1,t}{}^{th}$ reliable positions of an $x^{th}$ second to-be-encoded block in T equivalent binary subgroups; and in an $(x+1)^{th}$ timeslot, a second information bit sub-block in the Q information bit sub-blocks of the $x^{th}$ information bit block is placed at an $N*R_{1,t}+1^{th}$ to an $N*R_{2,t}{}^{th}$ reliable positions of $(x+1)$ second to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, in the $N*R_{(Q-1),t}+1^{th}$ to the $N*R_{Q,t}{}^{th}$ reliable positions of the $(x+Q-1)^{th}$ second to-be-encoded block in the T equivalent binary subgroups. For example, $a'_3$ is placed, in a first timeslot, at a first to an $N*R_{1,1}{}^{th}$ reliable positions of a first second to-be-encoded block in a first equivalent binary subgroup; and $g'_3$ is placed, in a first timeslot, at a first to an $N*R_{1,2}{}^{th}$ reliable positions of a first second to-be-encoded block in a second equivalent binary subgroup, as shown in FIG. 10B. Similarly, a position of another information bit sub-block in the first to-be-encoded block may also be obtained according to the foregoing rule, and another information bit sub-block is separately placed in each first to-be-encoded block as shown in FIG. 10B. Details are not described herein again.

It should be noted that, in the first parallel channel shown in FIG. 10B, information bit sub-parts in a fifth first to-be-encoded block in the two equivalent binary subgroups are $e_1$, $e_2$ and $k_1$, $k_2$, the four information bit sub-parts form two information bit sub-blocks, and the two information bit sub-blocks are two information bit sub-blocks in three information bit sub-blocks obtained by dividing one information bit block. In other words, when the information bit block is transmitted in the first parallel channel, only two information bit sub-blocks are actually transmitted. The two actually transmitted information bit sub-blocks are still placed according to the rule described in the foregoing embodiment. For example, the information bit sub-part $e_1$ is placed, in a fifth timeslot, at a first to an $N*R_{1,1}{}^{th}$ reliable positions of a fifth to-be-encoded block in a first equivalent binary subgroup; and the information bit sub-part $e_2$ is placed, in a sixth timeslot, at an $N*R_{1,1}+1^{th}$ to an $N*R_{2,1}{}^{th}$ reliable positions of a sixth to-be-encoded block in the first equivalent binary subgroup. This is where there is no third information bit sub-part $e_3$ transmitted in the first parallel channel.

Similarly, in the first parallel channel, information bit sub-parts in a sixth first to-be-encoded block in the two equivalent binary subgroups are $f_1$ and $l_1$, the two information bit sub-parts form one information bit sub-block, and the one information bit sub-block is one information bit sub-block in three information bit sub-blocks obtained by dividing one information bit block. In other words, when the information bit block is transmitted in the first parallel channel, only one information bit sub-block is actually transmitted. The information bit sub-part in a fifth second to-be-encoded block and the information bit sub-part in a sixth second to-be-encoded block that are in the second parallel channel also meet the rule described in the first parallel channel. Details are not described herein again.

It should be noted that, in a transmission scenario of two parallel channels shown in FIG. 10B, information bits in an information bit block in a first parallel channel are arranged in a first order, and information bits in an information bit block in a second parallel channel are arranged in a second order, where the second order is a reversed order of the first order. Optionally, the second order and the first order that are used by the second parallel channel may also meet the mapping relationship described in the foregoing embodiment. For example, an information bit sub-part $ã_1$ that satisfies a mapping relationship corresponding to $a_1$ is placed, in a first timeslot, at a first to an $N*R_{1,1}{}^{th}$ reliable positions of a first second to-be-encoded block in a first equivalent binary subgroup; and an information bit sub-part $g̃_1$ that satisfies a mapping relationship corresponding to $g_1$ is placed, in a first timeslot, at a first to an $N*R_{1,2}{}^{th}$ reliable positions of a first second to-be-encoded block in a second equivalent binary subgroup, as shown in FIG. 1C. Similarly, a position of another information bit sub-block in the second to-be-encoded block may also be obtained according to the foregoing rule, and another information bit sub-block is separately placed in each second to-be-encoded block as shown in FIG. 1C. Details are not described herein again.

The first communications device may perform polar code encoding on the to-be-encoded blocks in the first parallel channel and the second parallel channel shown in FIG. 10B and FIG. 1C. For the first parallel channel, two equivalent binary subgroups in the first parallel channel may be mapped into $2^2$-order high-order signals by using a mapping module and transmitted on an AWGN channel. Similarly, for the second parallel channel, two equivalent binary subgroups in the second parallel channel may be mapped to $2^2$-order high-order signals by using the mapping module and transmitted on the AWGN channel, thereby helping improve a throughput of the parallel channels.

The second communications device receives a first data stream (including the high-order signals in the first parallel channel) and a second data stream (including the high-order signals in the second parallel channel) that are sent by the first communications device, and may perform hierarchical decoding on the received first data stream and the received second data stream. The hierarchical decoding described in this embodiment is an interactive procedure: The second communications device starts decoding, according to an MSD order, from a bit at a lowest hierarchical decoding level, and then decodes a bit at a second lowest hierarchical decoding level, and so on, until all information bits are obtained through decoding. When the second communications device performs hierarchical decoding based on the MSD order, some bits may be obtained through decoding. Then, when an undecoded code block is decoded, some parts that have been obtained through decoding may be used.

For the S parallel channels, when a sum of capacities of the S parallel channels is greater than or equal to a code rate R, the second communications device may always implement reliable decoding in the hierarchical decoding manner described in this embodiment.

Specifically, in a scenario in which transmission is performed in two parallel channels, the second communications device performs hierarchical decoding according to a hierarchical decoding level of an equivalent binary subgroup, to obtain decoded data, including:

If a sum of channel capacities of the first parallel channel and the second parallel channel is greater than or equal to a code rate R, a second communications device performs decoding, in the first parallel channel, to obtain $h_1$ information bit sub-parts included in an information bit block carried by a first code block in an equivalent binary subgroup with a lowest hierarchical decoding level. The second communications device sequentially performs decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel. The $h_1$ information bit sub-parts and the $h_2$ information bit sub-parts form $k_1$ information bit sub-blocks, and the $h_1$ meets $1 \leq k_1 \leq Q$.

The second communications device performs decoding, in the second parallel channel, to obtain $h_3$ information bit sub-parts of the information bit block carried by a second code block in an equivalent binary subgroup with the lowest hierarchical decoding level. The second communications device sequentially performs decoding according to hierarchical decoding levels of equivalent binary subgroups in the second parallel channel to obtain $h_3$ information bit sub-parts respectively corresponding to (T−1) equivalent binary subgroups of the $h_4$ information bit sub-parts in the second parallel channel. The $h_3$ information bit sub-parts and the $h_4$ information bit sub-parts form $k_2$ information bit sub-blocks, and the $k_1$ and $k_2$ meet $k_1+k_2 \geq Q$. The second communications device obtains the Q information bit sub-blocks included in the information bit block as a set formed by the $k_1$ information bit sub-blocks and the $k_2$ information bit sub-blocks.

Figure 11:
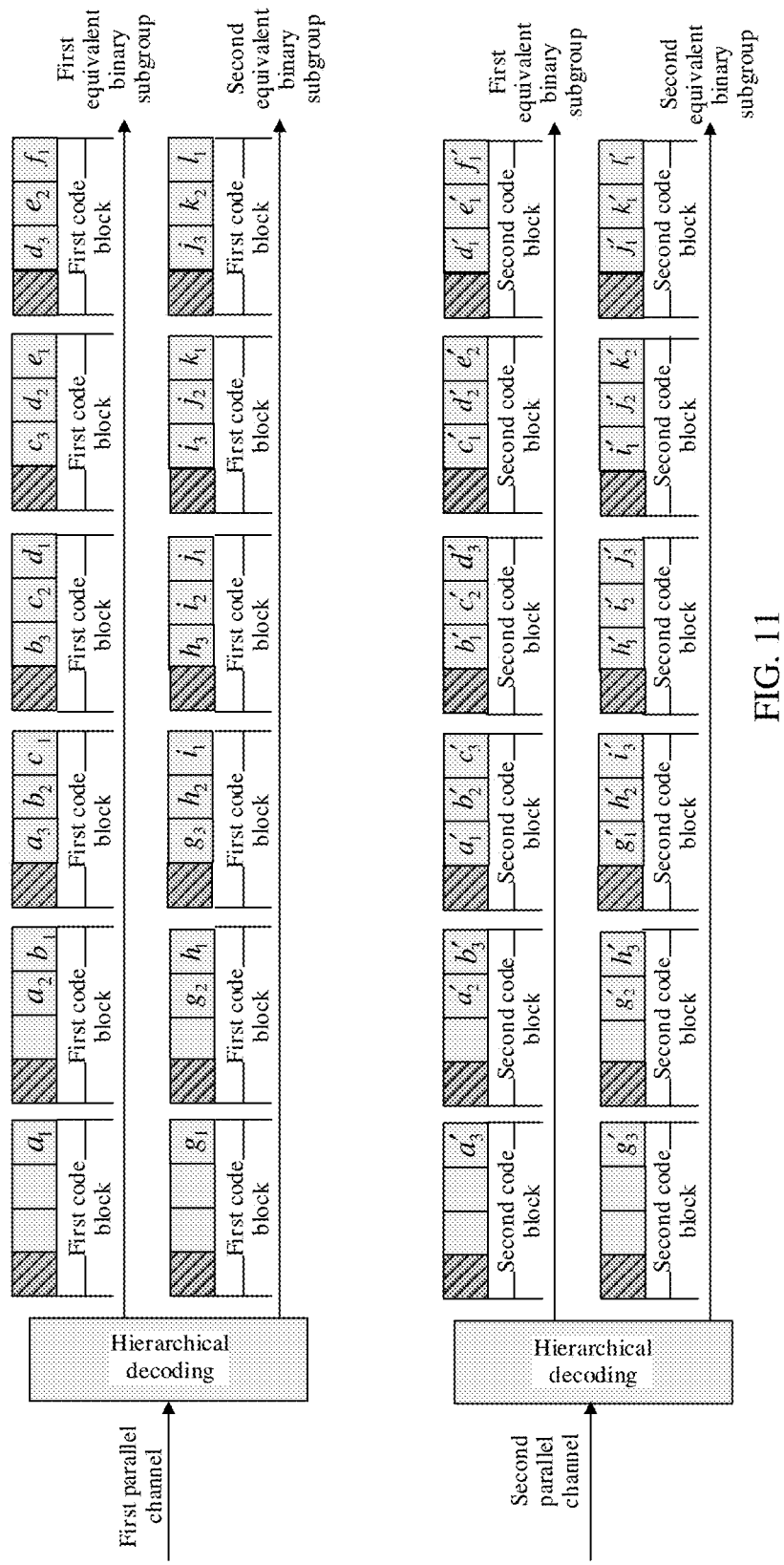
FIG. 11 is a schematic diagram of hierarchical decoding performed by a second communications device in a scenario of two parallel channels according to an embodiment of this application.

For example, referring to FIG. 11, FIG. 11 is a schematic diagram of hierarchical decoding performed by a second communications device in a scenario of two parallel channels according to an embodiment of this application. In FIG. 11, information bits in a first parallel channel are arranged in a first order, and then divided into blocks, encoded by using a polar code, and mapped to a high-order signal by using a mapping module; and information bits in a second parallel channel are arranged in a reversed order of the first order, and then divided into blocks, encoded by using a polar code, and mapped to a high-order signal by using a mapping module. In the first parallel channel, a sum of code rates of the first first code blocks corresponding to a first timeslot of two equivalent binary subgroups is R/3, a sum of code rates of the second first code blocks corresponding to a second timeslot is 2R/3, and sums of code rates of the third, fourth, fifth, and sixth first code blocks respectively corresponding to the third, fourth, fifth, and sixth timeslots are all R. In the second parallel channel, a sum of code rates of the first second to-be-encode blocks corresponding to a first timeslot of two equivalent binary subgroups is R/3, a sum of code rates of the second second code blocks corresponding to a second timeslot is 2R/3, and sums of code rates of the third, fourth, fifth, and sixth second code blocks respectively corresponding to the third, fourth, fifth, and sixth timeslots are all R.

It is assumed that a sum of channel capacities of the first parallel channel and the second parallel channel is greater than or equal to a code rate R. According to a hierarchical decoding principle, in each parallel channel, the second communications device first decodes a code block in an equivalent binary subgroup with a lowest hierarchical decoding level. According to a hierarchical decoding principle, a previous-level decoding result may be used as prior information for subsequent decoding.

In the first parallel channel, assuming that the second equivalent binary subgroup has the lowest hierarchical decoding level, a code block in the second equivalent binary subgroup is first decoded. It is assumed that a channel capacity of the first parallel channel is R/3. In this case, $g_1$ in the second equivalent binary subgroup may be obtained through decoding in the first parallel channel. Then, according to $g_1$, corresponding $a_1$ in the first equivalent binary subgroup may be obtained through decoding.

In the second parallel channel, assuming that the second equivalent binary subgroup has the lowest hierarchical decoding level, a code block in the second equivalent binary subgroup is first decoded. A capacity of the second parallel channel is 2R/3. In the second parallel channel, $g'_3$, $g'_2$, $h'_3$ in the second equivalent binary subgroup may be obtained through decoding in the second parallel channel. Then, according to $g'_3$, $g'_2$, $h'_3$, corresponding $a'_3$, $a'_2$, $b'_3$ in the first equivalent binary subgroup may be obtained through decoding.

In this case, according to a known decoding result $g'_2$, $a'_2$, in the first parallel channel, $g_2$ in the second equivalent binary subgroup may be determined, and $a_2$ in the first equivalent binary subgroup may also be determined. In this case, a sum of code rates of the second first code blocks corresponding to the second timeslot is reduced to R/3, and $h_1$ in the second first code block in the second equivalent binary subgroup may be obtained through decoding. Then, according to $h_1$, corresponding $b_1$ in the first equivalent binary subgroup may be obtained through decoding.

According to a known decoding result $g'_3$, $a'_3$, in the first parallel channel, corresponding $g_3$, $a_3$ may be obtained through decoding. In this case, information bit sub-parts $a_1$, $a_2$, $a_3$ and $g_1$, $g_2$, $g_3$ are a part of the decoding result. For the first parallel channel, the information bit sub-parts $a_1$, $a_2$, $a_3$ and $g_1$, $g_2$, $g_3$ are combined into three information bit sub-blocks $v_1$, $v_2$, $v_3$, and the three information bit sub-blocks form one information bit block. In other words, in this case, if an information bit block is decoded, nine information bits $u_1$, $u_2$, ... , $u_9$ included in the information bit block are also decoded.

Based on the foregoing description of decoding, similarly, for other code blocks in the first parallel channel and the second parallel channel, decoding may be successful when a sum of channel capacities of the first parallel channel and the second parallel channel is greater than or equal to a code rate R.

For example, according to a known decoding result $a_1$, $g_1$, in the second parallel channel, $g'_1$ in the second equivalent binary subgroup may be determined, and $a'_1$ in the first equivalent binary subgroup may also be determined. In this case, a sum of code rates of the third second code blocks corresponding to the third timeslot is reduced to 2R/3, and $h'_2$, $i'_3$ in the second equivalent binary subgroup may be obtained through decoding. Then, according to $h'_2$, $i'_3$, corresponding $b'_2$, $c'_3$ in the first equivalent binary subgroup may be obtained through decoding.

According to a known decoding result $b'_2$, $h'_2$, in the first parallel channel, $h_2$ in the second equivalent binary subgroup may be determined, and $b_2$ in the first equivalent binary subgroup may also be determined. In this case, according to the decoded $b_2$, $h_2$, $a_3$, $g_3$, a sum of code rates of the third first code blocks corresponding to the third timeslot is reduced to R/3, and $i_1$ in the second equivalent binary subgroup may be obtained through decoding. Then, according to $i_1$ corresponding $c_1$ in the first equivalent binary subgroup may be obtained through decoding.

According to a known decoding result $b_1$, $h_1$, in the second parallel channel, $h'_1$ in the second equivalent binary subgroup may be determined, and $b'_1$ in the first equivalent binary subgroup may also be determined. In this case, a sum of code rates of the fourth second code blocks corresponding to the fourth timeslot is reduced to 2R/3, and $i'_2$, $j'_3$ in the second equivalent binary subgroup may be obtained through decoding. Then, according to $i'_2$, $j'_3$, corresponding $c'_2$, $d'_3$ in the first equivalent binary subgroup may be obtained through decoding.

According to a known decoding result $h'_3$, $b'_3$, in the first parallel channel, $h_3$ in the second equivalent binary subgroup may be determined, and $b_3$ in the first equivalent binary subgroup may also be determined; and according to a known decoding result $c'_2$, $i'_2$, in the first parallel channel, corresponding $c_2$, $i_2$ may be obtained through decoding. According to decoded $b_3$, $h_3$, $c_2$, $i_2$, a sum of code rates of the fourth first code block corresponding to the fourth timeslot is reduced to R/3, and $j_1$ in the second equivalent binary subgroup may be obtained through decoding. Then, according to $j_1$ corresponding $d_1$ in the first equivalent binary subgroup may be obtained through decoding.

According to a known decoding result $c_1$, $i_1$, in the second parallel channel, $i'_1$ in the second equivalent binary subgroup may be determined, and $c'_1$ in the first equivalent binary subgroup may also be determined. In this case, a sum of code rates of the fifth second code blocks corresponding to the fifth timeslot is reduced to 2R/3, and $j'_2$, $k'_2$ in the second equivalent binary subgroup may be obtained through decoding. Then, according to $j'_2$, $k'_2$, corresponding $d'_2$, $e'_2$ in the first equivalent binary subgroup may be obtained through decoding.

According to a known decoding result $d'_2$, $j'_2$, $c'_3$, $i'_3$, corresponding $d_2$, $j_2$, $c_3$, $i_3$ in the first parallel channel may be obtained through decoding. In the first parallel channel, according to decoded $d_2$, $j_2$, $c_3$, $i_3$, a sum of code rates of the fifth first code block corresponding to the fifth timeslot is reduced to R/3, and $k_1$ in the second equivalent binary subgroup may be obtained through decoding. Then, according to $k_1$, corresponding $e_1$ in the first equivalent binary subgroup may be obtained through decoding. According to a known decoding result $d_1$, $j_1$, corresponding $d'_1$, $j'_1$ in the second parallel channel may be obtained through decoding. In the second parallel channel, a sum of code rates of the sixth second code blocks corresponding to the sixth timeslot is reduced to 2R/3, and $k'_1$, $l'_1$ in the second equivalent binary subgroup may be obtained through decoding. Then, according to $k'_1$, $l'_1$, corresponding $e'_1$, $f'_1$ in the first equivalent binary subgroup may be obtained through decoding.

According to a known decoding result $d'_3$, $j'_3$, $e'_2$, $k'_2$, $l'_1$, $f'_1$, corresponding $d_3$, $j_3$, $e_2$, $k_2$, $l_1$, $f_1$ in the first parallel channel may be obtained through decoding.

In conclusion, in the example shown in FIG. 11, when the sum of the channel capacities of the first parallel channel and the second parallel channel is greater than or equal to the code rate R, the second communications device may correctly decode the information bit sub-blocks in all the code blocks in the first parallel channel and the second parallel channel, to obtain all the information bits in the first parallel channel and the second parallel channel through decoding.

It should be noted that the combined decoding in this embodiment of this application may further include the following special combined decoding: It is assumed that a channel capacity of the first parallel channel is zero, and a channel capacity of the second parallel channel is greater than or equal to a code rate R; or the channel capacity of the first parallel channel is greater than or equal to a code rate R, and a channel capacity of the second parallel channel is zero. In the foregoing two possible cases, because the sum of the channel capacities of the first parallel channel and the second parallel channel is greater than or equal to the code rate R, the second communications device may decode all raw data. It can be learned that the foregoing special case also meets a condition of hierarchical decoding, and finally correct decoding is implemented.

An embodiment of this application provides a data processing method. The method is implemented by interaction between a first communications device and a second communications device. The first communications device obtains a plurality of binary sequences, and the plurality of binary sequences are transmitted by using S parallel channels. The first communications device respectively places, in each parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups. The first communications device separately performs polar code encoding on sub-blocks of the information bit block in each parallel channel, and then sends encoded S data streams to the second communications device. The second communications device receives the S data streams, and performs hierarchical decoding according to a hierarchical decoding level of an equivalent binary subgroup, to obtain decoded data. It can be learned that the data processing method helps improve a transmission rate in a parallel channel transmission scenario. In addition, in the plurality of parallel channels, information bits are arranged in a specific order, which helps the second communications device correctly perform decoding.

Figure 12:
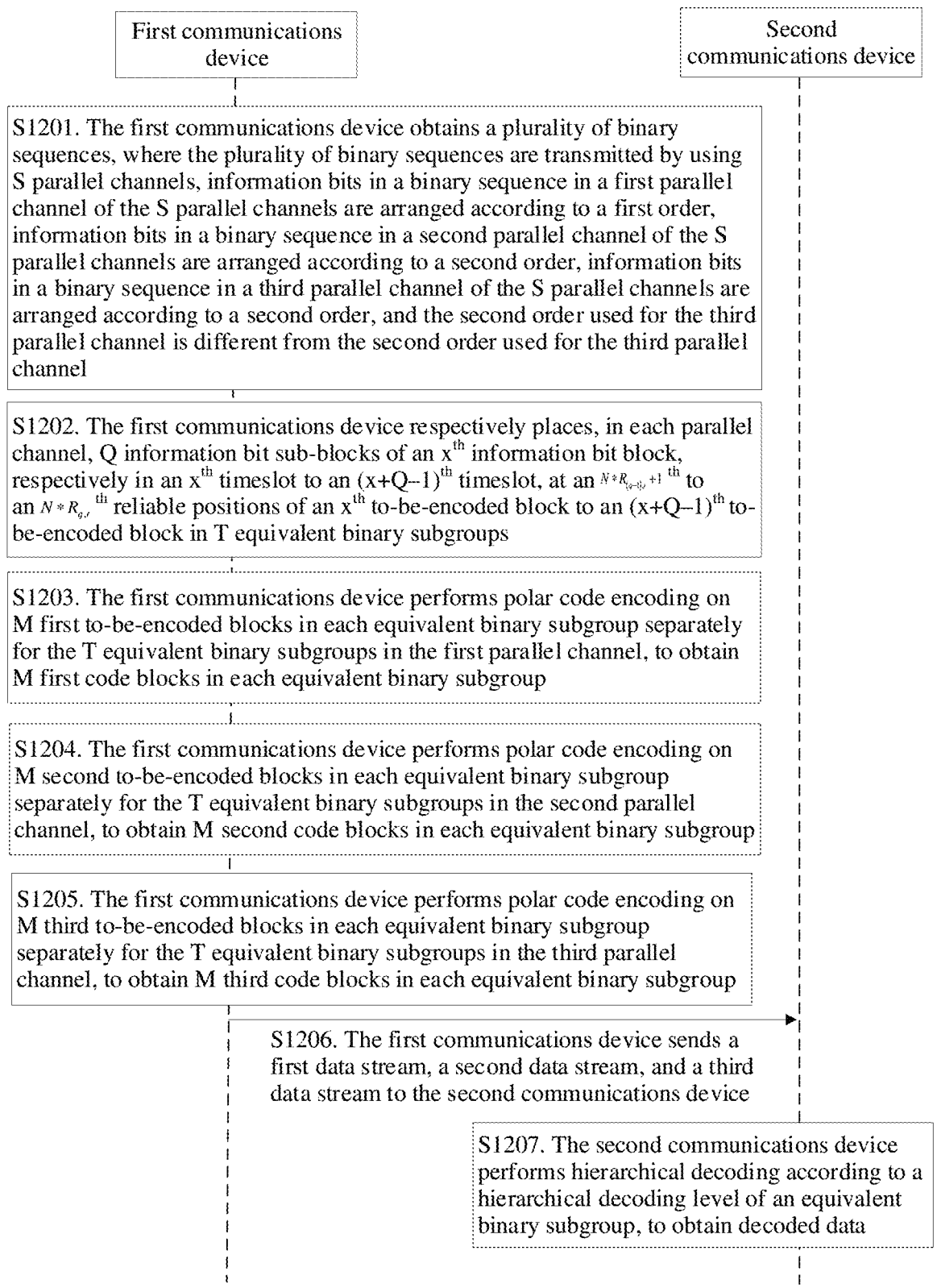
FIG. 12 is a schematic flowchart of another data processing method according to an embodiment of this application.

Based on the description in the embodiment shown in FIG. 6, the following describes in detail a case in which the first communications device sends three data streams to the second communications device, and the second communications device receives the three data streams and performs hierarchical decoding. Referring to FIG. 12, FIG. 12 shows another data processing method according to an embodiment of this application. The data processing method may be performed through interaction between a first communications device and a second communications device, and includes S1201 to S1209.

S1201. The first communications device obtains a plurality of binary sequences, where the plurality of binary sequences are transmitted by using S parallel channels, information bits in a binary sequence in a first parallel channel of the S parallel channels are arranged according to a first order, information bits in a binary sequence in a second parallel channel of the S parallel channels are arranged according to a second order, information bits in a binary sequence in a third parallel channel of the S parallel channels are arranged according to a second order, and the second order used for the third parallel channel is different from the second order used for the third parallel channel.

S1202. The first communications device respectively places, in each parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups.

S1203. The first communications device performs polar code encoding on M first to-be-encoded blocks in each equivalent binary subgroup separately for the T equivalent binary subgroups in the first parallel channel, to obtain M first code blocks in each equivalent binary subgroup.

S1204. The first communications device performs polar code encoding on M second to-be-encoded blocks in each equivalent binary subgroup separately for the T equivalent binary subgroups in the second parallel channel, to obtain M second code blocks in each equivalent binary subgroup.

S1205. The first communications device performs polar code encoding on M third to-be-encoded blocks in each equivalent binary subgroup separately for the T equivalent binary subgroups in the third parallel channel, to obtain M third code blocks in each equivalent binary subgroup.

S1206. The first communications device sends a first data stream, a second data stream, and a third data stream to the second communications device. Correspondingly, the second communications device receives the first data stream, the second data stream, and the third data stream that are sent by the first communications device.

S1207. The second communications device performs hierarchical decoding according to a hierarchical decoding level of an equivalent binary subgroup, to obtain decoded data.

Specific implementations of S1201 to S1204 are similar to those of S601 to S604 in the embodiment in FIG. 6. Refer to related descriptions in the embodiment in FIG. 6. Details are not described herein again.

According to the description in the embodiment in FIG. 6, the second order may be a reversed order of the first order, or may meet the following mapping relationship with the first order:

$U=[u_1,u_2,\ldots,u_K]$ $\overline{U}=[0,0,\ldots,0,u_1,u_2,\ldots,u_K]$ $\tilde{U}=[\tilde{u}_1,\tilde{u}_2,\ldots,\tilde{u}_{2^P}]$ $\tilde{U}=\overline{U}F^{\otimes P}$ When the first communications device sends the three data streams, the second order used for the second parallel channel is definitely different from the second order used for the third parallel channel. In other words, if the information bits in the second parallel channel are arranged in a reversed order of the first order, the information bits in the third parallel channel are arranged according to a mapping relationship of $\tilde{U}=\overline{U}F^{\otimes P}$; or if the information bits in the second parallel channel are arranged according to the mapping relationship of $\tilde{U}=\overline{U}F^{\otimes P}$, the information bits in the third parallel channel are arranged according to a reversed order of the first order.

Figure 13A:
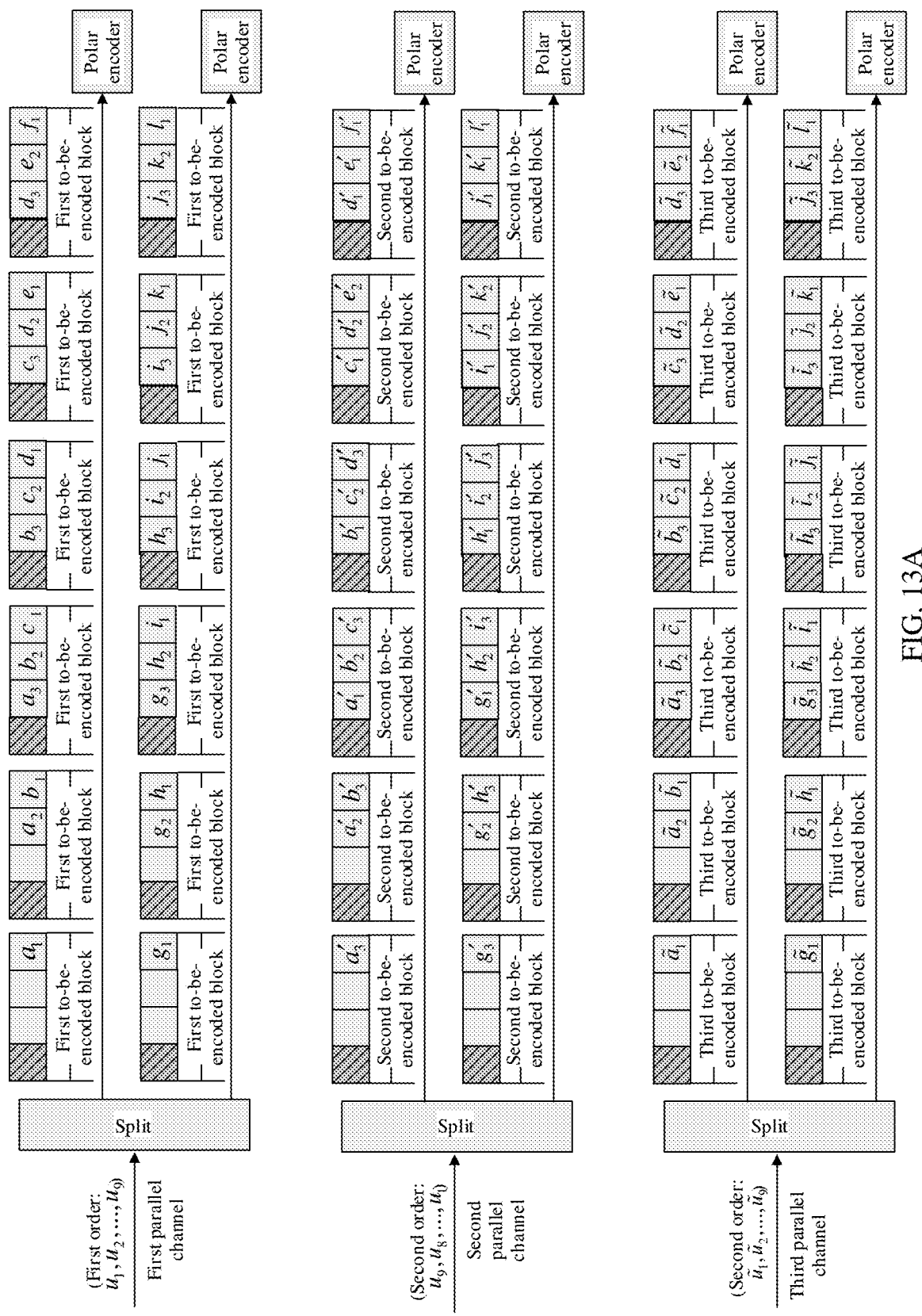
FIG. 13A is a schematic diagram of a to-be-encoded block in each parallel channel in a parallel transmission scenario of three parallel channels according to an embodiment of this application.
Figure 13B:
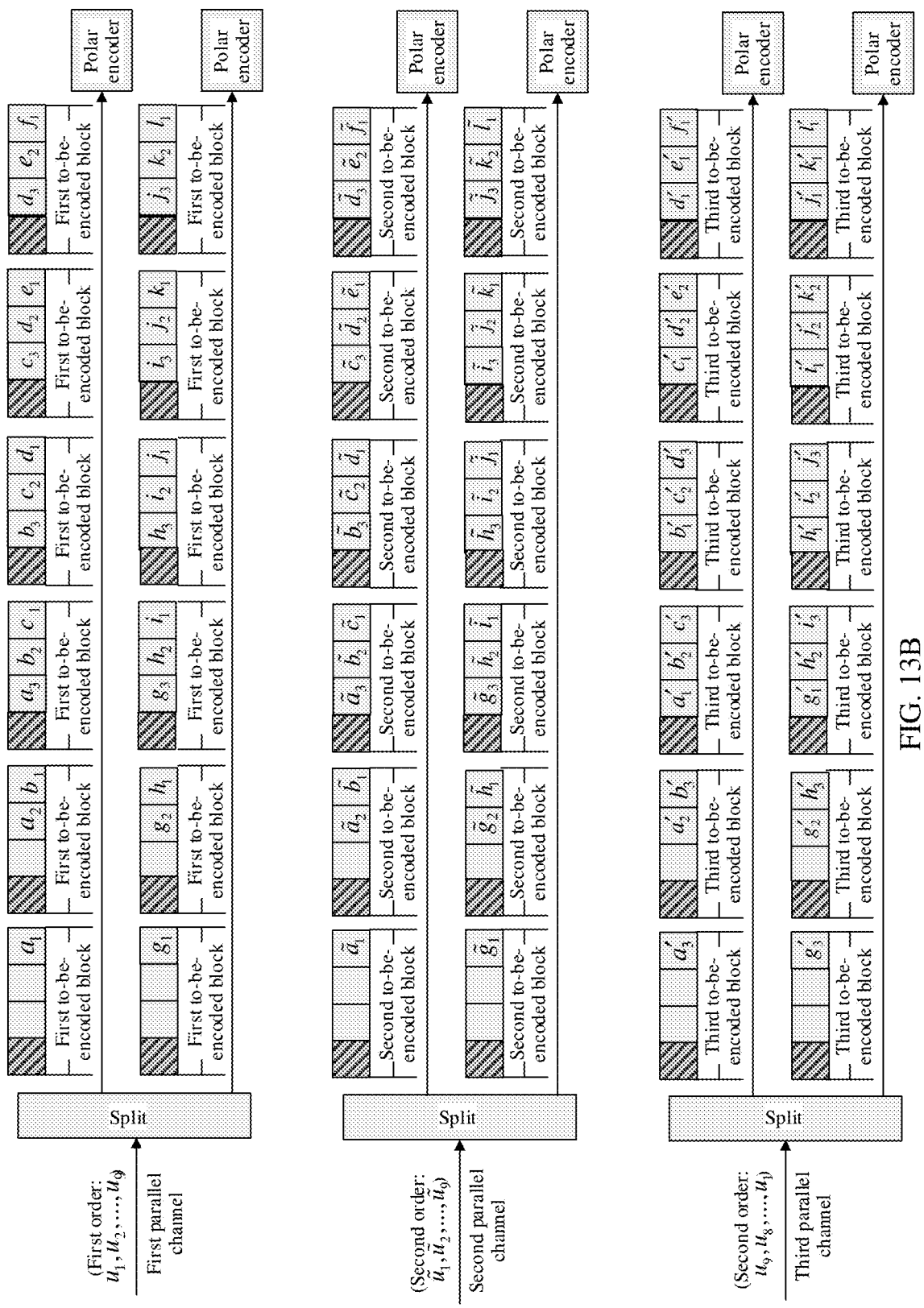
FIG. 13B is a schematic diagram of a to-be-encoded block in each parallel channel in another parallel transmission scenario of three parallel channels according to an embodiment of this application.

Referring to FIG. 13A, FIG. 13A shows a parallel transmission scenario of three parallel channels according to an embodiment of this application. It is assumed that the information bits in the second parallel channel are arranged according to a reversed order of the first order, and then the information bits in the third parallel channel are arranged according to the mapping relationship of $\tilde{U}=\overline{U}F^{\otimes P}$, as shown in FIG. 13A. Optionally, referring to FIG. 13B, FIG. 13B is another parallel transmission scenario of three parallel channels according to an embodiment of this application. It is assumed that the information bits in the second parallel channel are arranged according to the mapping relationship of $\tilde{U}=\overline{U}F^{\otimes P}$, and the information bits in the third parallel channel are arranged according to a reversed order of the first order, as shown in FIG. 13B. The first communications device may separately perform polar code encoding on the M third to-be-encoded blocks to obtain the M third code blocks.

In the third parallel channel, a first information bit sub-block in Q information bit sub-blocks of an $x^{th}$ information bit block is placed, in an $x^{th}$ timeslot, at a first to an $N*R_{1,t}^{th}$ reliable positions of an $x^{th}$ first to-be-encoded block in T equivalent binary subgroups; and in an $(x+1)^{th}$ timeslot, a second information bit sub-block in the Q information bit sub-blocks of the $x^{th}$ information bit block is placed at an $N*R_{1,t}+1^{th}$ to an $N*R_{2,t}^{th}$ reliable positions of $(x+1)$ first to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ first to-be-encoded block in the T equivalent binary subgroups.

The first communications device may perform polar code encoding on the to-be-encoded blocks in the first parallel channel, the second parallel channel, and the third parallel channel shown in FIG. 13A and FIG. 13B. For the first parallel channel, two equivalent binary subgroups in the first parallel channel may be mapped into $2^2$-order high-order signals by using a mapping module and transmitted on an AWGN channel. Similarly, for the second parallel channel, two equivalent binary subgroups in the second parallel channel may be mapped into $2^2$-order high-order signals by using a mapping module and transmitted on an AWGN channel. Similarly, for the third parallel channel, two equivalent binary subgroups in the third parallel channel may be mapped to $2^2$-order high-order signals by using the mapping module on the AWGN channel, thereby helping improve a throughput of the parallel channels.

It should be noted that, for a solution in which an information bit block in the third parallel channel is split into information bit sub-blocks, and the information bit sub-blocks are split into a plurality of information bit sub-parts in different equivalent binary subgroups, refer to related descriptions of the first parallel channel and the second parallel channel in the embodiment in FIG. 6. Details are not described herein again.

The second communications device receives the first data stream (including the high-order signals in the first parallel channel), the second data stream (including the high-order signals in the second parallel channel), and the third data stream (including the high-order signals in the third parallel channel) that are sent by the first communications device, and may perform hierarchical decoding on the received first data stream, second data stream, and third data stream. According to the description in the embodiment in FIG. 6, the hierarchical decoding described in this embodiment is an interactive procedure: The second communications device starts decoding, according to an MSD order, from a bit at a lowest hierarchical decoding level, and then decodes a bit at a second lowest hierarchical decoding level, and so on, until all information bits are obtained through decoding.

For the S parallel channels, when a sum of capacities of the S parallel channels is greater than or equal to a code rate R, the second communications device may always implement reliable decoding in the hierarchical decoding manner described in this embodiment.

Specifically, in a scenario in which transmission is performed in three parallel channels, the second communications device performs hierarchical decoding according to a hierarchical decoding level of an equivalent binary subgroup, to obtain decoded data, including:

if a sum of channel capacities of the first parallel channel, the second parallel channel, and the third parallel channel is greater than or equal to a code rate R, performing decoding, in the first parallel channel, to obtain $h_1$ information bit sub-parts included in an information bit block carried by a first code block in an equivalent binary subgroup with a lowest hierarchical decoding level;

sequentially performing decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel; where the $h_1$ information bit sub-parts and the $h_2$ information bit sub-parts form $k_1$ information bit sub-blocks, and the $k_1$ meets $1 \le k_1 < Q$ performs decoding, in the second parallel channel according to a second order of an information bit arrangement in the second parallel channel, to obtain $h_3$ information bit sub-parts of the information bit block carried by a second code block in an equivalent binary subgroup with the lowest hierarchical decoding level;

sequentially performing decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel; where the $h_3$ information bit sub-parts and the $h_4$ information bit sub-parts form $k_2$ information bit sub-blocks, and the $k_1$ and $k_2$ meet $k_1 + k_2 < Q$.

performs decoding, in the third parallel channel according to a second order of an information bit arrangement in the third parallel channel, to obtain $h_5$ information bit sub-parts of the information bit block carried by a third code block in an equivalent binary subgroup with the lowest hierarchical decoding level;

sequentially performing decoding according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel; where the $h_5$ information bit sub-parts and the $h_6$ information bit sub-parts form $k_3$ information bit sub-blocks, and the $k_1$, the $k_2$ and $k_3$ meet $k_1 + k_2 + k_3 \ge Q$; and obtaining the Q information bit sub-blocks included in the information bit block as a set formed by the $k_1$ information bit sub-blocks, the $k_2$ information bit sub-blocks, and the $k_3$ information bit sub-blocks.

Figure 14A:
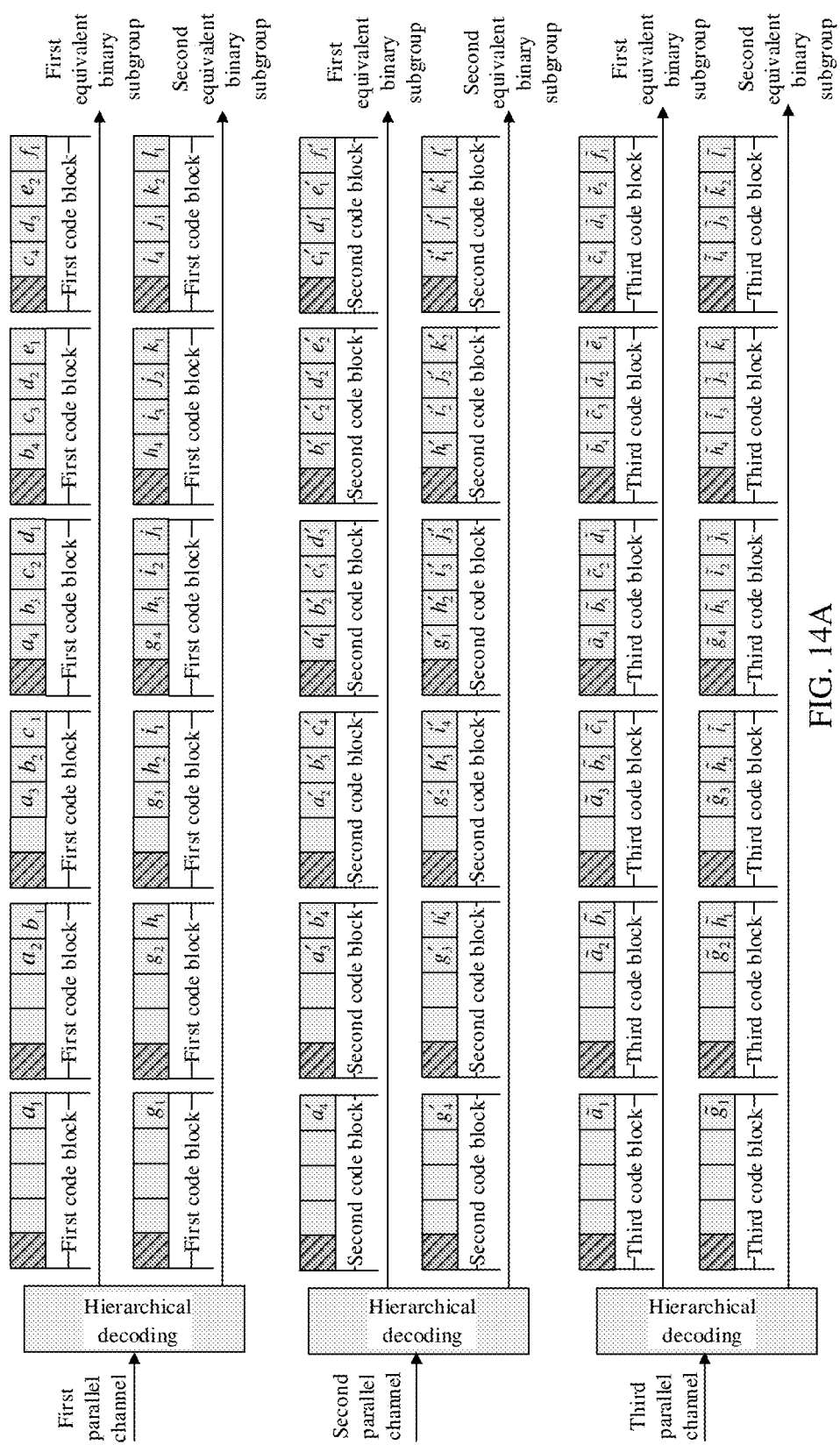
FIG. 14A is a schematic diagram of hierarchical decoding performed by a second communications device in a scenario of three parallel channels according to an embodiment of this application.

For example, referring to FIG. 14A, FIG. 14A is a schematic diagram of hierarchical decoding performed by a second communications device in a scenario of three parallel channels according to an embodiment of this application. In FIG. 14A, information bits in a first parallel channel are arranged in a first order, and then divided into blocks, encoded by using a polar code, and mapped to a high-order signal by using a mapping module; information bits in a second parallel channel are arranged in a reversed order of the first order, and then divided into blocks, encoded by using a polar code, and mapped to a high-order signal by using a mapping module; and information bits in a third parallel channel are arranged in a mapping relationship of $\tilde{U} = \overline{U} F_{\otimes P}$, and then divided into blocks, encoded by using a polar code, and mapped to a high-order signal by using a mapping module.

In the first parallel channel, a sum of code rates of the first first code blocks corresponding to a first timeslot of two equivalent binary subgroups is R/4, a sum of code rates of the second first code blocks corresponding to a second timeslot is 2R/4, a sum of code rates of the third first code blocks corresponding to a third timeslot is 3R/4, and sums of code rates of the fourth, fifth, and sixth first code blocks corresponding to the fourth, fifth, and sixth timeslots are all R. In the second parallel channel, a sum of code rates of the first first code blocks corresponding to a first timeslot of two equivalent binary subgroups is R/4, a sum of code rates of the second first code blocks corresponding to a second timeslot is 2R/4, a sum of code rates of the third first code blocks corresponding to a third timeslot is 3R/4, and sums of code rates of the fourth, fifth, and sixth first code blocks corresponding to the fourth, fifth, and sixth timeslots are all R. In the third parallel channel, a sum of code rates of the first first code blocks corresponding to a first timeslot of two equivalent binary subgroups is R/4, a sum of code rates of the second first code blocks corresponding to a second timeslot is 2R/4, a sum of code rates of the third first code blocks corresponding to a third timeslot is 3R/4, and sums of code rates of the fourth, fifth, and sixth first code blocks corresponding to the fourth, fifth, and sixth timeslots are all R, as shown in FIG. 14A.

It is assumed that a sum of channel capacities of the first parallel channel, the second parallel channel, and the third parallel channel is greater than or equal to a code rate R. According to a hierarchical decoding principle, in each parallel channel, the second communications device first decodes a code block in an equivalent binary subgroup with a lowest hierarchical decoding level.

It is assumed that the channel capacity of the first parallel channel is 2R/4, the channel capacity of the second parallel channel is R/4, and the channel capacity of the third parallel channel is R/4. In this case, a sum of channel capacities of the first parallel channel, the second parallel channel, and the third parallel channel is equal to the code rate R. The following describes in detail a hierarchical decoding process by using an example in which each information bit sub-block in an information bit block is divided into information bit sub-parts $a_1$, $g_1$, $a_2$, $g_2$, $a_3$, $g_3$, $a_4$, $g_4$ in two equivalent binary subgroups.

In the first parallel channel, assuming that the second equivalent binary subgroup has the lowest hierarchical decoding level, a code block in the second equivalent binary subgroup is first decoded. Because the channel capacity of the first parallel channel is 2R/4, the second communications device may obtain, through decoding, $g_1$, $g_2$, $h_1$ in the second equivalent binary subgroup. Then, according to $g_1$, $g_2$, $h_1$, corresponding $a_1$, $a_2$, $b_1$ in the first equivalent binary subgroup may be obtained through decoding.

In the second parallel channel, assuming that the second equivalent binary subgroup has the lowest hierarchical decoding level, a code block in the second equivalent binary subgroup is first decoded. Because the capacity of the second parallel channel is R/4, the second communications device may obtain, through decoding, $g'_4$ in the second equivalent binary subgroup. Then, according to $g'_4$, corresponding $a'_4$ in the first equivalent binary subgroup may be obtained through decoding. Based on a decoding result $a'_4$, $g'_4$, the second communications device may obtain, through decoding, corresponding $a_4$, $g_4$.

In the third parallel channel, assuming that the first equivalent binary subgroup has the lowest hierarchical decoding level, a code block in the first equivalent binary subgroup is first decoded. Because the channel capacity of the third parallel channel is R/4, the second communications device may obtain, through decoding, $ã_1$ in the first equivalent binary subgroup. Then, according to $ã_1$, corresponding $g̃_1$ in the second equivalent binary subgroup may be obtained through decoding.

After obtaining $a_1$, $a_2$, $a_4$ and $ã_1$, the first communications device may obtain $a_3$ and $ã_2$, $ã_3$, $ã_4$ through decoding based on the mapping relationship described in the foregoing embodiment. Similarly, after obtaining $g_1$, $g_2$, $g_4$ and $g̃_1$, the first communications device may obtain $g_3$ and $g̃_2$, $g̃_3$, $g̃_4$ through decoding based on the mapping relationship. In other words, if all the information bit sub-parts $a_1$, $g_1$, $a_2$, $g_2$, $a_3$, $g_3$, $a_4$, $g_4$ are correctly decoded, an information bit block $v_1$ corresponding to the foregoing information bit sub-parts is also correctly decoded.

Similarly, an information bit sub-part (for example, $b_1$, $h_1$, $b_2$, $h_2$, $b_3$, $h_3$, $b_4$, $h_4$) in another code block in FIG. 14A may also be decoded according to the foregoing procedure. Decoding can be successful when the sum of channel capacities of the first parallel channel, the second parallel channel, and the third parallel channel is greater than or equal to the code rate R. Details are not described herein again.

Figure 14B:
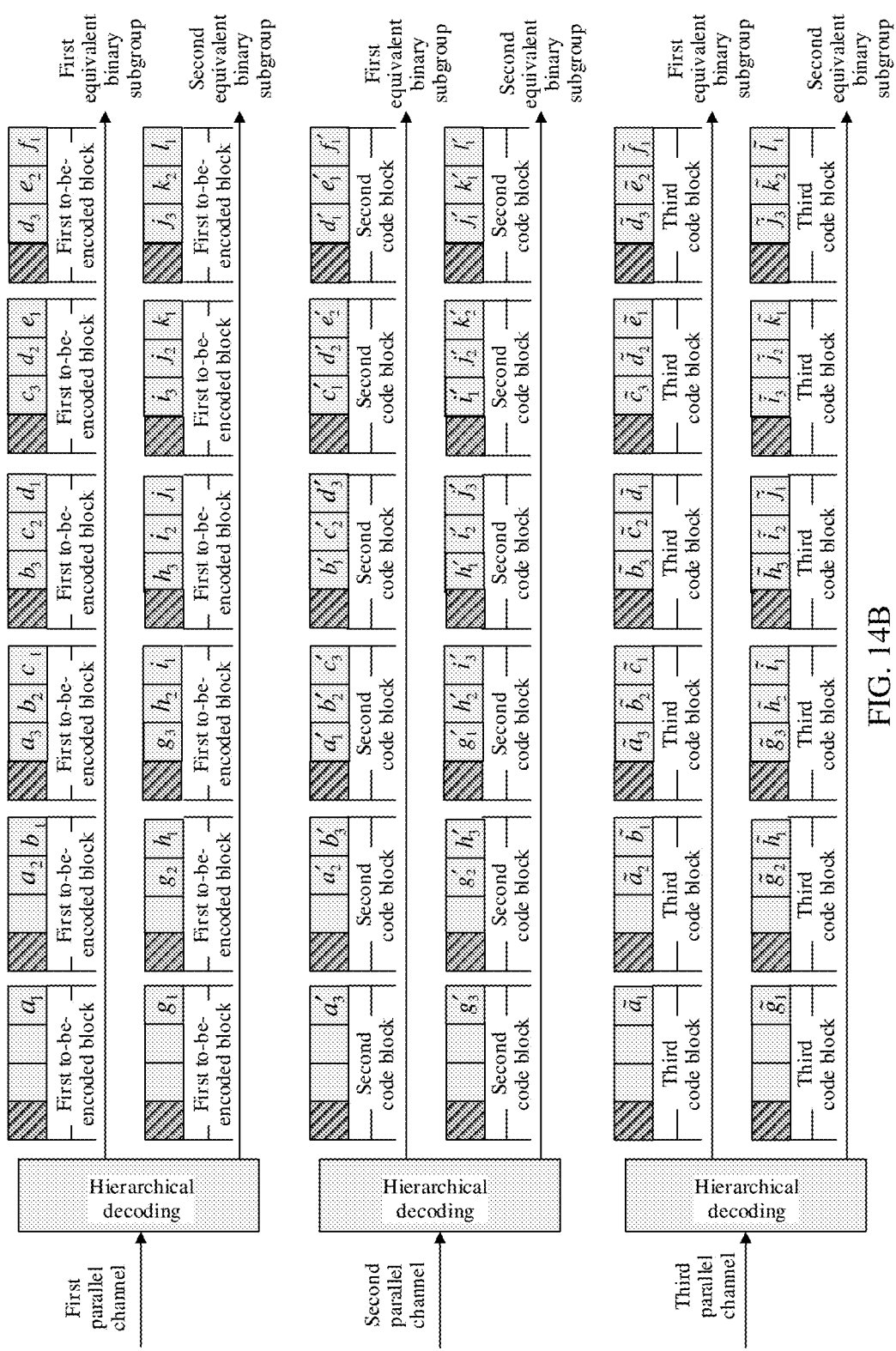
FIG. 14B is a schematic diagram of hierarchical decoding performed by a second communications device in another scenario of three parallel channels according to an embodiment of this application.

Optionally, referring to FIG. 14B, FIG. 14B is a schematic diagram of hierarchical decoding performed by a second communications device in another scenario of three parallel channels according to an embodiment of this application. It is assumed that the channel capacity of the first parallel channel is R/3, the channel capacity of the second parallel channel is 2R/3, and the channel capacity of the third parallel channel is 0. In the first parallel channel, assuming that the second equivalent binary subgroup has the lowest hierarchical decoding level, a code block in the second equivalent binary subgroup is first decoded. In the second parallel channel, assuming that the second equivalent binary subgroup has the lowest hierarchical decoding level, a code block in the second equivalent binary subgroup is first decoded. In this implementation, it is assumed that the channel capacity of the first parallel channel is R/3, and the channel capacity of the second parallel channel is 2R/3. Therefore, according to descriptions of decoding the first parallel channel and the second parallel channel in the embodiment in FIG. 6, when a sum of the channel capacities of the first parallel channel and the second parallel channel in FIG. 14B is greater than or equal to a code rate R, the second communications device may correctly decode all information bits in the first parallel channel and the second parallel channel. Because information bits in the third parallel channel and information bits in the first parallel channel meet a mapping relationship of $Ũ=\overline{U}F^{\otimes P}$, information bit blocks in the third parallel channel may also be obtained through decoding according to the mapping relationship.

It should be noted that the foregoing example provides only one possible code rate allocation manner, but a code rate allocation manner of each data stream is not limited to the foregoing example, and the following conditions need to be met:

It is assumed that maximum capacities of code streams on three parallel channels are $r_1=Rk_1/Q$, $r_2=Rk_2/Q$, $r_3=Rk_3/Q$ respectively, where $k_1$, $k_2$, $k_3 \in [0, 1, 2, \ldots Q]$. If $r_1+r_2+r_3 \geq R$, all bits can be successfully decoded. A larger value of Q indicates a smaller code rate loss.

Figure 15:
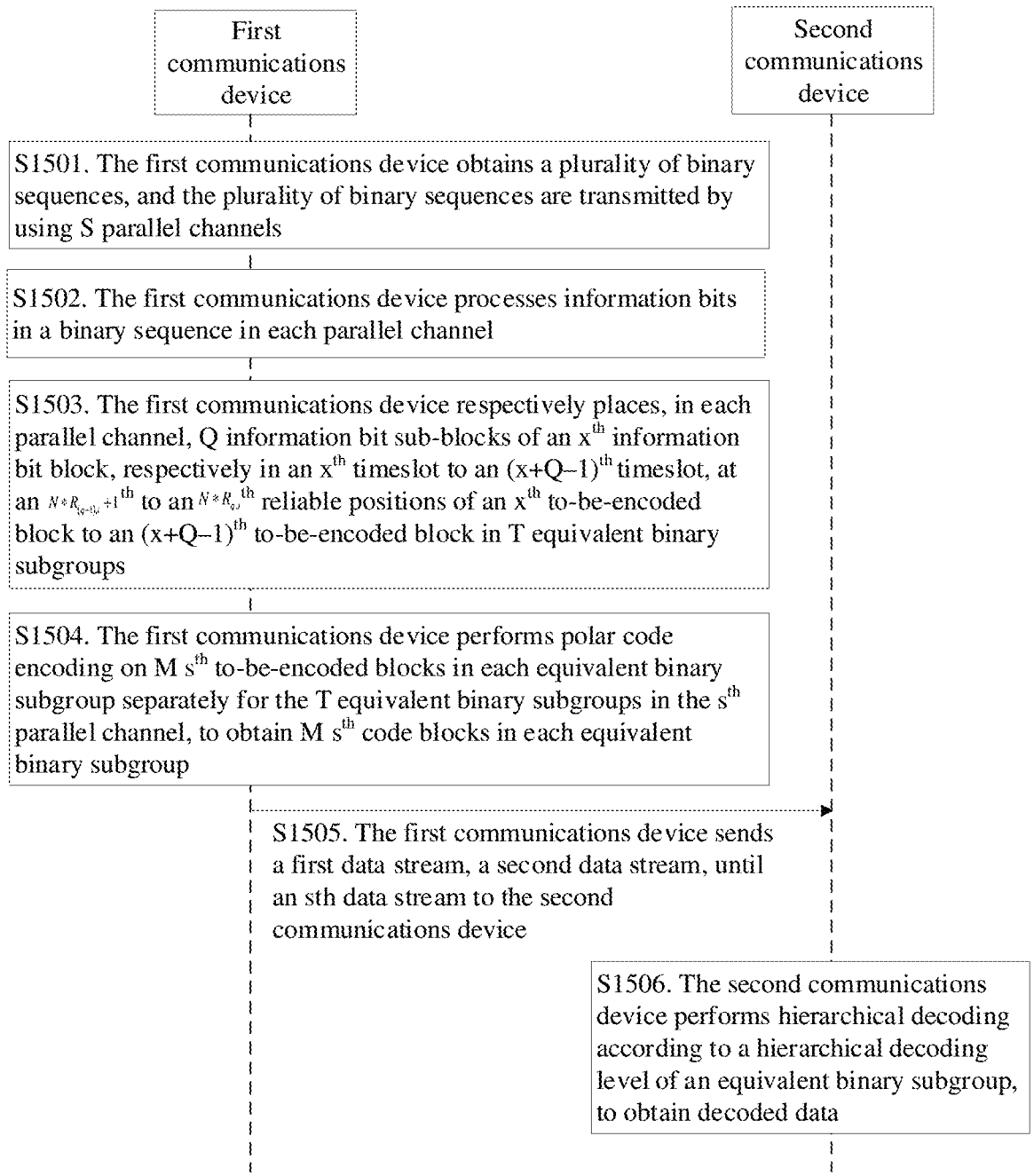
FIG. 15 is a schematic flowchart of another data processing method according to an embodiment of this application.

Based on the description in the embodiment shown in FIG. 6, the following describes in detail a case in which the first communications device sends four or more data streams to the second communications device, and the second communications device receives the four or more data streams and performs hierarchical decoding. Referring to FIG. 15, FIG. 15 shows another data processing method according to an embodiment of this application. The data processing method may be performed through interaction between a first communications device and a second communications device, and specifically includes the following steps.

S1501. The first communications device obtains a plurality of binary sequences, and the plurality of binary sequences are transmitted by using S parallel channels.

S1502. The first communications device processes information bits in a binary sequence in each parallel channel.

S1503. The first communications device respectively places, in each parallel channel, Q information bit sub-blocks of a processed $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups.

S1504. The first communications device performs polar code encoding on M $s^{th}$ to-be-encoded blocks in each equivalent binary subgroup separately for the T equivalent binary subgroups in an $s^{th}$ parallel channel, to obtain M $s^{th}$ code blocks in each equivalent binary subgroup.

S1505. The first communications device sends the first data stream, the second data stream, and until an $s^{th}$ data stream to the second communications device. Correspondingly, the second communications device receives the first data stream, the second data stream, until the $s^{th}$ data stream that are sent by the first communications device.

S1506. The second communications device performs hierarchical decoding according to a hierarchical decoding level of an equivalent binary subgroup, to obtain decoded data.

When the first communications device simultaneously sends four or more data streams, because there is no UDM matrix in a binary field, the first communications device cannot process the information bits in the binary field. Therefore, when processing information bits in each information bit block, the first communications device may map K information bits $u_1, u_2, \ldots, u_K$ in each information bit block from a binary field to a finite field with $2^w$ elements, to obtain a corresponding symbol sequence obtained after each information bit block is mapped. A length of each symbol sequence is K/w, and w is a positive integer greater than 1.

The first communications device converts each symbol sequence, where any symbol sequence and a symbol sequence obtained after conversion of the any symbol sequence satisfy the following relationship:

$$\overline{A} = \tilde{A} * H_s$$

$\tilde{A}$ is the any symbol sequence, $\tilde{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets 1≤s≤S, and S is a positive integer greater than 3.

The first communications device then performs reverse mapping on each converted symbol sequence, to obtain a corresponding information bit block obtained after the reverse mapping. The corresponding information bit block obtained after the reverse mapping still includes K information bits. For example, in the $s^{th}$ parallel channel, a corresponding information bit block of $\overline{A}$ after reverse mapping is $[A_{s,1}, A_{s,2}, \ldots, A_{s,K}]$, where $A_{s,k}$ is a corresponding information bit after the reverse mapping.

It can be learned that, according to the foregoing processing procedure, when sending four or more data streams simultaneously, the first communications device may process the information bit sub-block and then perform subsequent sorting and encoding.

The following uses s=4 for description. s=4 indicates that the first communications device sends four data streams to the second communications device. In this case, the first communications device may separately arrange information bits of each processed information bit block in a first order. For example, in a first parallel channel, the first communications device arranges information bits of each processed information bit block respectively in a first order; in a second parallel channel, the first communications device arranges information bits of each processed information bit block respectively in a first order; in a third parallel channel, the first communications device arranges information bits of each processed information bit block respectively in a first order; and in a fourth parallel channel, the first communications device arranges information bits of each processed information bit block respectively in a first order. After the arrangement, for the processed information bits in each parallel channel, the first communications device divides every K information bits into Q information bit sub-blocks. For a specific division manner, refer to related descriptions in the embodiment in FIG. 6. Details are not described herein again.

Figure 16:
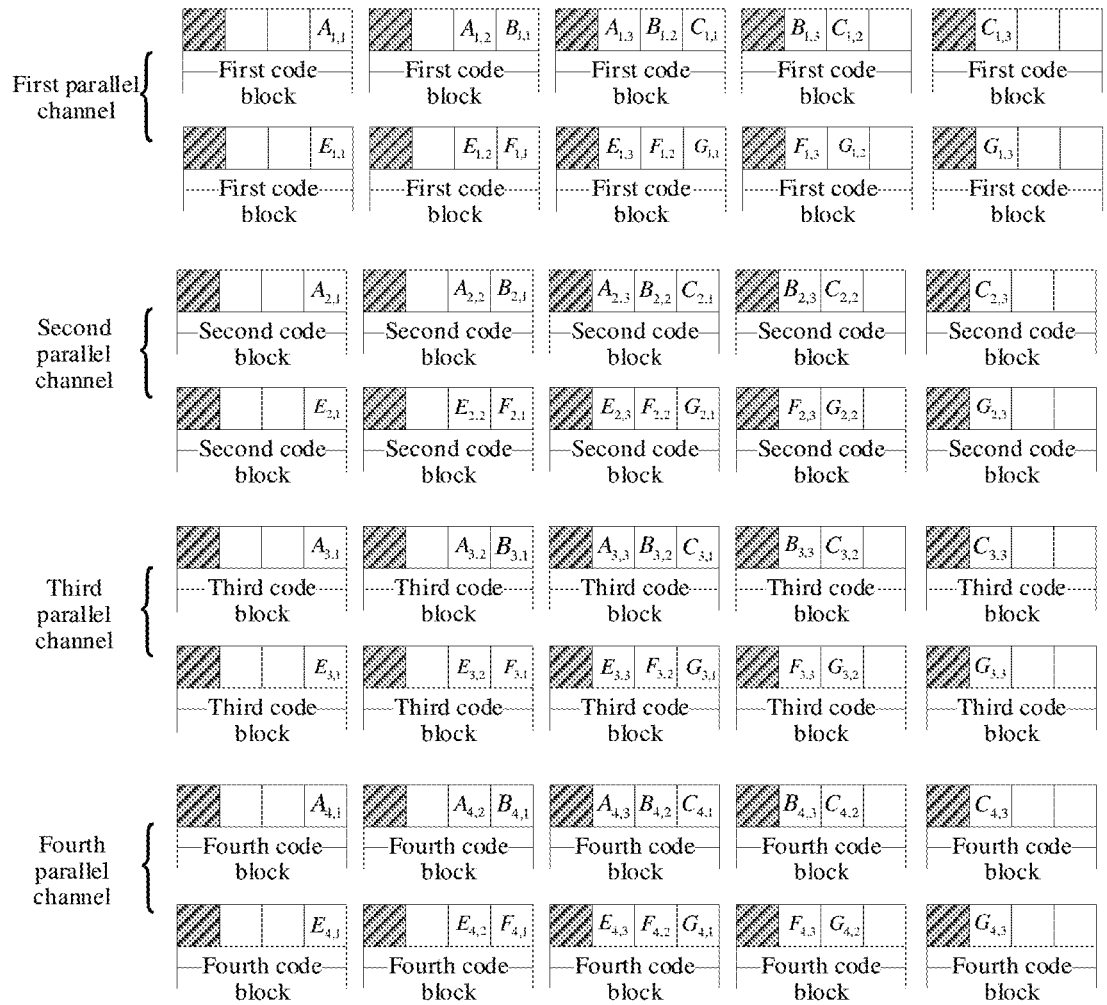
FIG. 16 is a schematic diagram of hierarchical decoding performed by a second communications device in a scenario of four parallel channels according to an embodiment of this application.

Referring to FIG. 16, FIG. 16 is a schematic diagram of a scenario in which a first communications device sends data streams by using four parallel channels according to an embodiment of this application. It is assumed that each parallel channel is split into two equivalent binary subgroups, Q=3, and M=5.

In the first parallel channel, one processed information bit sub-block is split into two information bit sub-parts. For example, the first processed information bit sub-block $V_{1,1}$ in the first parallel channel is split into two information bit sub-parts $A_{1,1}, E_{1,1}$, where $A_{1,1}$ is located at a $1^{st}$ to an $N*R_{1,1}^{th}$ reliable positions of a first first code block of a first equivalent binary subgroup, and $E_{1,1}$ is located at a $1^{st}$ to an $N*R_{1,2}^{th}$ reliable positions of a first first code block of a second equivalent binary subgroup. The second processed information bit sub-block $V_{1,2}$ in the first parallel channel is split into two information bit sub-parts $A_{1,2}, E_{1,2}$, where $A_{1,2}$ is located at an $N*R_{1,1}+1^{th}$ to an $N*R_{2,1}^{th}$ reliable positions of a first first code block of a first equivalent binary subgroup, and $E_{1,2}$ is located at an $N*R_{1,2}+1^{th}$ to an $N*R_{2,2}^{th}$ reliable positions of a first first code block of a second equivalent binary subgroup. The third processed information bit sub-block $V_{1,3}$ in the first parallel channel is split into two information bit sub-parts $A_{1,3}, E_{1,3}$ where $A_{1,3}$ is located at an $N*R_{2,1}+1^{th}$ to an $N*R_{3,1}^{th}$ reliable positions of a first first code block of a first equivalent binary subgroup, and $E_{1,3}$ is located at an $N*R_{2,2}+1^{th}$ to an $N*R_{3,2}^{th}$ reliable positions of a first first code block of a second equivalent binary subgroup, as shown in FIG. 16. By analogy, other information bit sub-parts in the second parallel channel are also placed in the first code blocks according to the arrangement order described in the embodiment in FIG. 6, and details are not described herein again.

In the second parallel channel, one processed information bit sub-block is also split into two information bit sub-parts. For example, the first processed information bit sub-block $V_{2,1}$ in the second parallel channel is split into two information bit sub-parts $A_{2,1}, E_{2,1}$, where $A_{2,1}$ is located at a $1^{st}$ to an $N*R_{1,1}^{th}$ reliable positions of a first second code block of a first equivalent binary subgroup, and $E_{2,1}$ is located at a $1^{st}$ to an $N*R_{1,2}^{th}$ reliable positions of a first second code block of a second equivalent binary subgroup. Similarly, other information bit sub-parts in the second parallel channel are also placed in the second code blocks according to the arrangement order described in the embodiment in FIG. 6, and details are not described herein again. It should be noted that the information bit sub-parts $A_{2,1}, A_{2,2}, A_{2,3}, E_{2,1}, E_{2,2}, E_{2,3}$ in the second parallel channel are different from the information bit sub-parts $A_{1,1}, A_{1,2}, A_{1,3}, E_{1,1}, E_{1,2}, E_{1,3}$ in the first parallel channel. Other information bit sub-parts in the second parallel channel also meet the condition, and details are not described herein.

In the third parallel channel, one processed information bit sub-block is also split into two information bit sub-parts. For example, the first processed information bit sub-block $V_{3,1}$ in the third parallel channel is split into two information bit sub-parts $A_{3,1}, E_{3,1}$, where $A_{3,1}$ is located at a $1^{st}$ to an $N*R_{1,1}^{th}$ reliable positions of a first third code block of a first equivalent binary subgroup, and $E_{3,1}$ is located at a $1^{st}$ to an $N*R_{1,2}^{th}$ reliable positions of a first third code block of a second equivalent binary subgroup. Similarly, other information bit sub-parts are also placed in the third code blocks according to the arrangement order described in the embodiment in FIG. 6, and details are not described herein again. It should be noted that the information bit sub-parts $A_{3,1}, E_{3,1}, A_{3,2}, E_{3,2}, A_{3,2}, E_{3,2}$ in the third parallel channel are different from the information bit sub-parts $A_{1,1}, A_{1,2}, A_{1,3},$ $E_{1,1}$, $E_{1,2}$, $E_{1,3}$ in the first parallel channel, and are also different from the information bit sub-parts $A_{2,1}$, $A_{2,2}$, $A_{2,3}$, $E_{2,1}$, $E_{2,2}$, $E_{2,3}$ in the second parallel channel. Other information bit sub-parts in the third parallel channel also meet the condition, and details are not described herein.

In the fourth parallel channel, one processed information bit sub-block is also split into two information bit sub-parts. For example, the first processed information bit sub-block $V_{4,1}$ in the fourth parallel channel is split into two information bit sub-parts $A_{4,1}$, $E_{4,1}$, where $A_{4,1}$ is located at a $1^{st}$ to an $N*R_{1,1}{}^{th}$ reliable positions of a first fourth code block of a first equivalent binary subgroup, and $E_{4,1}$ is located at a $1^{st}$ to an $N*R_{1,2}{}^{th}$ reliable positions of a first fourth code block of a second equivalent binary subgroup. Similarly, other information bit sub-parts are also placed in the fourth code blocks according to the arrangement order described in the embodiment in FIG. 6, and details are not described herein again. It should be noted that the information bit sub-parts $A_{4,1}$, $A_{4,2}$, $A_{4,3}$, $E_{4,1}$, $E_{4,2}$, $E_{4,3}$ in the fourth parallel channel are different from the information bit sub-parts $A_{1,1}$, $A_{1,2}$, $A_{1,3}$, $E_{1,1}$, $E_{1,2}$, $E_{1,3}$ in the first parallel channel, are also different from the information bit sub-parts $A_{2,1}$, $A_{2,2}$, $A_{2,3}$, $E_{2,1}$, $E_{2,2}$, $E_{2,3}$ in the second parallel channel, and are also different from the information bit sub-parts $A_{3,1}$, $E_{3,1}$, $A_{3,2}$, $E_{3,2}$, $A_{3,2}$, $E_{3,2}$ in the third parallel channel.

The following still uses n=4 for description. The second communications device may perform hierarchical decoding on the received four data streams.

For example, assume that a sum of channel capacities of the first data stream, the second data stream, the third data stream, and the fourth data stream is greater than or equal to a code rate R. The second communications device performs decoding, in the first parallel channel, to obtain $h_1$ information bit sub-parts of one information bit block carried by a first code block in an equivalent binary subgroup with the lowest hierarchical decoding level.

The second communications device sequentially performs decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel, where the $h_1$ information bit sub-parts and the A information bit sub-parts form $k_1$ information bit sub-blocks, and the $k_1$ meets $1 \le k_1 \le Q$.

The second communications device obtains, according to $[V_{1,1}, V_{1,2}, \ldots, V_{1,k_1}]$, corresponding $[\overline{V}_{1,1}, \overline{V}_{1,2}, \ldots, \overline{V}_{1,k_1}]$ before reverse mapping.

The second communications device performs decoding, in the second parallel channel, to obtain $h_3$ information bit sub-parts of the information bit block carried by a second code block in an equivalent binary subgroup with the lowest hierarchical decoding level.

The second communications device sequentially performs decoding according to hierarchical decoding levels of equivalent binary subgroups in the first parallel channel to obtain $h_4$ information bit sub-parts respectively corresponding to (T−1) equivalent binary subgroups of the $h_3$ information bit sub-parts in the second parallel channel, where the $h_3$ information bit sub-parts and the $h_4$ information bit sub-parts form $k_2$ information bit sub-blocks, and the $k_1$ and the $k_2$ meet $k_1+k_2<Q$.

The second communications device obtains, according to $[V_{2,1}, V_{2,2}, \ldots, V_{2,k_2}]$, corresponding $[\overline{V}_{2,1}, \overline{V}_{2,2}, \ldots, \overline{V}_{2,k_2}]$ before reverse mapping.

The second communications device performs decoding, in the third parallel channel, to obtain $h_5$ information bit sub-parts of the information bit block carried by a third code block in an equivalent binary subgroup with the lowest hierarchical decoding level.

Decoding is sequentially performed according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel, where the $h_5$ information bit sub-parts and the $h_6$ information bit sub-parts form $k_3$ information bit sub-blocks, and the $k_1$, the $k_2$, and the $k_3$ satisfy $k_1+k_2+k_3<Q$.

The second communications device obtains, according to $[V_{3,1}, V_{3,2}, \ldots, V_{3,k_3}]$, corresponding $[\overline{V}_{3,1}, \overline{V}_{3,2}, \ldots, \overline{V}_{3,k_3}]$ before reverse mapping.

The second communications device performs decoding, in the fourth parallel channel, to obtain $h_7$ information bit sub-parts of the information bit block carried by a fourth code block in an equivalent binary subgroup with the lowest hierarchical decoding level.

Decoding is sequentially performed according to hierarchical decoding levels of equivalent binary subgroups in the fourth parallel channel to obtain $h_8$ information bit sub-parts respectively corresponding to (T−1) equivalent binary subgroups of the $h_7$ information bit sub-parts in the fourth parallel channel, where the $h_7$ information bit sub-parts and the $h_8$ information bit sub-parts form $k_4$ information bit sub-blocks, and the $k_1$, the $k_2$, the $k_3$ and the $k_4$ satisfy $k_1+k_2+k_3+k_4 \ge Q$.

The second communications device obtains, according to $[V_{4,1}, V_{4,2}, \ldots, V_{4,k_4}]$, corresponding $[\overline{V}_{4,1}, \overline{V}_{4,2}, \ldots, \overline{V}_{4,k_4}]$ before reverse mapping.

The second communications device may obtain the symbol sequence $\tilde{V}$ according to $[\overline{V}_{1,1}, \overline{V}_{1,2}, \ldots, \overline{V}_{1,k_1}]$, $[\overline{V}_{2,1}, \overline{V}_{2,2}, \ldots, \overline{V}_{2,k_2}]$, $[\overline{V}_{3,1}, \overline{V}_{3,2}, \ldots, \overline{V}_{3,k_3}]$, $[\overline{V}_{4,1}, \overline{V}_{4,2}, \ldots, \overline{V}_{4,k_4}]$, and a property of the UDM.

Then, the second communications device reversely maps $\tilde{V}$ from the finite field with $2^w$ elements to the binary field, to obtain Q information bit sub-blocks $[v_1, v_2, \ldots, v_Q]$ included in the information bit block.

For example, it is assumed that a channel capacity of the first parallel channel is greater than or equal to R/4, a channel capacity of the second parallel channel is greater than or equal to R/4, a channel capacity of the third parallel channel is greater than or equal to R/4, and a channel capacity of the fourth parallel channel is greater than or equal to R/4. In this case, according to the foregoing decoding procedure, the second communications device may correctly decode the received plurality of data streams.

An embodiment of this application provides a data processing method. The method is implemented by interaction between a first communications device and a second communications device. The first communications device obtains a plurality of binary sequences, and the plurality of binary sequences are transmitted by using S parallel channels. The first communications device respectively places, in each parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}{}^{th}$ reliable positions of an $x^{th}$ to-be-encoded block to an $(x+Q-1)^{th}$ to-be-encoded block in T equivalent binary subgroups. The first communications device separately performs polar code encoding on sub-blocks of the information bit block in each parallel channel, and then sends encoded S data streams to the second communications device. The second communications device receives the S data streams, and performs hierarchical decoding according to a hierarchical decoding level of an equivalent binary subgroup, to obtain decoded data. It can be learned that the data processing method helps improve a transmission rate in a parallel channel transmission scenario. In addition, in the plurality of parallel channels, information bits are arranged in a specific order, which helps the second communications device correctly perform decoding.

An apparatus and a device in the embodiments of this application are described in detail below with reference to FIG. 17 to FIG. 20.

Figure 17:
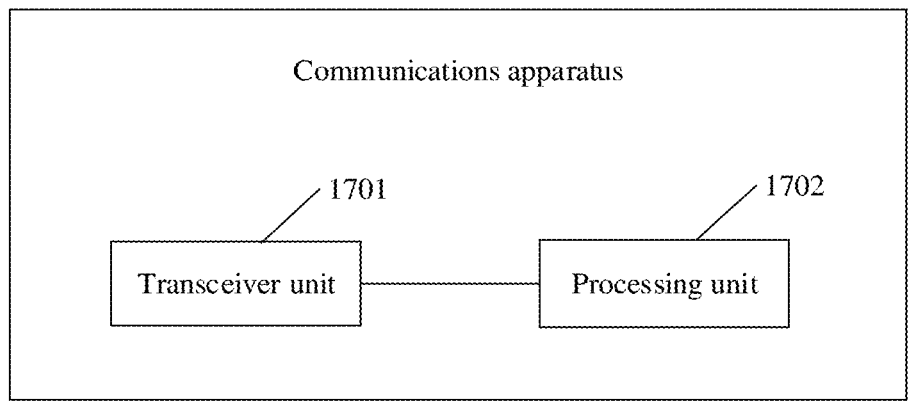
FIG. 17 is a schematic diagram of a communications apparatus according to an embodiment of this application.

An embodiment of this application provides a communications apparatus. As shown in FIG. 17, the communications apparatus is configured to implement the method performed by the first communications device in the foregoing method embodiment, and specifically includes:

a transceiver unit 1701, configured to obtain a plurality of binary sequences, where the plurality of binary sequences are transmitted by using S parallel channels; each parallel channel includes T equivalent binary subgroups, and one equivalent binary subgroup carries one binary sequence; one parallel channel includes X information bit blocks, and each information bit block includes K information bits; one information bit block is divided into Q information bit sub-blocks, and each information bit sub-block is a binary sequence with a length of K/Q; in a first parallel channel of the S parallel channels, K information bits in each information bit block are arranged according to a first order; in a second parallel channel of the S parallel channels, K information bits in each information bit block are arranged according to a second order; and the second order is different from the first order, and the second order and the first order meet a mapping relationship; and a processing unit 1702, configured to respectively place, in each parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, where q meets $1 \leq q \leq Q$ and $R_{1,t}$, $R_{2,t}, \ldots, R_{Q,t}$ is a code rate of the first Q to-be-encoded blocks in a $t^{th}$ equivalent binary subgroup, N is a code length, and x meets $1 \leq x \leq X$; t meets $1 \leq t \leq T$; T is greater than or equal to 2; a sum of bit sizes of T equivalent binary subgroups in an $s^{th}$ parallel channel occupied by a $q^{th}$ information bit sub-block of the $x^{th}$ information bit block is K/Q; and s meets $1 \leq s \leq S$.

The processing unit 1702 is further configured to perform polar code encoding on M first to-be-encoded blocks in each equivalent binary subgroup separately for the T equivalent binary subgroups in the first parallel channel, to obtain M first code blocks in each equivalent binary subgroup.

The processing unit 1702 is further configured to perform polar code encoding on M second to-be-encoded blocks in each equivalent binary subgroup separately for the T equivalent binary subgroups in the second parallel channel, to obtain M second code blocks in each equivalent binary subgroup.

The transceiver unit 1701 is further configured to send a first data stream and a second data stream to a second communications device, where the first data stream includes a $2^T$-order high-order signal obtained by mapping information bits in T*M first code blocks in the first parallel channel, and the second data stream includes a $2^T$-order high-order signal obtained by mapping information bits in T*M second code blocks in the second parallel channel.

In an implementation, the to-be-encoded blocks include a first to-be-encoded block in the first parallel channel and/or a second to-be-encoded block in the second parallel channel; the processing unit 1702 is configured to respectively place, in each parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, and is specifically configured to:

place, in the first parallel channel, a first information bit sub-block in the Q information bit sub-blocks of the $x^{th}$ information bit block, in the $x^{th}$ timeslot, at a first to an $N*R_{1,t}^{th}$ reliable positions of an $x^{th}$ first to-be-encoded block in T equivalent binary subgroups, where a value of $R_{0,t}$ is 0; and place, in an $(x+1)^{th}$ timeslot, a second information bit sub-block in the Q information bit sub-blocks of the $x^{th}$ information bit block at an $N*R_{1,t}+1^{th}$ to an $N*R_{2,t}^{th}$ reliable positions of $(x+1)$ first to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ first to-be-encoded block in the T equivalent binary subgroups; and place, in the second parallel channel, a first information bit sub-block in the Q information bit sub-blocks of the $x^{th}$ information bit block, in the $x^{th}$ timeslot, at a first to an $N*R_{1,t}^{th}$ reliable positions of an $x^{th}$ second to-be-encoded block in T equivalent binary subgroups; and place, in an $(x+1)^{th}$ timeslot, a second information bit sub-block in the Q information bit sub-blocks of the $x^{th}$ information bit block at an $N*R_{1,t}+1^{th}$ to an $N*R_{2,t}^{th}$ reliable positions of $(x+1)$ second to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, in the $N*R_{(Q-1),t}+1^{th}$ to the $N*R_{Q,t}^{th}$ reliable positions of the $(x+Q-1)^{th}$ second to-be-encoded block in the T equivalent binary subgroups.

In an implementation, the first order is an information bit transmission order $u_1, u_2, \ldots, u_K$, and the second order is a reversed order $u_K, u_{K-1}, \ldots, u_1$ of the first order; or the first order and the second order meet the following mapping relationship:

$$U=[u_1,u_2,\ldots,u_K]$$

$$\overline{U}=[0,0,\ldots,0,u_1,u_2,\ldots,u_K]$$

$$\tilde{U}=[\tilde{u}_1,\tilde{u}_2,\ldots,\tilde{u}_{2^P}]$$

$$\tilde{U}=\overline{U}F^{\otimes P}$$

U represents any information bit block, $u_k$ represents any information bit in U, $\tilde{u}_k$ in some information bits $[\tilde{u}_1, \tilde{u}_2, \ldots, \tilde{u}_K]$ in $\tilde{U}$ is a corresponding information bit after $u_k$ is mapped, F is a generator matrix of a polar code, a length of $\overline{U}$ is $H=2^P$, H is greater than or equal to K, and k meets $1 \leq k \leq K$.

In an implementation, in a third parallel channel of the S parallel channels, K information bits in each information bit block are arranged according to a second order, and a second order used for the third parallel channel is different from a second order used for the second parallel channel. The processing unit 1702 is further configured to:

respectively place, in the third parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ third to-be-encoded block to an $(x+Q-1)^{th}$ third to-be-encoded block in T equivalent binary subgroups; and perform polar code encoding on M third to-be-encoded blocks in each equivalent binary subgroup separately for the T equivalent binary subgroups in the third parallel channel, to obtain M third code blocks.

The transceiver unit 1701 is configured to send a first data stream and a second data stream to the second communications device, and is specifically configured to:

send the first data stream, the second data stream, and a third data stream to the second communications device, where the third data stream includes a $2^T$-order high-order signal obtained by mapping information bits in T*M third code blocks in the third parallel channel.

In an implementation, the processing unit 1702 is further configured to:

map, in an $s^{th}$ parallel channel of the S parallel channels, K information bits of each information bit block from a binary field to a finite field with $2^w$ elements, to obtain a corresponding symbol sequence obtained after each information bit block is mapped, where a length of the symbol sequence is K/w, and the w is a positive integer greater than 1;

convert each symbol sequence, where any symbol sequence and a symbol sequence obtained after conversion of the any symbol sequence satisfy the following relationship:

$$\overline{A} = \tilde{A} * H_s$$

$\tilde{A}$ is the any symbol sequence, $\tilde{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets $1 \leq s \leq S$, and S is a positive integer greater than 3;

perform reverse mapping on $\overline{A}$ to obtain a corresponding information bit block $[A_{s,1}, A_{s,2}, \ldots, A_{s,K}]$ after the reverse mapping of $\overline{A}$, where $A_{s,k}$ is a corresponding information bit after the reverse mapping;

divide K information bits corresponding to each information bit block after the reverse mapping into Q information bit sub-blocks;

respectively place, in the $s^{th}$ parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ $s^{th}$ to-be-encoded block to an $(x+Q-1)^{th}s^{th}$ to-be-encoded block in T equivalent binary subgroups; and perform polar code encoding on M $s^{th}$ to-be-encoded blocks in each equivalent binary subgroup separately for the T equivalent binary subgroups in the $s^{th}$ parallel channel, to obtain M $s^{th}$ code blocks in each equivalent binary subgroup.

The transceiver unit 1701 is configured to send a first data stream and a second data stream to the second communications device, and is specifically configured to:

send the first data stream, the second data stream, until the $s^{th}$ data stream to the second communications device, where the $s^{th}$ data stream includes a $2^T$-order high-order signal obtained by mapping information bits in T*M $s^{th}$ code blocks in the $s^{th}$ parallel channel.

In an implementation, any one of code blocks carries at least one information bit sub-block and carries at most Q information bit sub-blocks, and the code blocks include the first code block and the second code block.

In an implementation, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

In an implementation, the Q is a quantization order of a code rate R, and the Q is a positive integer; a sum of code rates of $i^{th}$ code blocks respectively corresponding to the T equivalent binary subgroups is i×R/Q, and the i meets $1 \leq i \leq Q$.

A sum of code rates of $j^{th}$ code blocks respectively corresponding to the T equivalent binary subgroups is (M−j+1)×R/Q, and the j meets $Q+1 \leq j \leq M$; alternatively, a sum of code rates of $j^{th}$ code blocks respectively corresponding to the T equivalent binary subgroups is Q*R/Q, and the j meets $Q+1 \leq j \leq M$.

Figure 18:
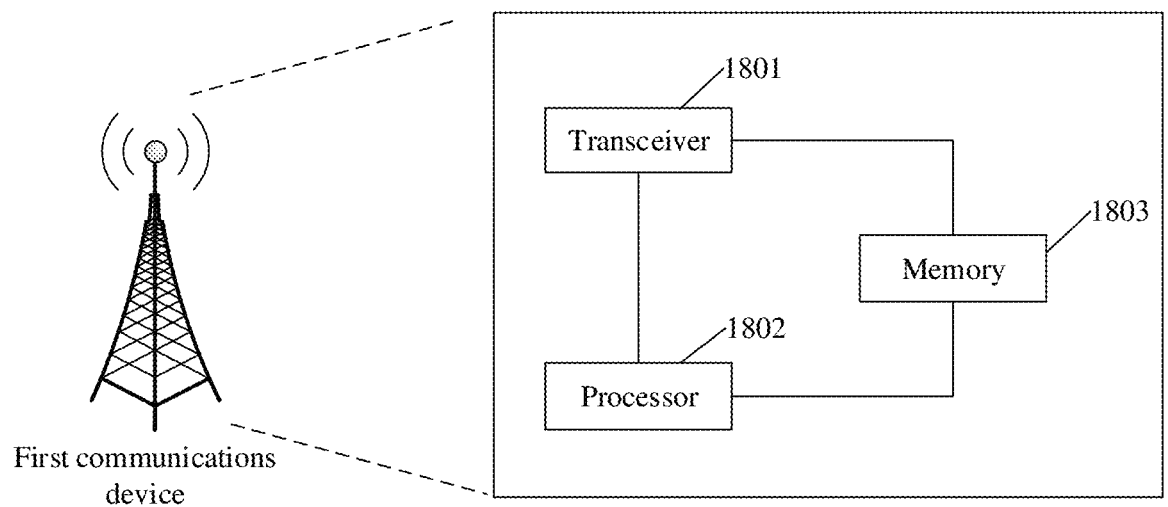
FIG. 18 is a schematic diagram of a first communications device according to an embodiment of this application.

In an implementation, related functions implemented by the units in FIG. 17 may be implemented by using a transceiver and a processor. Referring to FIG. 18, FIG. 18 is a schematic diagram of a structure of a first communications device according to an embodiment of this application. The first communications device may be a device (for example, a chip) with a data processing function described in the embodiments of this application. The first communications device may include a transceiver 1801, at least one processor 1802, and a memory 1803. The transceiver 1801, the processor 1802, and the memory 1803 may be connected to each other through one or more communication buses, or may be connected to each other in another manner.

The transceiver 1801 may be configured to send data or receive data. It may be understood that the transceiver 1801 is a general term, and may include a receiver and a transmitter. For example, the receiver is configured to obtain a plurality of binary sequences. For another example, the transmitter is configured to send a first data stream and a second data stream.

The processor 1802 may be configured to process data of the first communications device, or process data to be sent by the transceiver 1801. The processor 1802 may include one or more processors. For example, the processor 1802 may be one or more central processing units (CPU), one or more network processors (NP), one or more hardware chips, or any combination thereof. When the processor 1802 is one CPU, the CPU may be a single-core CPU or may be a multi-core CPU.

The memory 1803 is configured to store the program code and the like. The memory 1803 may include a volatile memory such as a random access memory (RAM). The memory 1803 may alternatively include a non-volatile memory such as a read-only memory (ROM), a flash memory), a hard disk drive (HDD), or a solid-state drive (SSD). The memory 1803 may further include a combination of the foregoing types of memories.

The processor 1802 and the memory 1803 may be coupled through an interface, or may be integrated together. This is not limited in this embodiment.

The transceiver 1801 and the processor 1802 may be configured to implement the data processing method in embodiments of this application. Specific implementations are as follows:

The transceiver 1801 is configured to obtain a plurality of binary sequences. The plurality of binary sequences are transmitted by using S parallel channels. Each parallel channel includes T equivalent binary subgroups, and one equivalent binary subgroup carries one binary sequence. One parallel channel includes X information bit blocks, and each information bit block includes K information bits. One information bit block is divided into Q information bit sub-blocks, and each information bit sub-block is a binary sequence with a length of K/Q. In a first parallel channel of the S parallel channels, K information bits in each information bit block are arranged according to a first order. In a second parallel channel of the S parallel channels, K information bits in each information bit block are arranged according to a second order. The second order is different from the first order, and the second order and the first order meet a mapping relationship.

The processor 1802 is configured to respectively place, in each parallel channel, Q information bit sub-blocks of an $x^{th}$ information bit block, respectively in an $x^{th}$ timeslot to an $(x+Q-)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, where q meets $1 \leq q \leq Q$ and $R_{1,t}, R_{2,t}, \ldots, R_{Q,t}$ is a code rate of the first Q to-be-encoded blocks in a $t^{th}$ equivalent binary subgroup, N is a code length, and x meets $1 \leq x \leq X$; t meets $1 \leq t \leq T$; T is greater than or equal to 2; a sum of bit sizes of T equivalent binary subgroups in an $s^{th}$ parallel channel occupied by a $q^{th}$ information bit sub-block of the $x^{th}$ information bit block is K/Q; and s meets $1 \leq s \leq S$.

The processor 1802 is further configured to perform polar code encoding on M first to-be-encoded blocks in each equivalent binary subgroup separately for the T equivalent binary subgroups in the first parallel channel, to obtain M first code blocks in each equivalent binary subgroup.

The processor 1802 is further configured to perform polar code encoding on M second to-be-encoded blocks in each equivalent binary subgroup separately for the T equivalent binary subgroups in the second parallel channel, to obtain M second code blocks in each equivalent binary subgroup.

The transceiver 1801 is further configured to send a first data stream and a second data stream to a second communications device, where the first data stream includes a $2^T$-order high-order signal obtained by mapping information bits in T*M first code blocks in the first parallel channel, and the second data stream includes a $2^T$-order high-order signal obtained by mapping information bits in T*M second code blocks in the second parallel channel.

In an implementation, the to-be-encoded blocks include a first to-be-encoded block in the first parallel channel and/or a second to-be-encoded block in the second parallel channel; the processor 1802 is configured to respectively place, in each parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, and is specifically configured to:

in the first parallel channel, place a first information bit sub-block in the Q information bit sub-blocks of the $x^{th}$ information bit block, in the $x^{th}$ timeslot, at a first to an $N*R_{1,t}^{th}$ reliable positions of an $x^{th}$ first to-be-encoded block in T equivalent binary subgroups; where a value of $R_{0,t}$ is 0; and place, in an $(x+1)^{th}$ timeslot, a second information bit sub-block in the Q information bit sub-blocks of the $x^{th}$ information bit block at an $N*R_{1,t}+1^{th}$ to an $N*R_{2,t}^{th}$ reliable positions of (x+1) first to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $N*R_{Q,t}^{th}$ reliable positions of the $(x+Q-1)^{th}$ first to-be-encoded block in the T equivalent binary subgroups; and place, in the second parallel channel, a first information bit sub-block in the Q information bit sub-blocks of the $x^{th}$ information bit block, in the $x^{th}$ timeslot, at a first to an $N*R_{1,t}^{th}$ reliable positions of an $x^{th}$ second to-be-encoded block in T equivalent binary subgroups; and place, in an $(x+1)^{th}$ timeslot, a second information bit sub-block in the Q information bit sub-blocks of the $x^{th}$ information bit block at an $N*R_{1,t}+1^{th}$ to an $N*R_{2,t}^{th}$ reliable positions of (x+1) second to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, in the $N*R_{(Q-1),t}+1^{th}$ to the $N*R_{Q,t}^{th}$ reliable positions of the $(x+Q-1)^{th}$ second to-be-encoded block in the T equivalent binary subgroups.

In an implementation, the first order is an information bit transmission order $u_1, u_2, \ldots, u_K$, and the second order is a reversed order $u_K, u_{K-1}, \ldots, u_1$ of the first order; or the first order and the second order meet the following mapping relationship:

$$U=[u_1,u_2,\ldots,u_K]$$

$$\overline{U}=[0,0,\ldots,0,u_1,u_2,\ldots,u_K]$$

$$\tilde{U}=[\tilde{u}_1,\tilde{u}_2,\ldots,\tilde{u}_{2^P}]$$

$$\tilde{U}=\overline{U}F^{\otimes P}$$

U represents any information bit block, $u_k$ represents any information bit in U, $\tilde{u}_k$ in some information bits $[\tilde{u}_1, \tilde{u}_2, \ldots \tilde{u}_K]$ in U is a corresponding information bit after the $u_k$ is mapped, F is a generator matrix of a polar code, a length of U is $H=2^P$, H is greater than or equal to K, and k meets $1 \leq k \leq K$.

In an implementation, in a third parallel channel of the S parallel channels, K information bits in each information bit block are arranged according to a second order, and a second order used for the third parallel channel is different from a second order used for the second parallel channel. The processor 1802 is further configured to:

respectively place, in the third parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ third to-be-encoded block to an $(x+Q-1)^{th}$ third to-be-encoded block in T equivalent binary subgroups; and perform polar code encoding on M third to-be-encoded blocks in each equivalent binary subgroup separately for the T equivalent binary subgroups in the third parallel channel, to obtain M third code blocks.

The transceiver 1801 is configured to send a first data stream and a second data stream to the second communications device, and is specifically configured to:

send the first data stream, the second data stream, and a third data stream to the second communications device, where the third data stream includes a $2^T$-order high-order signal obtained by mapping information bits in T*M third code blocks in the third parallel channel.

In an implementation, the processor 1802 is further configured to:

map, in an $s^{th}$ parallel channel of the S parallel channels, K information bits of each information bit block from a binary field to a finite field with $2^w$ elements, to obtain a corresponding symbol sequence obtained after each information bit block is mapped, where a length of the symbol sequence is K/w, and the w is a positive integer greater than 1;

convert each symbol sequence, where any symbol sequence and a symbol sequence obtained after conversion of the any symbol sequence satisfy the following relationship:

$$\overline{A} = \tilde{A} * H_s$$

$\tilde{A}$ is the any symbol sequence, $\overline{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets 1≤s≤S, and S is a positive integer greater than 3;

perform reverse mapping on $\overline{A}$ to obtain a corresponding information bit block $[A_{s,1}, A_{s,2}, \ldots, A_{s,K}]$ after the reverse mapping of $\overline{A}$, where $A_{s,k}$ is a corresponding information bit after the reverse mapping;

divide K information bits corresponding to each information bit block after the reverse mapping into Q information bit sub-blocks;

respectively place, in the $s^{th}$ parallel channel, Q information bit sub-blocks of an $x^{th}$ information bit block, respectively in an $x^{th}$ timeslot to an $(x+Q-1)^{th}$ timeslot, at an $N*R_{(q-1),t}+1^{th}$ to an $N*R_{q,t}^{th}$ reliable positions of an $x^{th}$ to-be-encoded block to an $(x+Q-1)^{th}$ $s^{th}$ to-be-encoded block in T equivalent binary subgroups; and perform polar code encoding on M $s^{th}$ to-be-encoded blocks in each equivalent binary subgroup separately for the T equivalent binary subgroups in the $s^{th}$ parallel channel, to obtain M $s^{th}$ code blocks in each equivalent binary subgroup.

The transceiver 1801 is configured to send a first data stream and a second data stream to the second communications device, and is specifically configured to:

send the first data stream, the second data stream, until the $s^{th}$ data stream to the second communications device, where the $s^{th}$ data stream includes a $2^T$-order high-order signal obtained by mapping information bits in T*M $s^{th}$ code blocks in the $s^{th}$ parallel channel.

In an implementation, any one of code blocks carries at least one information bit sub-block and carries at most Q information bit sub-blocks, and the code blocks include the first code block and the second code block.

In an implementation, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

In an implementation, the Q is a quantization order of a code rate R, and the Q is a positive integer; a sum of code rates of $i^{th}$ code blocks respectively corresponding to the T equivalent binary subgroups is i×R/Q, and the i meets 1≤i≤Q.

A sum of code rates of $j^{th}$ code blocks respectively corresponding to the T equivalent binary subgroups is (M−j+1)×R/Q, and the j meets Q+1≤j≤M alternatively, a sum of code rates of $j^{th}$ code blocks respectively corresponding to the T equivalent binary subgroups is Q*R/Q, and the j meets Q+1≤j≤M.

Figure 19:
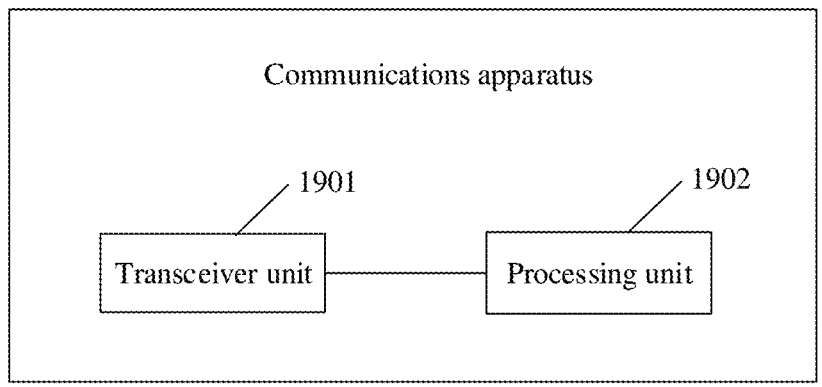
FIG. 19 is a schematic diagram of another communications apparatus according to an embodiment of this application.

An embodiment of this application provides a communications apparatus. As shown in FIG. 19, the communications apparatus is configured to implement the method performed by the second communications device in the foregoing method embodiment, and specifically includes:

a transceiver unit 1901, configured to receive a first data stream and a second data stream that are sent by a first communications device by using S parallel channels, where the first data stream includes a $2^T$-order high-order signal obtained by mapping information bits in T*M first code blocks in a first parallel channel of the S parallel channels, and the T*M first code blocks are obtained by performing polar code encoding on T*M first to-be-encoded blocks; the second data stream includes a $2^T$-order high-order signal obtained by mapping information bits in T*M second code blocks in a second parallel channel of the S parallel channels, and the T*M second code blocks are obtained by performing polar code encoding on T*M second to-be-encoded blocks; one parallel channel includes X information bit blocks, and each information bit block includes K information bits; one information bit block is divided into Q information bit sub-blocks, and each information bit sub-block is a binary sequence with a length of K/Q; in the first parallel channel, K information bits in each information bit block are arranged according to a first order; in the second parallel channel, K information bits in each information bit block are arranged according to a second order; and the second order is different from the first order, and the second order and the first order meet a mapping relationship;

where, in each parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, where q meets 1≤q≤Q and $R_{1,t}, R_{2,t}, \ldots, R_{Q,t}$ is a code rate of the first Q to-be-encoded blocks in a $t^{th}$ equivalent binary subgroup, N is a code length, x meets 1≤x≤X, and t meets 1≤t≤T; a sum of bit sizes of T equivalent binary subgroups in an $s^{th}$ parallel channel occupied by a $q^{th}$ information bit sub-block of the $x^{th}$ information bit block is K/Q; and s meets $1 \leq s \leq S$; and a processing unit 1902, configured to perform hierarchical decoding according to the hierarchical decoding level of the equivalent binary subgroup, to acquire decoded data.

In an implementation, the to-be-encoded blocks include a first to-be-encoded block in the first parallel channel and/or a second to-be-encoded block in the second parallel channel; in each parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, including:

respectively occupy, in the first parallel channel, by a first information bit sub-block in the Q information bit sub-blocks of the $x^{th}$ information bit block, in the $x^{th}$ timeslot, a first to an $N*R_{1,t}^{th}$ reliable positions of an xi first to-be-encoded block in the T equivalent binary subgroups, where a value of $R_{0,t}$ is 0; respectively occupy, in an $(x+1)^{th}$ timeslot, by a second information bit sub-block in the Q information bit sub-blocks of the $x^{th}$ information bit block, an $N*R_{1,t}+1^{th}$ to an $N*R_{2,t}^{th}$ reliable positions of $(x+1)$ first to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ first to-be-encoded block in the T equivalent binary subgroups; and respectively occupy, in the second parallel channel, by a first information bit sub-block in the Q information bit sub-blocks of the $x^{th}$ information bit block, in the $x^{th}$ timeslot, a first to an $N*R_{1,t}^{th}$ reliable positions of an $x^{th}$ second to-be-encoded block in the T equivalent binary subgroups; and respectively occupy, in an $(x+1)^{th}$ timeslot, by a second information bit sub-block in the Q information bit sub-blocks of the $x^{th}$ information bit block, an $N*R_{1,t}^{th}$ to an $N*R_{2,t}^{th}$ reliable positions of $(x+1)$ second to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ second to-be-encoded block in the T equivalent binary subgroups.

In an implementation, the first order is an information bit transmission order $u_1, u_2, \ldots, u_K$, and the second order is a reversed order $u_K, u_{K-1}, \ldots, u_1$ of the first order; or the first order and the second order meet the following mapping relationship:

$$U = [u_1, u_2, \ldots, u_K]$$

$$\overline{U} = [0, 0, \ldots, 0, u_1, u_2, \ldots, u_K]$$

$$\tilde{U} = [\tilde{u}_1, \tilde{u}_2, \ldots, \tilde{u}_{2^P}]$$

$$\tilde{U} = \overline{U} F^{\otimes P}$$

U represents any information bit block, $u_k$ represents any information bit in U, $\tilde{u}_k$ in some information bits $[\tilde{u}_1, \tilde{u}_2, \ldots, \tilde{u}_K]$ in $\tilde{U}$ is a corresponding information bit after the $u_k$ is mapped, F is a generator matrix of a polar code, a length of $\overline{U}$ is $H = 2^P$, H is greater than or equal to K, and k meets $1 \leq k \leq K$.

In an implementation, that the processing unit 1902 is configured to perform hierarchical decoding according to a hierarchical decoding level of an equivalent binary subgroup, to obtain decoded data is specifically configured to:

if a sum of channel capacities of the first parallel channel and the second parallel channel is greater than or equal to a code rate R, perform decoding, in the first parallel channel, to obtain $h_1$ information bit sub-parts included in an information bit block carried by a first code block in an equivalent binary subgroup with a lowest hierarchical decoding level; sequentially perform decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel; where the $h_1$ information bit sub-parts and the $h_2$ information bit sub-parts form $k_1$ information bit sub-blocks, and the $k_1$ meets $1 \leq k_1 \leq Q$;

perform decoding, in the second parallel channel, to obtain $h_3$ information bit sub-parts of the information bit block carried by a second code block in an equivalent binary subgroup with the lowest hierarchical decoding level; sequentially perform decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel; where the $h_3$ information bit sub-parts and the $h_4$ information bit sub-parts form $k_2$ information bit sub-blocks, and the $k_1$ and the $k_2$ satisfy $k_1 + k_2 \geq Q$; and obtain the Q information bit sub-blocks included in the information bit block as a set formed by the $k_1$ information bit sub-blocks and the $k_2$ information bit sub-blocks.

In an implementation, that the transceiver unit 1901 is configured to receive a first data stream and a second data stream that are sent by a first communications device by using S parallel channels is specifically configured to:

receive the first data stream, the second data stream, and a third data stream that are sent by the first communications device by using the S parallel channels. The third data stream includes a $2^T$-order high-order signal obtained by mapping information bits in T*M third code blocks in the third parallel channel, and the T*M third code blocks are obtained by performing polar code encoding on T*M third to-be-encoded blocks. In the third parallel channel, K information bits in the one information bit block are arranged according to a second order, and a second order used for information bits in the third parallel channel is different from a second order used for information bits in the second parallel channel.

That the processing unit 1902 is configured to perform hierarchical decoding according to a hierarchical decoding level of an equivalent binary subgroup, to obtain decoded data is specifically configured to:

if a sum of channel capacities of the first parallel channel, the second parallel channel, and the third parallel channel is greater than or equal to a code rate R, perform decoding, in the first parallel channel, to obtain $h_1$ information bit sub-parts included in an information bit block carried by a first code block in an equivalent binary subgroup with a lowest hierarchical decoding level; sequentially perform decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel; where the $h_1$ information bit sub-parts and the $h_2$ information bit sub-parts form $k_1$ information bit sub-blocks, and the $k_1$ meets $1 \leq k_1 < Q$;

perform decoding, in the second parallel channel according to a second order of an information bit arrangement in the second parallel channel, to obtain $h_3$ information bit sub-parts of the information bit block carried by a second code block in an equivalent binary subgroup with the lowest hierarchical decoding level; sequentially perform decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel; where the $h_3$ information bit sub-parts and the $h_4$ information bit sub-parts form $k_2$ information bit sub-blocks, and the $k_1$ and the $k_2$ satisfy $k_1+k_2 < Q$; and perform decoding, in the third parallel channel according to a second order of an information bit arrangement in the third parallel channel, to obtain $h_5$ information bit sub-parts of the information bit block carried by a third code block in an equivalent binary subgroup with the lowest hierarchical decoding level; sequentially perform decoding according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel; where the $h_5$ information bit sub-parts and the $h_6$ information bit sub-parts form $k_3$ information bit sub-blocks, and the $k_1$, the $k_2$ and $k_3$ meet $k_1+k_2+k_3 \geq Q$; and obtain the Q information bit sub-blocks included in the information bit block as a set formed by the $k_1$ information bit sub-blocks, the $k_2$ information bit sub-blocks, and the $k_3$ information bit sub-blocks.

In an implementation, that the transceiver unit 1901 is configured to receive a first data stream and a second data stream that are sent by a first communications device by using S parallel channels is specifically configured to:

in an implementation, receive the first data stream, the second data stream, until the $s^{th}$ data stream that are sent by the first communications device by using the S parallel channels, where an $s^{th}$ data stream in the first data stream, the second data stream, until the $s^{th}$ data stream includes a $2^T$-order high-order signal obtained by mapping information bits in T*M $s^{th}$ code blocks in an $s^{th}$ parallel channel of the S parallel channels. The T*M $s^{th}$ code blocks are obtained by performing polar code encoding on T*M $s^{th}$ to-be-encoded blocks; and K information bits in each processed information bit block are arranged according to the first order.

In the $s^{th}$ parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ $s^{th}$ to-be-encoded block to an $(x+Q-1)^{th}$ $s^{th}$ to-be-encoded block in T equivalent binary subgroups. Processing on each information bit block meets the following condition:

K information bits of each information bit block are mapped from a binary field to a finite field with $2^w$ elements, each information bit block after mapping corresponds to a symbol sequence, a length of the symbol sequence is K/w, and the w is a positive integer greater than 1. Any symbol sequence and a symbol sequence obtained after conversion of the any symbol sequence satisfy the following relationship:

$$\overline{A} = \tilde{A} * H_s$$

$\tilde{A}$ is the any symbol sequence, $\overline{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets $1 \leq s \leq S$, and S is a positive integer greater than 3. A corresponding information bit block after the reverse mapping of $\overline{A}$ is $([A_{s,1}, A_{s,2}, \ldots, A_{s,K}]$, and $A_{s,k}$ is a corresponding information bit after the reverse mapping.

In an implementation, any one of code blocks carries at least one information bit sub-block and carries at most Q information bit sub-blocks, and the code blocks include the first code block and the second code block.

In an implementation, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

In an implementation, the Q is a quantization order of a code rate R, and the Q is a positive integer; a sum of code rates of $i^{th}$ code blocks respectively corresponding to the T equivalent binary subgroups is i×R/Q, and the i meets $1 \leq i \leq Q$.

A sum of code rates of $j^{th}$ code blocks respectively corresponding to the T equivalent binary subgroups is (M−j+1)×R/Q, and the j meets $Q+1 \leq j \leq M$; alternatively, a sum of code rates of $j^{th}$ code blocks respectively corresponding to the T equivalent binary subgroups is Q*R/Q, and the j meets $Q+1 \leq j \leq M$.

Figure 20:
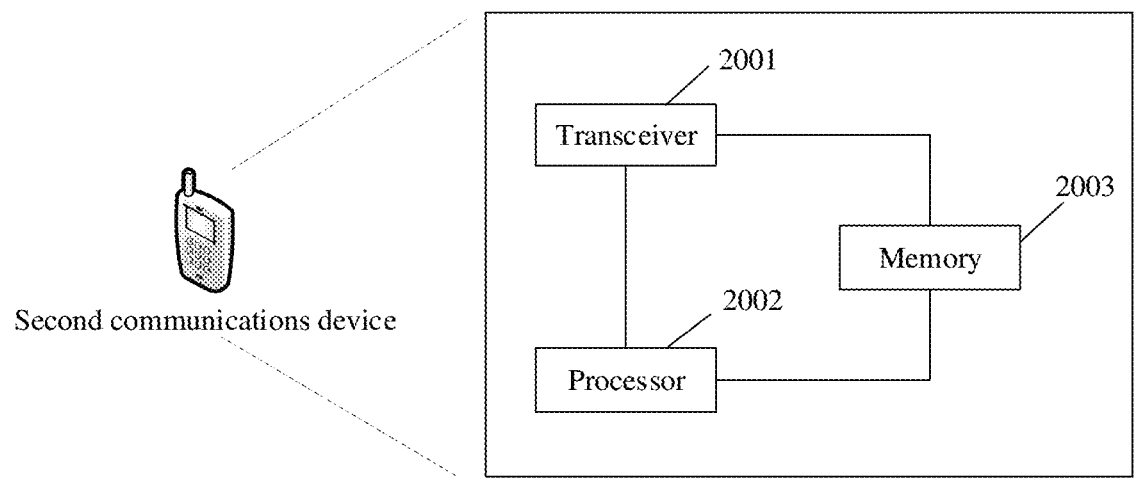
FIG. 20 is a schematic diagram of a second communications device according to an embodiment of this application.

In an implementation, related functions implemented by the units in FIG. 19 may be implemented by using a transceiver and a processor. Referring to FIG. 20, FIG. 20 is a schematic diagram of a structure of a second communications device according to an embodiment of this application. The second communications device may be a device (for example, a chip) with a data processing function described in the embodiments of this application. The second communications device may include a transceiver 2001, at least one processor 2002, and a memory 2003. The transceiver 2001, the processor 2002, and the memory 2003 may be connected to each other through one or more communication buses, or may be connected to each other in another manner.

The transceiver 2001 may be configured to send data or receive data. It may be understood that the transceiver 2001 is a general term, and may include a receiver and a transmitter. For example, the receiver is configured to receive a first data stream and a second data stream.

The processor 2002 may be configured to process data of the second communications device, or process data received by the transceiver 2001. For example, the processor 2002 may invoke program code stored in the memory 2003, to implement hierarchical decoding on the received plurality of data streams. The processor 2002 may include one or more processors. For example, the processor 2002 may be one or more central processing units (CPU), one or more network processors (NP), one or more hardware chips, or any combination thereof. When the processor 2002 is one CPU, the CPU may be a single-core CPU or may be a multi-core CPU.

The memory 2003 is configured to store the program code and the like. The memory 2003 may include a volatile memory such as a random access memory (RAM). The memory 2003 may alternatively include a non-volatile memory such as a read-only memory (ROM), a flash memory, a hard disk drive (HDD), or a solid-state drive (SSD). The memory 2003 may further include a combination of the foregoing types of memories.

The processor 2002 and the memory 2003 may be coupled through an interface, or may be integrated together. This is not limited in this embodiment.

The transceiver 2001 and the processor 2002 may be configured to implement the data processing method in embodiments of this application. Specific implementations are as follows:

The transceiver 2001 is configured to receive a first data stream and a second data stream that are sent by a first communications device by using S parallel channels, where the first data stream includes a $2^T$-order high-order signal obtained by mapping information bits in T*M first code blocks in a first parallel channel of the S parallel channels, and the T*M first code blocks are obtained by performing polar code encoding on T*M first to-be-encoded blocks; the second data stream includes a $2^T$-order high-order signal obtained by mapping information bits in T*M second code blocks in a second parallel channel of the S parallel channels, and the T*M second code blocks are obtained by performing polar code encoding on T*M second to-be-encoded blocks. One parallel channel includes X information bit blocks, and each information bit block includes K information bits. One information bit block is divided into Q information bit sub-blocks, and each information bit sub-block is a binary sequence with a length of K/Q. In the first parallel channel, K information bits in each information bit block are arranged according to a first order; and in the second parallel channel, K information bits in each information bit block are arranged according to a second order. The second order is different from the first order, and the second order and the first order meet a mapping relationship.

In each parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, where q meets 1≤q≤Q and $R_{1,t}, R_{2,t}, \ldots, R_{Q,t}$ is a code rate of the first Q to-be-encoded blocks in a $t^{th}$ equivalent binary subgroup, N is a code length, x meets 1≤x≤X, and t meets 1≤t≤T; a sum of bit sizes of T equivalent binary subgroups in an $s^{th}$ parallel channel occupied by a $q^{th}$ information bit sub-block of the $x^{th}$ information bit block is K/Q; and s meets 1≤s≤S.

The processor 2002 is configured to perform hierarchical decoding according to a hierarchical decoding level of an equivalent binary subgroup, to obtain decoded data.

In an implementation, in the first parallel channel, a first information bit sub-block in the Q information bit sub-blocks of the $x^{th}$ information bit block respectively occupies, in the $x^{th}$ timeslot, a first to an $N*R_{1,t}^{th}$ reliable positions of an $x^{th}$ first to-be-encoded block in the T equivalent binary subgroups, where a value of $R_{0,t}$ is 0. In an $(x+1)^{th}$ timeslot, a second information bit sub-block in the Q information bit sub-blocks of the $x^{th}$ information bit block respectively occupies, an $N*R_{1,t}+1^{th}$ to an $N*R_{2,t}^{th}$ reliable positions of (x+1) first to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ first to-be-encoded block in the T equivalent binary subgroups.

In the second parallel channel, a first information bit sub-block in the Q information bit sub-blocks of the $x^{th}$ information bit block respectively occupies, in the $x^{th}$ timeslot, at a first to an $N*R_{1,t}^{th}$ reliable positions of an $x^{th}$ second to-be-encoded block in T equivalent binary subgroups. In an $(x+1)^{th}$ timeslot, a second information bit sub-block in the Q information bit sub-blocks of the $x^{th}$ information bit block respectively occupies, an $N*R_{1,t}+1^{th}$ to an $N*R_{2,t}^{th}$ reliable positions of (x+1) second to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ second to-be-encoded block in the T equivalent binary subgroups.

In an implementation, the first order is an information bit transmission order $u_1, u_2, \ldots, u_K$, and the second order is a reversed order $u_K, u_{K-1}, \ldots, u_1$ of the first order; or the first order and the second order meet the following mapping relationship:

$$U=[u_1,u_2,\ldots,u_K]$$

$$\overline{U}=[0,0,\ldots,0,u_1,u_2,\ldots,u_K]$$

$$\tilde{U}=[\tilde{u}_1,\tilde{u}_2,\ldots,\tilde{u}_{2^P}]$$

$$\tilde{U}=\overline{U}F^{\otimes P}$$

U represents any information bit block, $u_k$ represents any information bit in U, $u_k$ in some information bits [$\tilde{u}_1, \tilde{u}_2, \ldots, \tilde{u}_K$] in $\tilde{U}$ is a corresponding information bit after $u_k$ is mapped, F is a generator matrix of a polar code, a length of $\overline{U}$ is $H=2^P$, H is greater than or equal to K, and k meets 1≤k≤K.

In an implementation, that the processor 2002 is configured to perform hierarchical decoding according to a hierarchical decoding level of an equivalent binary subgroup, to obtain decoded data is specifically configured to:

if a sum of channel capacities of the first parallel channel and the second parallel channel is greater than or equal to a code rate R, perform decoding, in the first parallel channel, to obtain $h_1$ information bit sub-parts included in an information bit block carried by a first code block in an equivalent binary subgroup with a lowest hierarchical decoding level; sequentially perform decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel; where the $h_1$ information bit sub-parts and the $h_2$ information bit sub-parts form $k_1$ information bit sub-blocks, and the $k_1$ meets $1 \leq k_1 \leq Q$;

perform decoding, in the second parallel channel, to obtain $h_3$ information bit sub-parts of the information bit block carried by a second code block in an equivalent binary subgroup with the lowest hierarchical decoding level; sequentially perform decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel; where the $h_3$ information bit sub-parts and the $h_4$ information bit sub-parts form $k_2$ information bit sub-blocks, and the $k_1$ and $k_2$ meet $k_1+k_2 \geq Q$; and obtain the Q information bit sub-blocks included in the information bit block as a set formed by the $k_1$ information bit sub-blocks and the $k_2$ information bit sub-blocks.

In an implementation, that the transceiver 2001 is configured to receive a first data stream and a second data stream that are sent by a first communications device by using S parallel channels is specifically configured to:

receive the first data stream, the second data stream, and a third data stream that are sent by the first communications device by using the S parallel channels. The third data stream includes a $2^T$-order high-order signal obtained by mapping information bits in T*M third code blocks in the third parallel channel, and the T*M third code blocks are obtained by performing polar code encoding on T*M third to-be-encoded blocks. In the third parallel channel, K information bits in the one information bit block are arranged according to a second order, and a second order used for information bits in the third parallel channel is different from a second order used for information bits in the second parallel channel.

That the processor 2002 is configured to perform hierarchical decoding according to a hierarchical decoding level of an equivalent binary subgroup, to obtain decoded data is specifically configured to:

if a sum of channel capacities of the first parallel channel, the second parallel channel, and the third parallel channel is greater than or equal to a code rate R, perform decoding, in the first parallel channel, to obtain $h_1$ information bit sub-parts included in an information bit block carried by a first code block in an equivalent binary subgroup with a lowest hierarchical decoding level; sequentially perform decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel; where the $h_1$ information bit sub-parts and the $h_2$ information bit sub-parts form $k_1$ information bit sub-blocks, and the $k_1$ meets $1 \leq k_1 < Q$;

perform decoding, in the second parallel channel according to a second order of an information bit arrangement in the second parallel channel, to obtain $h_3$ information bit sub-parts of the information bit block carried by a second code block in an equivalent binary subgroup with the lowest hierarchical decoding level; sequentially perform decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel; where the $h_3$ information bit sub-parts and the $h_4$ information bit sub-parts form $k_2$ information bit sub-blocks, and the $k_1$ and the $k_2$ satisfy $k_1+k_2 < Q$;

perform decoding, in the third parallel channel according to a second order of an information bit arrangement in the third parallel channel, to obtain $h_5$ information bit sub-parts of the information bit block carried by a third code block in an equivalent binary subgroup with the lowest hierarchical decoding level; sequentially perform decoding according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel; where the $h_5$ information bit sub-parts and the $h_6$ information bit sub-parts form $k_3$ information bit sub-blocks, and the $k_1$, the $k_2$ and $k_3$ meet $k_1+k_2+k_3 \geq Q$; and obtain the Q information bit sub-blocks included in the information bit block as a set formed by the $k_1$ information bit sub-blocks, the $k_2$ information bit sub-blocks, and the $k_3$ information bit sub-blocks.

In an implementation, that the transceiver 2001 is configured to receive a first data stream and a second data stream that are sent by a first communications device by using S parallel channels is specifically configured to:

receive the first data stream, the second data stream, until the $S^{th}$ data stream that are sent by the first communications device by using the S parallel channels, where an $s^{th}$ data stream in the first data stream, the second data stream, until the $S^{th}$ data stream includes a $2^T$-order high-order signal obtained by mapping information bits in T*M $s^{th}$ code blocks in an $s^{th}$ parallel channel of the S parallel channels. The T*M $s^{th}$ code blocks are obtained by performing polar code encoding on T*M $s^{th}$ to-be-encoded blocks; and K information bits in each processed information bit block are arranged according to the first order.

In the $s^{th}$ parallel channel, Q information bit sub-blocks of an $x^{th}$ information bit block respectively occupy, respectively in an $x^{th}$ timeslot to an $(x+Q-1)^{th}$ timeslot, an $N*R_{(q-1),t}+1^{th}$ to $N*R_{q,t}^{th}$ reliable positions of an $x^{th}$ $s^{th}$ to-be-encoded block to an $(x+Q-1)^{th}$ $s^{th}$ to-be-encoded block in T equivalent binary subgroups. Processing on each information bit block meets the following condition:

K information bits of each information bit block are mapped from a binary field to a finite field with $2^w$ elements, each information bit block after mapping corresponds to a symbol sequence, a length of the symbol sequence is K/w, and the w is a positive integer greater than 1. Any symbol sequence and a symbol sequence obtained after conversion of the any symbol sequence satisfy the following relationship:

$$\overline{A} = \tilde{A} * H_s$$

$\tilde{A}$ is the any symbol sequence, $\overline{A}$ is a symbol sequence after $\tilde{A}$ is converted, a length of $\overline{A}$ is K/w, $H_s$ is a universal decoding matrix UDM of K/w×K/w in a finite field with $2^w$ elements, s is used to indicate an $s^{th}$ data stream, s meets $1 \leq s \leq S$, and S is a positive integer greater than 3. A corresponding information bit block after the reverse mapping of $\overline{A}$ is $[A_{s,1}, A_{s,2}, \ldots, A_{s,K}]$, and $A_{s,k}$ is a corresponding information bit after the reverse mapping.

In an implementation, any one of code blocks carries at least one information bit sub-block and carries at most Q information bit sub-blocks, and the code blocks include the first code block and the second code block.

In an implementation, each of the code blocks is sequentially arranged according to an identifier of the code block, the first code block respectively corresponding to each of the T equivalent binary subgroups carries one information bit sub-block, quantities of information bit sub-blocks carried by the first to the $Q^{th}$ code blocks corresponding to each of the T equivalent binary subgroups are sequentially increased by one according to an arrangement order of the code blocks, and the $Q^{th}$ code block carries Q information bit sub-blocks.

Quantities of information bit sub-blocks carried by the $(Q+1)^{th}$ to the $M^{th}$ code blocks respectively corresponding to each of the T equivalent binary subgroups are sequentially decreased by one according to the arrangement order of the code blocks, and the $M^{th}$ code block carries one information bit sub-block; or quantities of information bit sub-blocks carried by the $(Q+1)^{th}$ to the $M^{th}$ code blocks respectively corresponding to each of the T equivalent binary subgroups are all Q information bit sub-blocks.

In an implementation, the Q is a quantization order of a code rate R, and the Q is a positive integer; a sum of code rates of $i^{th}$ code blocks respectively corresponding to the T equivalent binary subgroups is i×R/Q, and the i meets 1≤i≤Q.

A sum of code rates of $j^{th}$ code blocks respectively corresponding to the T equivalent binary subgroups is (M−j+1)×R/Q, and the j meets Q+1≤j≤M; alternatively, a sum of code rates of $j^{th}$ code blocks respectively corresponding to the T equivalent binary subgroups is Q*R/Q, and the j meets Q+1≤j≤M.

An embodiment of this application provides a communications apparatus. The communications apparatus includes an input interface, an output interface, and a logic circuit. The input interface is configured to input to-be-processed data. The logic circuit processes the to-be-processed data according to the method in the foregoing method embodiments, to obtain processed data. The output interface is configured to output the processed data.

In an implementation, the to-be-processed data input by the input interface includes the to-be-encoded blocks in the foregoing method embodiments and information bit sub-blocks in each to-be-encoded block. The to-be-encoded blocks include a first to-be-encoded block, a second to-be-encoded block, . . . , and an $S^{th}$ to-be-encoded block.

In an implementation, that the logic circuit processes the to-be-processed data according to the method in the foregoing method embodiments, to obtain processed data specifically includes:

The logical circuit arranges information bits in a parallel channel in a specific order according to the method in the foregoing method embodiments, places the sorted information bits in a to-be-encoded block at a specified position, and then encodes the to-be-encoded block to obtain a code block corresponding to each to-be-encoded block. For one parallel channel, T*M code blocks form one data stream.

In an implementation, the processed data output by the output interface includes a plurality of data streams in the foregoing method embodiments, where the plurality of data streams include the first data stream, the second data stream, until the $S^{th}$ data stream.

In an implementation, the to-be-processed data input by the input interface includes a plurality of data streams in the foregoing method embodiments, where the plurality of data streams include a first data stream, a second data stream, until an $S^{th}$ data stream.

In an implementation, that the logic circuit processes the to-be-processed data according to the method in the foregoing method embodiments, to obtain processed data specifically includes:

The logic circuit performs hierarchical decoding on the plurality of data streams according to the method in the foregoing method embodiments, to obtain an information bit block corresponding to each data stream.

In an implementation, the processed data output by the output interface includes the decoded data in the foregoing method embodiments, and the decoded data may be information bits in each to-be-encoded block.

An embodiment of this application provides a communications system. The communications system includes the first communications device and the second communications device described in embodiments.

An embodiment of this application provides a computer-readable storage medium. The computer-readable storage medium stores a program or an instruction. When the program or the instruction is run on a computer, the computer is enabled to perform the data processing method in embodiments of this application.

An embodiment of this application provides a chip or a chip system. The chip or the chip system includes at least one processor and an interface. The interface is interconnected to the at least one processor through a line. The at least one processor is configured to run a computer program or an instruction, to perform the data processing method in embodiments of this application.

The interface in the chip may be an input/output interface, a pin, a circuit, or the like.

The chip system in the foregoing aspects may be a system-on-a-chip (SOC), a baseband chip, or the like. The baseband chip may include a processor, a channel encoder, a digital signal processor, a modem, an interface module, and the like.

In an implementation, the chip or the chip system described in this application further includes at least one memory, and the at least one memory stores instructions. The memory may be a storage unit in the chip, for example, a register or a cache; or may be a storage unit (for example, a read-only memory or a random access memory) of the chip.

All or some of the foregoing embodiments may be implemented by software, hardware, firmware, or any combination thereof. When software is used to implement the embodiments, the embodiments may be implemented completely or partially in a form of a computer program product. The computer program product includes one or more computer instructions. When the computer instruction is loaded and executed on a computer, the procedures or the functions according to the embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a high-density digital video disc (DVD), a semiconductor medium (for example, a solid state disk (SSD)), or the like.

A person of ordinary skill in the art may be aware that the units and the algorithm steps in the examples described with reference to the embodiments disclosed in this specification can be implemented by electronic hardware, computer software, or a combination thereof. To clearly describe interchangeability between hardware and software, the foregoing has generally described compositions and steps of the examples based on functions. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method comprising:
   receiving, by a second communication device, a first data stream and a second data stream from a first communications device using S parallel channels,
   wherein the first data stream comprises a $2^T$-order high-order signal obtained by mapping information bits in T*M first code blocks in a first parallel channel of the S parallel channels,
   wherein the T*M first code blocks are obtained by performing polar code encoding on T*M first to-be-encoded blocks,
   wherein the second data stream comprises a $2^T$-order high-order signal obtained by mapping information bits in T*M second code blocks in a second parallel channel of the S parallel channels,
   wherein the T*M second code blocks are obtained by performing polar code encoding on T*M second to-be-encoded blocks,
   wherein one parallel channel comprises X information bit blocks,
   wherein each information bit block comprises K information bits,
   wherein one information bit block is divided into Q information bit sub-blocks,
   wherein each information bit sub-block is a binary sequence with a length of K/Q,
   wherein, in the first parallel channel, K information bits in each information bit block are arranged according to a first order,
   wherein, in the second parallel channel, K information bits in each information bit block are arranged according to a second order,
   wherein the second order is different from the first order, and
   wherein the second order and the first order meet a mapping relationship;
   respectively occupying, in each parallel channel, by Q information bit sub-blocks of an $x^{th}$ information bit block, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups,
   wherein q meets $1 \leq q \leq Q$ and $R_{1,t}, R_{2,t}, \ldots, R_{Q,t}$ is a code rate of first Q to-be-encoded blocks in a $t^{th}$ equivalent binary subgroup,
   wherein N is a code length,
   wherein x meets $1 \leq x \leq X$ and t meets $1 \leq t \leq T$, and
   wherein a sum of bit sizes of T equivalent binary subgroups in an $s^{th}$ parallel channel occupied by a $q^{th}$ information bit sub-block of the $x^{th}$ information bit block is K/Q and s meets $1 \leq s \leq S$; and
   performing hierarchical decoding according to a hierarchical decoding level of an equivalent binary subgroup to obtain decoded data.

2. The method according to claim 1,
   wherein the to-be-encoded blocks comprise a first to-be-encoded block in the first parallel channel and/or a second to-be-encoded block in the second parallel channel,
   wherein respectively occupying, in each parallel channel, by the Q information bit sub-blocks of the $x^{th}$ information bit block comprises:
   respectively occupying, in the first parallel channel, by a first information bit sub-block in the Q information bit sub-blocks of the $x^{th}$ information bit block, in the $x^{th}$ timeslot, a first to an $N*R_{1,t}^{th}$ reliable positions of an $x^{th}$ first to-be-encoded block in the T equivalent binary subgroups,
   wherein a value of $R_{0,t}$ is 0,
   respectively occupying, in an $(x+1)^{th}$ timeslot, by a second information bit sub-block in the Q information bit sub-blocks of the $x^{th}$ information bit block, an $N*R_{1,t}+1^{th}$ to an $N*R_{2,t}^{th}$ reliable positions of $(x+1)$ first to-be-encoded blocks in the T equivalent binary subgroups, until a $Q^{th}$ information bit sub-block in the Q information bit sub-blocks of the $x^{th}$ information bit block
   respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ first to-be-encoded block in the T equivalent binary subgroups, and
   respectively occupying, in the second parallel channel, by a first information bit sub-block in the Q information bit sub-blocks of the $x^{th}$ information bit block, in the $x^{th}$ timeslot, a first to an $N*R_{1,t}^{th}$ reliable positions of an $x^{th}$ second to-be-encoded block in the T equivalent binary subgroups, and respectively occupying, in an $(x+1)^{th}$ timeslot, by a second information bit sub-block in the Q information bit sub-blocks of the $x^{th}$ information bit block, an $N*R_{1,t}+1^{th}$ to an $N*R_{2,t}^{th}$ reliable positions of $(x+1)$ second to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ second to-be-encoded block in the T equivalent binary subgroups.

3. The method according to claim 1,
   wherein the first order is an information bit transmission order $u_1, u_2, \ldots, u_K$, and the second order is a reversed order $u_K, u_{K-1}, \ldots, u_1$ of the first order, or wherein the first order and the second order meet the following mapping relationship:

$U=[u_1, u_2, \ldots, u_K]$ $\overline{U}=[0,0,\ldots,0,u_1,u_2,\ldots,u_K]$ $\tilde{U}=[\tilde{u}_1, \tilde{u}_2, \ldots, \tilde{u}_{2^P}]$ $\tilde{U}=\overline{U}F^{\otimes P}$, and wherein U represents any information bit block, $u_k$ represents any information bit in U, $\tilde{u}_k$ in some information bits $[\tilde{u}_1, \tilde{u}_2, \ldots, \tilde{u}_K]$ in $\tilde{U}$ is a corresponding information bit after $u_k$ is mapped, F is a generator matrix of a polar code, a length of $\overline{U}$ is $H=2^P$, H is greater than or equal to K, and k meets $1 \leq k \leq K$.

4. The method according to claim 1, wherein performing the hierarchical decoding comprises:

when a sum of channel capacities of the first parallel channel and the second parallel channel is greater than or equal to a code rate R, performing decoding, in the first parallel channel, to obtain $h_1$ information bit sub-parts comprised in an information bit block carried by a first code block in an equivalent binary subgroup with a lowest hierarchical decoding level, wherein one information bit sub-block in one parallel channel is divided into T information bit sub-parts, and the T information bit sub-parts are respectively located in T equivalent binary subgroups of the parallel channel;

sequentially performing decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel, wherein the $h_1$ information bit sub-parts and the $h_2$ information bit sub-parts form $k_1$ information bit sub-blocks, and the $k_1$ meets $1 \leq k_1 < Q$;

performing decoding, in the second parallel channel, to obtain $h_3$ information bit sub-parts of the information bit block carried by a second code block in an equivalent binary subgroup with the lowest hierarchical decoding level;

sequentially performing decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel, wherein the $h_3$ information bit sub-parts and the $h_4$ information bit sub-parts form $k_2$ information bit sub-blocks, and the $k_1$ and the $k_2$ satisfy $k_1+k_2 \geq Q$; and obtaining the Q information bit sub-blocks comprised in the information bit block as a set formed by the $k_1$ information bit sub-blocks and the $k_2$ information bit sub-blocks.

5. The method according to claim 4, wherein receiving the first data stream and the second data stream comprises receiving the first data stream, the second data stream, and a third data stream received from the first communications device using the S parallel channels, wherein the third data stream comprises a $2^T$-order high-order signal obtained by mapping information bits in T*M third code blocks in the third parallel channel of the S parallel channels, and the T*M third code blocks are obtained by performing polar code encoding on T*M third to-be-encoded blocks, wherein, in the third parallel channel, K information bits in the one information bit block are arranged according to a second order, wherein a second order used for information bits in the third parallel channel is different from a second order used for information bits in the second parallel channel, and wherein performing the hierarchical decoding according to the hierarchical decoding level of the equivalent binary subgroup, to obtain decoded data comprises:

when a sum of channel capacities of the first parallel channel, the second parallel channel, and the third parallel channel is greater than or equal to a code rate R, performing decoding, in the first parallel channel, to obtain $h_1$ information bit sub-parts comprised in an information bit block carried by a first code block in an equivalent binary subgroup with a lowest hierarchical decoding level;

sequentially performing decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel, wherein the $h_1$ information bit sub-parts and the $h_2$ information bit sub-parts form $k_1$ information bit sub-blocks, and the $k_1$ meets $1 \leq k_1 < Q$;

performing decoding, in the second parallel channel according to a second order of an information bit arrangement in the second parallel channel, to obtain $h_3$ information bit sub-parts of the information bit block carried by a second code block in an equivalent binary subgroup with the lowest hierarchical decoding level;

sequentially performing decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel, wherein the $h_3$ information bit sub-parts and the $h_4$ information bit sub-parts form $k_2$ information bit sub-blocks, and the $k_1$ and the $k_2$ satisfy $k_1+k_2 < Q$;

performing decoding, in the third parallel channel according to a second order of an information bit arrangement in the third parallel channel, to obtain $h_5$ information bit sub-parts of the information bit block carried by a third code block in an equivalent binary subgroup with the lowest hierarchical decoding level;

sequentially performing decoding according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel, wherein the $h_5$ information bit sub-parts and the $h_6$ information bit sub-parts form $k_3$ information bit sub-blocks, and the $k_1$, the $k_2$, and the $k_3$ satisfy $k_1+k_2+k_3 \geq Q$; and obtaining the Q information bit sub-blocks comprised in the information bit block as a set formed by the $k_1$ information bit sub-blocks, the $k_2$ information bit sub-blocks, and the $k_3$ information bit sub-blocks.

6. The method according to claim 1, wherein receiving the first data stream and the second data stream comprises:

receiving the first data stream and the second data stream until a $S^{th}$ data stream, wherein an $s^{th}$ data stream in the first data stream and the second data stream until the $S^{th}$ data stream comprises a $2^T$-order high-order signal obtained by mapping information bits in T*M $s^{th}$ code blocks in an $s^{th}$ parallel channel of the S parallel channels, wherein the T*M $s^{th}$ code blocks are obtained by performing polar code encoding on T*M $s^{th}$ to-be-encoded blocks, wherein K information bits in each processed information bit block are arranged according to the first order, and respectively occupying, in the $s^{th}$ parallel channel, by Q information bit sub-blocks of an $x^{th}$ information bit block, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ $s^{th}$ to-be-encoded block to an $(x+Q-1)^{th}$ $s^{th}$ to-be-encoded block in T equivalent binary subgroups, wherein processing on each information bit block meets the following condition:

mapping K information bits of each information bit block from a binary field to a finite field with $2^w$ elements, wherein each information bit block after mapping corresponds to a symbol sequence, a length of the symbol sequence is K/w, w is a positive integer greater than 1, and wherein any symbol sequence and a symbol sequence obtained after conversion of any symbol sequence satisfy the following relationship:

$$\overline{A} = \tilde{A} * H_s,$$

wherein $\tilde{A}$ is the any symbol sequence, $\overline{A}$ is a symbol sequence after $\tilde{A}$ is converted, a length of $\overline{A}$ is K/w, $H_s$ is a universal decoding matrix of K/w×K/w in a finite field with $2^w$ elements, s is used to indicate an $s^{th}$ data stream, s meets 1≤s≤S, S is a positive integer greater than 3, $[A_{s,1}, A_{s,2}, \ldots, A_{s,K}]$ is an information bit block corresponding to $\overline{A}$ after reverse mapping, and $A_{s,k}$ is a corresponding information bit after the reverse mapping.

7. The method according to claim 1, wherein each of code blocks carries at least one information bit sub-block and carries at most Q information bit sub-blocks, and wherein the code blocks comprise the first code block and the second code block.

8. The method according to claim 7,
wherein each of the code blocks is sequentially arranged according to an identifier of the code block, wherein the first code block respectively corresponding to each of the T equivalent binary subgroups carries one information bit sub-block, wherein quantities of information bit blocks carried by the first code block to a $Q^{th}$ code block corresponding to each of the T equivalent binary subgroups are sequentially increased by one according to an arrangement order of the code blocks, wherein the $Q^{th}$ code block carries Q information bit sub-blocks, and wherein quantities of information bit sub-blocks carried by a $(Q+1)^{th}$ code block to $M^{th}$ code block respectively corresponding to each of the T equivalent binary subgroups are sequentially decreased by one according to the arrangement order of the code blocks, and the $M^{th}$ code block carries one information bit sub-block, or wherein quantities of information bit sub-blocks carried by the $(Q+1)^{th}$ to the $M^{th}$ code blocks respectively corresponding to each of the T equivalent binary subgroups are all Q information bit sub-blocks.

9. The method according to claim 8, wherein Q is a quantization order of a code rate R, wherein Q is a positive integer, wherein a sum of code rates of $i^{th}$ code blocks respectively corresponding to the T equivalent binary subgroups is i×R/Q, wherein i meets 1≤i≤Q, wherein a sum of code rates of the $j^{th}$ code blocks respectively corresponding to the T equivalent binary subgroups is (M−j+1)×R/Q, wherein j meets Q+1≤j≤M, or wherein a sum of code rates of $j^{th}$ code blocks respectively corresponding to the T equivalent binary subgroups is R, and wherein j meets Q+1≤j≤M.

10. A communication apparatus comprising:
a transceiver configured to:
receive a first data stream and a second data stream from a first communications device using S parallel channels, wherein the first data stream comprises a $2^T$-order high-order signal obtained by mapping information bits in T*M first code blocks in a first parallel channel of the S parallel channels, wherein the T*M first code blocks are obtained by performing polar code encoding on T*M first to-be-encoded blocks, wherein the second data stream comprises a $2^T$-order high-order signal obtained by mapping information bits in T*M second code blocks in a second parallel channel of the S parallel channels, wherein the T*M second code blocks are obtained by performing polar code encoding on T*M second to-be-encoded blocks, wherein one parallel channel comprises X information bit blocks, each information bit block comprising K information bits, wherein one information bit block is divided into Q information bit sub-blocks, each information bit sub-block being a binary sequence with a length of K/Q, wherein, in the first parallel channel, K information bits in each information bit block are arranged according to a first order, wherein, in the second parallel channel, K information bits in each information bit block are arranged according to a second order, wherein the second order is different from the first order, and wherein the second order and the first order meet a mapping relationship; and respectively occupy, in each parallel channel, by Q information bit sub-blocks of an $x^{th}$ information bit block, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ to-be-encoded block to an $(x+Q-1)^{th}$ to-be-encoded block in T equivalent binary subgroups, wherein q meets 1≤q≤Q and $R_{1,t}, R_{2,t}, \ldots, R_{Q,t}$ is a code rate of the first Q to-be-encoded blocks in a $t^{th}$ equivalent binary subgroup, N is a code length, x meets 1≤x≤X, and t meets 1≤t≤T, wherein a sum of bit sizes of T equivalent binary subgroups in an $s^{th}$ parallel channel occupied by a $q^{th}$ information bit sub-block of the $x^{th}$ information bit block is K/Q and s meets 1≤s≤S; and a processor configured to perform hierarchical decoding according to a hierarchical decoding level of an equivalent binary subgroup, to obtain decoded data.

11. The apparatus of claim 10,
wherein the to-be-encoded blocks comprise a first to-be-encoded block in the first parallel channel and/or a second to-be-encoded block in the second parallel channel, and
wherein the transceiver is configured to respectively occupy by:
respectively occupying, in the first parallel channel, by a first information bit sub-block in the Q information bit sub-blocks of the $x^{th}$ information bit block, in the $x^{th}$ timeslot, a first to an $N*R_{1,t}^{th}$ reliable positions of an $x^{th}$ first to-be-encoded block in the T equivalent binary subgroups,
wherein a value of $R_{0,t}$ is 0,
respectively occupying, in an $(x+1)^{th}$ timeslot, by a second information bit sub-block in the Q information bit sub-blocks of the $x^{th}$ information bit block, an $N*R_{1,t}+1^{th}$ to an $N*R_{2,t}^{th}$ reliable positions of (x+1) first to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ first to-be-encoded block in the T equivalent binary subgroups, and respectively occupying, in the second parallel channel, by a first information bit sub-block in the Q information bit sub-blocks of the $x^{th}$ information bit block, in the $x^{th}$ timeslot, a first to an $N*R_{1,t}^{th}$ reliable positions of an $x^{th}$ second to-be-encoded block in the T equivalent binary subgroups; and respectively occupying, in an $(x+1)^{th}$ timeslot, by a second information bit sub-block in the Q information bit sub-blocks of the $x^{th}$ information bit block, an $N*R_{1,t}+1^{th}$ to an $N*R_{2,t}^{th}$ reliable positions of $(x+1)$ second to-be-encoded blocks in the T equivalent binary subgroups, until a $Q^{th}$ information bit sub-block in the Q information bit sub-blocks of the $x^{th}$ information bit block respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ second to-be-encoded block in the T equivalent binary subgroups.

12. The apparatus according to claim 10, wherein the first order is an information bit transmission order $u_1, u_2, \ldots, u_K$ and the second order is a reversed order $u_K, u_{K-1}, \ldots, u_1$ of the first order, or $$U=[u_1, u_2, \ldots, u_K]$$

$$\overline{U}=[0, 0, \ldots, 0, u_1, u_2, \ldots, u_K]$$

$$\tilde{U}=[\tilde{u}_1, \tilde{u}_2, \ldots, \tilde{u}_{2^P}]$$

$$\tilde{U}=\overline{U}F^{\otimes P},$$

and wherein U represents any information bit block, $u_k$ represents any information bit in U, $\tilde{u}_k$ in some information bits $[\tilde{u}_1, \tilde{u}_2, \ldots, \tilde{u}_K]$ in $\tilde{U}$ is a corresponding information bit after $u_k$ is mapped, F is a generator matrix of a polar code, a length of $\overline{U}$ is $H=2^P$, H is greater than or equal to K, and k meets $1 \le k \le K$.

13. The apparatus according to claim 10, wherein the processor is configured to perform hierarchical decoding by:

when a sum of channel capacities of the first parallel channel and the second parallel channel is greater than or equal to a code rate R, performing decoding, in the first parallel channel, to obtain $h_1$ information bit sub-parts comprised in an information bit block carried by a first code block in an equivalent binary subgroup with a lowest hierarchical decoding level, wherein one information bit sub-block in one parallel channel is divided into T information bit sub-parts, and the T information bit sub-parts are respectively located in T equivalent binary subgroups of the parallel channel;

sequentially performing decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel, wherein the $h_1$ information bit sub-parts and the $h_2$ information bit sub-parts form $k_1$ information bit sub-blocks, and the $k_1$ satisfies $1 \le k_1 < Q$;

performing decoding, in the second parallel channel, to obtain $h_3$ information bit sub-parts of the information bit block carried by a second code block in an equivalent binary subgroup with the lowest hierarchical decoding level;

sequentially performing decoding according to hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel, wherein the $h_3$ information bit sub-parts and the $h_4$ information bit sub-parts form $k_2$ information bit sub-blocks, and the $k_1$ and the $k_2$ satisfy $k_1+k_2 \ge Q$; and obtaining the Q information bit sub-blocks comprised in the information bit block as a set formed by the $k_1$ information bit sub-blocks and the $k_2$ information bit sub-blocks.

14. The apparatus according to claim 13, wherein the transceiver is configured to receive the first data stream and the second data stream by:

receiving the first data stream, the second data stream, and a third data stream received from the first communications device using the S parallel channels, wherein the third data stream comprises a $2^T$-order high-order signal obtained by mapping information bits in T*M third code blocks in the third parallel channel of the S parallel channels, wherein the T*M third code blocks are obtained by performing polar code encoding on T*M third to-be-encoded blocks, wherein, in the third parallel channel, K information bits in the one information bit block are arranged according to a second order, wherein a second order used for information bits in the third parallel channel is different from a second order used for information bits in the second parallel channel, and wherein the processor is configured to perform hierarchical decoding by:

when a sum of channel capacities of the first parallel channel, the second parallel channel, and the third parallel channel is greater than or equal to a code rate R, performing decoding, in the first parallel channel, to obtain $h_1$ information bit sub-parts comprised in an information bit block carried by a first code block in an equivalent binary subgroup with a lowest hierarchical decoding level;

sequentially performing decoding according to hierarchical decoding levels of equivalent binary subgroups in the first parallel channel to obtain $h_2$ information bit sub-parts respectively corresponding to (T−1) equivalent binary subgroups of the $h_1$ information bit sub-parts in the first parallel channel, wherein the $h_1$ information bit sub-parts and the $h_2$ information bit sub-parts form $k_1$ information bit sub-blocks, and the $k_1$ meets $1 \le k_1 < Q$;

performing decoding, in the second parallel channel according to a second order of an information bit arrangement in the second parallel channel, to obtain $h_3$ information bit sub-parts of the information bit block carried by a second code block in an equivalent binary subgroup with the lowest hierarchical decoding level;

sequentially performing decoding according to the hierarchical decoding levels of equivalent binary subgroups in the second parallel channel to obtain $h_4$ information bit sub-parts respectively corresponding to (T−1) equivalent binary subgroups of the $h_3$ information bit sub-parts in the second parallel channel, wherein the $h_3$ information bit sub-parts and the $h_4$ information bit sub-parts form $k_2$ information bit sub-blocks, and the $k_1$ and the $k_2$ satisfy $k_1+k_2<Q$;

performing decoding, in the third parallel channel according to a second order of an information bit arrangement in the third parallel channel, to obtain $h_5$ information bit sub-parts of the information bit block carried by a third code block in an equivalent binary subgroup with the lowest hierarchical decoding level;

sequentially performing decoding according to hierarchical decoding levels of equivalent binary subgroups in the third parallel channel to obtain $h_6$ information bit sub-parts respectively corresponding to (T−1) equivalent binary subgroups of the $h_5$ information bit sub-parts in the third parallel channel, wherein the $h_5$ information bit sub-parts and the $h_6$ information bit sub-parts form $k_3$ information bit sub-blocks, and the $k_1$, the $k_2$, and the $k_3$ satisfy $k_1+k_2+k_3\geq Q$; and obtaining the Q information bit sub-blocks comprised in the information bit block as a set formed by the $k_1$ information bit sub-blocks, the $k_2$ information bit sub-blocks, and the $k_3$ information bit sub-blocks.

15. The apparatus according to claim 10,
wherein the transceiver is configured to receive the first data stream and the second data stream by:
receiving the first data stream and the second data stream until a $S^{th}$ data stream, wherein an $s^{th}$ data stream in the first data stream and the second data stream until the $S^{th}$ data stream comprises a $2^T$-order high-order signal obtained by mapping information bits in T*M $s^{th}$ code blocks in an $s^{th}$ parallel channel of the S parallel channels, wherein the T*M $s^{th}$ code blocks are obtained by performing polar code encoding on T*M $s^{th}$ to-be-encoded blocks, wherein K information bits in each processed information bit block are arranged according to the first order, and respectively occupying, in the $s^{th}$ parallel channel, by Q information bit sub-blocks of an $x^{th}$ information bit block, respectively in an $x^{th}$ timeslot to an $(x+Q-1)^{th}$ timeslot, an $N*R_{(q-1),t}+1^{th}$ to an $N*R_{q,t}^{th}$ reliable positions of an $x^{th}$ $s^{th}$ to-be-encoded block to an $(x+Q-1)^{th}$ $s^{th}$ to-be-encoded block in T equivalent binary subgroups, wherein processing on each information bit block meets the following condition:

mapping K information bits of each information bit block from a binary field to a finite field with $2^w$ elements, wherein each information bit block after mapping corresponds to a symbol sequence, a length of the symbol sequence is K/w, w is a positive integer greater than 1, and wherein any symbol sequence and a symbol sequence obtained after conversion of the any symbol sequence satisfy the following relationship:

$$\overline{A}=\tilde{A}*H_s,$$

wherein $\tilde{A}$ is the any symbol sequence, $\overline{A}$ is a symbol sequence after $\tilde{A}$ is converted, a length of $\overline{A}$ is K/w, $H_s$ is a universal decoding matrix of K/w×K/w in a finite field with $2^w$ elements, s is used to indicate an $s^{th}$ data stream, s meets $1\leq s\leq S$, S is a positive integer greater than 3, $[A_{s,1}, A_{s,2}, \ldots, A_{s,K}]$ is an information bit block corresponding to $\overline{A}$ after reverse mapping, and $A_{s,k}$ is a corresponding information bit after the reverse mapping.

16. The apparatus according to claim 10, wherein each of code blocks carries at least one information bit sub-block and carries at most Q information bit sub-blocks, and wherein the code blocks comprise the first code block and the second code block.

17. The apparatus according to claim 16,
wherein each of the code blocks is sequentially arranged according to an identifier of the code block, wherein the first code block respectively corresponding to each of the T equivalent binary subgroups carries one information bit sub-block, quantities of information bit blocks carried by the first code block to a $Q^{th}$ code block corresponding to each of the T equivalent binary subgroups are sequentially increased by one according to an arrangement order of the code blocks, wherein the $Q^{th}$ code block carries Q information bit sub-blocks, wherein quantities of information bit sub-blocks carried by the $(Q+1)^{th}$ code block to $M^{th}$ code block respectively corresponding to each of the T equivalent binary subgroups are sequentially decreased by one according to the arrangement order of the code blocks, and wherein the $M^{th}$ code block carries one information bit sub-block, or wherein quantities of information bit sub-blocks carried by the $(Q+1)^{th}$ to the $M^{th}$ code blocks respectively corresponding to each of the T equivalent binary subgroups are all Q information bit sub-blocks.

18. The apparatus according to claim 17, wherein the Q is a quantization order of a code rate R, wherein Q is a positive integer, wherein a sum of code rates of $i^{th}$ code blocks respectively corresponding to the T equivalent binary subgroups is i×R/Q, wherein i meets $1\leq i\leq Q$, wherein a sum of code rates of $j^{th}$ code blocks respectively corresponding to the T equivalent binary subgroups (M−j+1)×R/Q and wherein j meets $Q+1\leq j\leq M$, or wherein a sum of code rates of $j^{th}$ code blocks respectively corresponding to the T equivalent binary subgroups is R, and wherein j meets $Q+1\leq j\leq M$.

19. A method comprising:
obtaining, by a first communication device, a plurality of binary sequences, wherein the plurality of binary sequences are obtained by using S parallel channels, wherein each parallel channel comprises T equivalent binary subgroups, wherein one equivalent binary subgroup carries one binary sequence, wherein one parallel channel comprises X information bit blocks, wherein each information bit block comprises K information bits, wherein one information bit block is divided into Q information bit sub-blocks, wherein each information bit sub-block is a binary sequence with a length of K/Q, wherein, in a first parallel channel of the S parallel channels, K information bits in each information bit block are arranged according to a first order, wherein, in a second parallel channel of the S parallel channels, K information bits in each information bit block are arranged according to a second order, and wherein the second order is different from the first order, the second order and the first order meeting a mapping relationship;

respectively placing, by the first communication device, in each parallel channel, Q information bit sub-blocks of an $x^{th}$ information bit block, respectively in an $x^{th}$ timeslot to an $(x+Q-1)^{th}$ timeslot, at an $N*R_{(q-1),t}^{th}$ to an $N*R_{q,t}^{th}$ reliable positions of an $x^{th}$ to-be-encoded block to an $(x+Q-1)^{th}$ to-be-encoded block in T equivalent binary subgroups, wherein q meets $1\leq q\leq Q$ and $R_{1,t}, R_{2,t}, \ldots, R_{Q,t}$ is a code rate of first Q to-be-encoded blocks in a $t^{th}$ equivalent binary subgroup, wherein N is a code length, wherein x meets $1\leq x\leq X$ and t meets $1\leq t\leq T$, wherein T is greater than or equal to 2, wherein a sum of bit sizes of T equivalent binary subgroups in an $s^{th}$ parallel channel occupied by a $q^{th}$ information bit sub-block of the $x^{th}$ information bit block is K/Q, and wherein s meets $1 \leq s \leq S$ and q meets $1 \leq q \leq Q$;

performing, by the first communication device, polar code encoding on M first to-be-encoded blocks in each equivalent binary subgroup separately for the T equivalent binary subgroups in the first parallel channel, in order to obtain M first code blocks in each equivalent binary subgroup;

performing, by the first communication device, polar code encoding on M second to-be-encoded blocks in each equivalent binary subgroup separately for the T equivalent binary subgroups in the second parallel channel, in order to obtain M second code blocks in each equivalent binary subgroup; and sending, by the first communication device, a first data stream and a second data stream to a second communications device, wherein the first data stream comprises a $2^T$-order high-order signal obtained by mapping information bits in T*M first code blocks in the first parallel channel, and wherein the second data stream comprises a $2^T$-order high-order signal obtained by mapping information bits in T*M second code blocks in the second parallel channel.

20. The method according to claim 19, wherein the to-be-encoded blocks comprise a first to-be-encoded block in the first parallel channel and/or a second to-be-encoded block in the second parallel channel, and wherein respectively placing, in each parallel channel, the Q information bit sub-blocks of the $x^{th}$ information bit block comprises:

placing, in the first parallel channel, a first information bit sub-block in the Q information bit sub-blocks of the $x^{th}$ information bit block, in the $x^{th}$ timeslot, at a first to an $N*R_{1,t}^{th}$ reliable positions of an $x^{th}$ first to-be-encoded block in T equivalent binary subgroups, wherein a value of $R_{0,t}$ is 0;

placing, in an $(x+1)^{th}$ timeslot, a second information bit sub-block in the Q information bit sub-blocks of the $x^{th}$ information bit block at an $N*R_{1,t}+1^{th}$ to a $N*R_{2,t}^{th}$ reliable positions of (x+1) first to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, at the $N*R_{(Q-1),t}+1^{th}$ to the $R*N_{Q,t}^{th}$ reliable positions of the $(x+Q-1)^{th}$ first to-be-encoded block in the T equivalent binary subgroups, and placing, in the second parallel channel, a first information bit sub-block in the Q information bit sub-blocks of the $x^{th}$ information bit block, in the $x^{th}$ timeslot, at a first to an $N*R_{1,t}^{th}$ reliable positions of an $x^{th}$ second to-be-encoded block in T equivalent binary subgroups; and placing, in an $(x+1)^{th}$ timeslot, a second information bit sub-block in the Q information bit sub-blocks of the $x^{th}$ information bit block at an $N*R_{1,t}+1^{th}$ to an $N*R_{2,t}^{th}$ reliable positions of (x+1) second to-be-encoded blocks in the T equivalent binary subgroups, until a $Q^{th}$ information bit sub-block in the Q information bit sub-blocks of the $x^{th}$ information bit block is placed, in the $(x+Q-1)^{th}$ timeslot, in the $N*R_{(Q-1),t}+1^{th}$ to the $N*R_{Q,t}^{th}$ reliable positions of the $(x+Q-1)^{th}$ second to-be-encoded block in the T equivalent binary subgroups.

* * * * *

UNITED STATES PATENT AND TRADEMARK OFFICE
CERTIFICATE OF CORRECTION

PATENT NO. : 12,009,836 B2  
APPLICATION NO. : 18/188033  
DATED : June 11, 2024  
INVENTOR(S) : Li et al.

Page 1 of 2

It is certified that error appears in the above-identified patent and that said Letters Patent is hereby corrected as shown below:

In the Claims

In Column 66, in Claim 2, Lines 44-47, delete "respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ first to-be-encoded block in the T equivalent binary subgroups, and" and insert the same on Line 43 after "block" as a continuation point.

In Column 69, in Claim 8, Line 51, delete "$M^{th}$" and insert -- a $M^{th}$ --.

In Column 70, in Claim 10, Line 40, before "first" delete "the".

In Column 71, in Claim 11, Lines 4-7, delete "respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ first to-be-encoded block in the T equivalent binary subgroups, and" and insert the same on Line 3 after "block" as a continuation point.

In Column 71, in Claim 11, Lines 22-25, delete "respectively occupies, in the $(x+Q-1)^{th}$ timeslot, the $N*R_{(Q-1),t}+1^{th}$ to the $N*R_{Q,t}^{th}$ reliable positions of the $(x+Q-1)^{th}$ second to-be-encoded block in the T equivalent binary subgroups." and insert the same on Line 21 after "block" as a continuation point.

In Column 71, in Claim 12, Line 30, before "$U=[u_1,u_2, \ldots ,u_K]$" insert -- wherein the first order and the second order meet the following mapping relationship: --.

In Column 74, in Claim 17, Line 13, delete "the" and insert -- a --.

In Column 74, in Claim 17, Line 13, delete "$M^{th}$" and insert -- a $M^{th}$ --.

In Column 74, in Claim 18, Line 29, after "$(M-j+1) \times R/Q$" insert -- , --.

Signed and Sealed this  
Sixth Day of August, 2024

Katherine Kelly Vidal  
*Director of the United States Patent and Trademark Office*

In Column 76, in Claim 20, Line 9, after "to" delete "a" and insert -- an --.

In Column 76, in Claim 20, Line 16, delete "subgroups, and" and insert -- subgroups; --.